(12) United States Patent
Naganuma et al.

(10) Patent No.: US 8,493,747 B2
(45) Date of Patent: Jul. 23, 2013

(54) FLEX-RIGID WIRING BOARD AND METHOD FOR MANUFACTURING THE SAME

(75) Inventors: Nobuyuki Naganuma, Ogaki (JP); Michimasa Takahashi, Ogaki (JP); Masakazu Aoyama, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 262 days.

(21) Appl. No.: 12/949,078

(22) Filed: Nov. 18, 2010

(65) Prior Publication Data

US 2011/0194262 A1 Aug. 11, 2011

Related U.S. Application Data

(60) Provisional application No. 61/301,670, filed on Feb. 5, 2010.

(51) Int. Cl.
*H05K 1/11* (2006.01)
(52) U.S. Cl.
USPC ........... 361/792; 361/749; 361/784; 174/254; 174/255; 174/261; 29/829; 29/831
(58) Field of Classification Search
USPC .................. 174/261, 255, 254; 361/749, 758, 361/784, 790, 792, 804, 809; 29/829, 831
See application file for complete search history.

(56) References Cited

U.S. PATENT DOCUMENTS

| | | | |
|---|---|---|---|
| 2004/0112632 A1 | 6/2004 | Michiwaki et al. | |
| 2005/0243528 A1* | 11/2005 | Murayama | 361/760 |
| 2006/0180344 A1* | 8/2006 | Ito et al. | 174/262 |
| 2007/0126123 A1* | 6/2007 | Sawachi | 257/777 |
| 2007/0202306 A1* | 8/2007 | Nikaldo et al. | 428/195.1 |
| 2008/0289859 A1* | 11/2008 | Mikado et al. | 174/254 |
| 2010/0025087 A1 | 2/2010 | Takahashi | |
| 2010/0051325 A1 | 3/2010 | Sato et al. | |

FOREIGN PATENT DOCUMENTS

| | | |
|---|---|---|
| CN | 1507312 A | 6/2004 |
| CN | 101518163 A | 8/2009 |
| JP | 06-152136 | 5/1994 |
| JP | 08-139454 | 5/1996 |
| JP | 2005-244024 | 9/2005 |
| JP | 2006-156502 | 6/2006 |
| JP | 4021472 B1 | 10/2007 |
| JP | 2008-085099 | 4/2008 |
| WO | 2010/013366 A1 | 2/2010 |

OTHER PUBLICATIONS

U.S. Appl. No. 12/873,944, filed Sep. 1, 2010, Naganuma, et al.
U.S. Appl. No. 12/894,777, filed Sep. 30, 2010, Naganuma, et al.
U.S. Appl. No. 12/948,882, filed Nov. 18, 2010, Naganuma, et al.

* cited by examiner

*Primary Examiner* — Hoa C Nguyen
(74) *Attorney, Agent, or Firm* — Oblon, Spivak, McClelland, Maier & Neustadt, L.L.P.

(57) ABSTRACT

A flex-rigid wiring board including an insulative substrate, a flexible wiring board positioned beside the insulative substrate, an insulation layer positioned over the insulative substrate and the flexible wiring board and exposing a portion of the flexible wiring board, and a wiring layer made of a conductor and formed on the insulation layer. The insulation layer has a tapered portion which becomes thinner toward an end surface of the insulation layer in the direction of the portion of the flexible wiring board exposed by the insulation layer. The wiring layer has a sloping portion formed on the tapered portion of the insulation layer.

39 Claims, 57 Drawing Sheets

FLEX-RIGID WIRING BOARD AND METHOD FOR MANUFACTURING THE SAME

CROSS-REFERENCE TO RELATED APPLICATIONS

The present application claims the benefits of priority to U.S. application Ser. No. 61/301,670, filed Feb. 5, 2010. The contents of that application are incorporated herein by reference in their entirety.

BACKGROUND OF THE INVENTION

1. Field of the Invention

The present invention relates to a bendable wiring board structured partly with a flexible substrate and to a method for manufacturing such a wiring board.

2. Discussion of the Background

In Japanese Laid-Open Patent Publication No. 2005-244024, a flex-rigid wiring board having a bent flexible wiring board is described. A conductive pattern on the flexible wiring board is bent and coats a rigid wiring section. In Japanese Laid-Open Patent Publication No. H8-139454, a flex-rigid wiring board is described where a flexible wiring board is positioned entirely throughout a flexible section and a rigid section. The conductive pattern on an insulation layer is bent. In Japanese Laid-Open Patent Publication No. H6-152136, a flex-rigid wiring board is described where a region with a circuit and a region without a circuit are positioned on both surfaces of a flexible wiring board. The region with a circuit and the region without a circuit are integrated by an insulative adhesive agent. In Japanese Laid-Open Patent Publication No. 2006-156502, a flex-rigid wiring board is described where a bent conductive pattern is arranged from a flexible section through a rigid section. In Japanese Laid-Open Patent Publication No. 2008-85099, a flex-rigid wiring board is described where a rigid wiring board is positioned so as to form steps on a surface of a flexible wiring board. In Japanese Patent Publication No. 4021472, a flex-rigid wiring board is described where wiring patterns on the upper and lower surfaces of a rigid section are connected to each other by means of a conductor formed in a through hole. The contents of Japanese Laid-Open Patent Publication Nos. 2005-244024, H8-139454, H6-152136, 2006-156502 and 2008-85099, and Japanese Patent Publication No. 4021472 are incorporated herein by reference in their entirety in the present application.

SUMMARY OF THE INVENTION

According to one aspect of the present invention, a flex-rigid wiring board includes an insulative substrate, a flexible wiring board positioned beside the insulative substrate, an insulation layer positioned over the insulative substrate and the flexible wiring board and exposing at least a portion of the flexible wiring board, and a wiring layer having a conductor and formed on the insulation layer. The insulation layer has a tapered portion which becomes thinner toward an end surface of the insulation layer in the direction of the portion of the flexible wiring board exposed by the insulation layer. The wiring layer has a sloping portion formed on the tapered portion of the insulation layer.

According to another aspect of the present invention, a method for manufacturing a flex-rigid wiring board includes forming a laminated body including an insulative substrate, a flexible wiring board and an insulation layer such that the insulative substrate and the flexible wiring board are positioned side by side, that the insulation layer is positioned over the insulative substrate and the flexible wiring board and that at least a portion of the flexible wiring board is exposed by the insulation layer, positioning a spacer on the flexible wiring board, positioning a metal foil on the insulation layer and on the spacer, and pressing the insulative substrate, the flexible wiring board, the insulation layer, the spacer and the metal foil such that a portion of the insulation layer is formed into a tapered portion which becomes thinner toward an end surface of the insulation layer in the direction of the portion of the flexible wiring board exposed by the insulation layer.

According to yet another aspect of the present invention, a method for manufacturing a flex-rigid wiring board includes providing an insulation layer having a tapered portion which becomes thinner toward an end surface of the insulation layer, forming a laminated body including an insulative substrate, a flexible wiring board and the insulation layer such that the insulative substrate and the flexible wiring board are positioned side by side, that the insulation layer is positioned over the insulative substrate and the flexible wiring board and that at least a portion of the flexible wiring board is exposed by the insulation layer, positioning a spacer on the flexible wiring board side by side with the tapered portion of the insulation layer, positioning a metal foil at least on the insulation layer and on the spacer, and pressing the insulative substrate, the flexible wiring board, the insulation layer, the spacer and the metal foil.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 47A is a view showing a first alternative example of a horizontal cross-sectional shape of a connection conductor or the like;

FIG. 47B is a view showing a second alternative example of a horizontal cross-sectional shape of a connection conductor or the like;

FIG. 47C is a view showing a third alternative example of a horizontal cross-sectional shape of a connection conductor or the like;

DETAILED DESCRIPTION OF THE EMBODIMENTS

Figure 1:
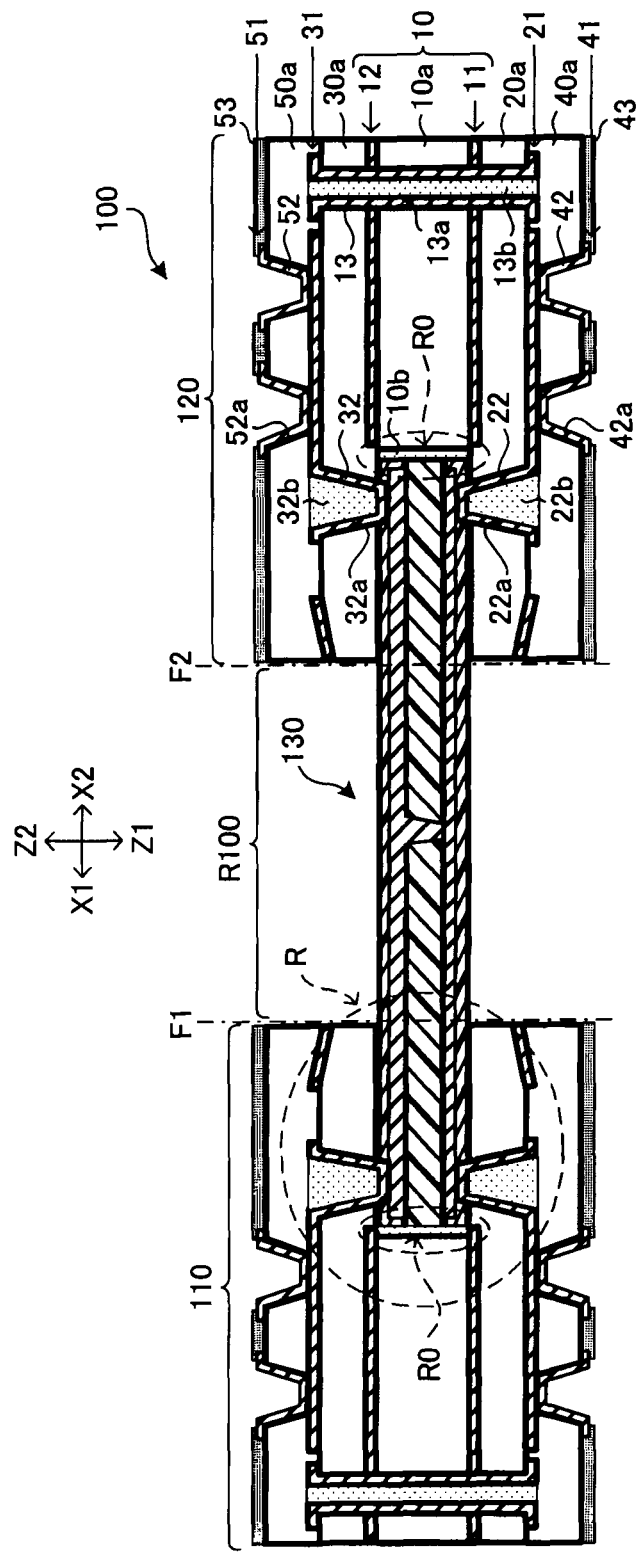
FIG. 1 is a cross-sectional view of a flex-rigid wiring board according to the first embodiment of the present invention.

The embodiments will now be described with reference to the accompanying drawings, wherein like reference numerals designate corresponding or identical elements throughout the various drawings.

In the drawings, arrows (Z1, Z2) each indicate a lamination direction in a wiring board, corresponding to a direction along a normal line (or a direction of the thickness of a core substrate) to the main surfaces (upper and lower surfaces) of the wiring board. On the other hand, arrows (X1, X2) and (Y1, Y2) each indicate a direction perpendicular to a lamination direction (directions parallel to the main surfaces of the wiring board). The main surfaces of a wiring board are on the X-Y plane. Also, side surfaces of a wiring board are on the X-Z plane or the Y-Z plane.

Regarding connection conductors and their holes, a cross section perpendicular to directions Z (X-Y plane) is referred to as a horizontal cross section. Also, a cross section parallel to directions Z (X-Z plane or Y-Z plane) is referred to as a vertical cross section.

In the present embodiments, two main surfaces facing opposite directions of a normal line are referred to as a first surface (the Z1-side surface) and a second surface (the Z2-side surface). Namely, a main surface opposite the first surface is the second surface, and a main surface opposite the second surface is the first surface. In lamination directions, the side closer to the core is referred to as a lower layer (or the inner-layer side), and the side farther away from the core is referred to as an upper layer (or the outer-layer side).

Aside from a layer including a conductive pattern that functions as wiring such as circuits (including ground), a layer with only a plane pattern is also referred to as a wiring layer. Among the conductors formed inside holes, the conductive film formed on wall surfaces (side and bottom surfaces) of a hole is referred to as a conformal conductor, and the conductor filled in a hole is referred to as a filled conductor. Wiring layers may also include lands of connection conductors or the like along with the above conductive patterns.

Plating indicates depositing conductors (such as metal) to form layers on the surfaces of metal, resin or the like, as well as such deposited conductive layers (such as metal layers). Other than wet plating such as electrolytic plating and electroless plating, plating also includes dry plating such as PVD (physical vapor deposition) and CVD (chemical vapor deposition).

Unless specifically indicated, the "width" of a hole or a cylinder (protruding portion) indicates the diameter if it is a circle, and $2\sqrt{(\text{cross sectional area}/\pi)}$ if it is other than a circle. If a hole or a cylinder (protruding portion) tapers, whether "widths" in two or more holes or protruding portions are the same or not the same may be determined by comparing the values, average values, maximum values or the like of corresponding portions. Regarding a line pattern formed on a surface, among the directions perpendicular to the line, the measurement in a direction parallel to the surface on which the line is formed is referred to as "width," and the measurement in a direction perpendicular to the surface on which the line is formed is referred to as "height" or "thickness." In addition, the measurement from one end of the line to the other end is referred to as "length." However, measurements are not limited to the above definitions if they are clearly indicated otherwise.

First Embodiment

Figure 2:
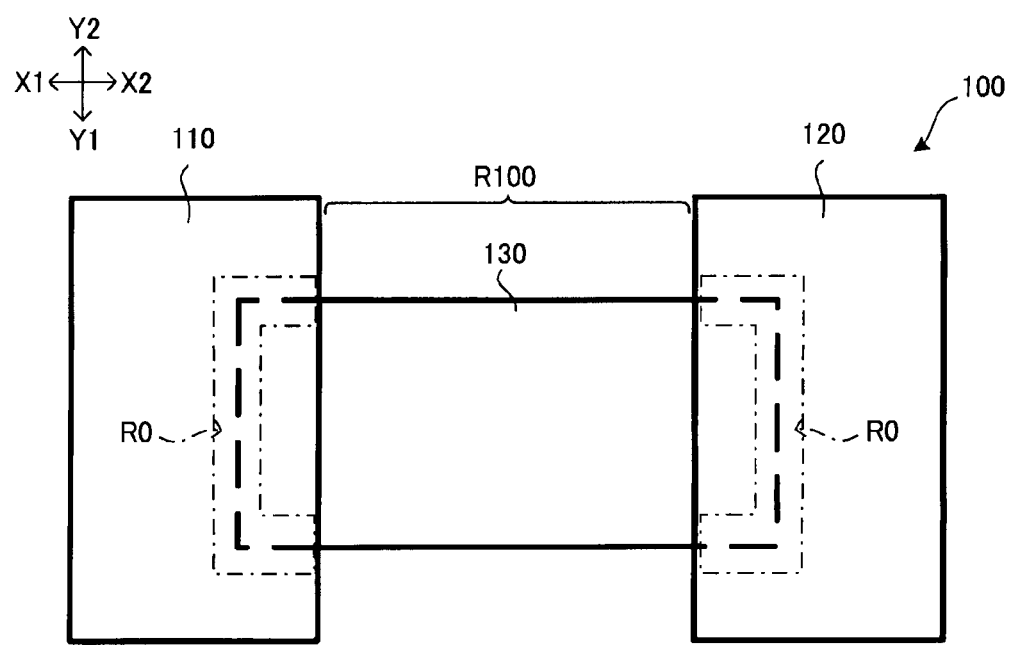
FIG. 2 is a plan view of the flex-rigid wiring board according to the first embodiment of the present invention.

Flex-rigid wiring board 100 of the present embodiment is a printed wiring board. As shown in FIG. 1 (cross-sectional view) and FIG. 2 (plan view), flex-rigid wiring board 100 has rigid sections (110, 120) and flexible wiring board 130. Rigid section 110 and rigid section 120 are connected to each other by means of flexible wiring board 130. Namely, rigid section 110 and rigid section 120 face each other by sandwiching flexible wiring board 130. Specifically, both ends of flexible wiring board 130 enter rigid sections (110, 120). Then, rigid sections (110, 120) and flexible wiring board 130 are connected to each other in the entered portions. In the drawing, F-R boundary surface (F1) is the surface corresponding to the boundary between rigid section 110 and flexible section (R100), and F-R boundary surface (F2) is the surface corresponding to the boundary between rigid section 120 and flexible section (R100). Also, flexible section (R100) is a flexible section sandwiched between rigid section 100 and rigid section 120, namely, part of flexible wiring board 130 exposed between F-R boundary surface (F1) and F-R boundary surface (F2).

Rigid sections (110, 120) have substrate 10, insulation layers (20a, 30a, 40a, 50a), wiring layers (21, 31, 41, 51), connection conductors (13, 22, 32, 42, 52), and solder-resist layers (43, 53). Substrate 10 is positioned beside flexible wiring board 130 (in direction X). Space may or may not exist between substrate 10 and flexible wiring board 130. Substrate 10 and insulation layers (20a, 30a or the like) on both of its sides correspond to the core section. Insulation layers and others positioned as upper layers to the core section correspond to built-up sections.

Substrate 10 (the core substrate of flex-rigid wiring board 100) has insulation layer (10a) and wiring layers (11, 12).

Insulation layer (10a) is an insulative substrate. The thickness of insulation layer (10a) is 100 µm, for example. The insulative substrate is an insulative material used when manufacturing a printed wiring board. Insulation layer (10a) may be formed by impregnating glass fabric, paper or the like with insulative phenol resin, epoxy resin, polyimide, BT resin or the like. Also, insulation layer (10a) may be formed by combining inorganic filler in phenol resin, epoxy resin, polyimide, BT resin or the like. In the present embodiment, insulation layer (10a) is made of epoxy resin. Epoxy resin is preferred to contain reinforcing material such as glass fiber (glass fabric or glass non-woven fabric, for example), aramid fiber (aramid non-woven fabric, for example) or the like impregnated with resin. The reinforcing material is such material having a smaller thermal expansion coefficient than that of a primary material (epoxy resin in the present embodiment).

Figure 3:
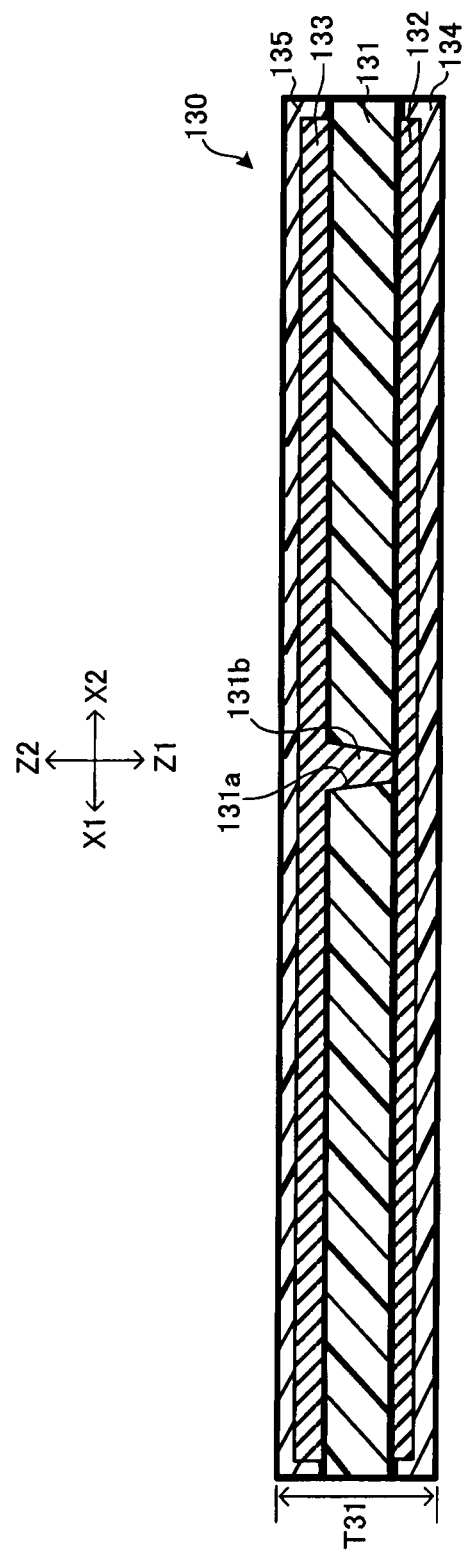
FIG. 3 is a cross-sectional view of a flexible wiring board according to the first embodiment.

As shown in FIG. 3, for example, flexible wiring board 130 has flexible substrate 131 (the core substrate of flexible wiring board 130), wiring layers (132, 133) and inner coverlays (134, 135). Thickness (T31) at an end portion of flexible wiring board 130 is 98.5 µm, for example. In the present embodiment, since the entire thickness of flexible wiring board 130 is set substantially uniform, the thickness of the central portion is set substantially the same as thickness (T31) of an end portion.

Flexible substrate 131 is made of insulative polyimide or liquid-crystal polymer, for example. The thickness of flexible substrate 131 is 20-50 µm, for example, preferably approximately 25 µm.

Wiring layer 132 is formed on the first surface of flexible substrate 131, and wiring layer 133 is formed on the second surface of flexible substrate 131. Wiring layers (132, 133) include striped wiring which connects the wiring in rigid section 110 and the wiring in rigid section 120 to each other, for example. Wiring layer 132 and wiring layer 133 are made of copper, for example. In the present embodiment, wiring layer 133 is set to be thicker than wiring layer 132. However, the present invention is not limited to such; for example, the thickness of wiring layer 132 and the thickness of wiring layer 133 may be set the same (see later-described FIG. 63A).

Inner coverlays (134, 135) are formed on flexible substrate 131. Inner coverlays (134, 135) coat wiring layers (132, 133) respectively and insulate them from the outside. Inner coverlays (134, 135) are made of polyimide, for example. The thickness of inner coverlays (134, 135) is approximately 5-30 µm, for example.

Flexible substrate 131 has connection conductor (131b). Specifically, hole (131a) is formed in flexible substrate 131. Connection conductor (131b) is formed by filling copper plating in hole (131a), for example. Wiring layer 132 and wiring layer 133 are electrically connected by means of connection conductor (131b).

As shown in FIG. 1, insulation layers (20a, 30a) are each positioned on boundary section (RO) between insulation layer (10a) and flexible wiring board 130, and expose flexible section (R100). Among such insulation layers, insulation layer (20a) is laminated on the first-surface side of an end portion in flexible wiring board 130 and of insulation layer (10a). Specifically, insulation layer (20a) in rigid section 110 is laminated on the first-surface side of the X1-side end portion of flexible wiring board 130, and insulation layer (20a) in rigid section 120 is laminated on the first-surface side of the X2-side end portion of flexible wiring board 130. On the other hand, insulation layer (30a) is laminated on the second-surface side of an end portion in flexible wiring board 130 and of insulation layer (10a). Specifically, insulation layer (30a) in rigid section 110 is laminated on the second-surface side of the X1-side end portion of flexible wiring board 130, and insulation layer (30a) in rigid section 120 is laminated on the second-surface side of the X2-side end portion of flexible wiring board 130.

Hole (22a) is formed in insulation layer (20a), and hole (32a) is formed in insulation layer (30a). On the wall surfaces of holes (22a, 32a), connection conductors (22, 32) made of copper plating, for example, are formed respectively, and insulative bodies (22b, 32b) are filled inside. Connection conductors (22, 32) are conformal conductors. However, connection conductors (22, 32) are not limited to such, and they may be filled conductors, for example (see later-described FIG. 41).

Through hole (13a) is formed in insulation layers (10a, 20a, 30a). On the wall surface of through hole (13a), connection conductor 13 made of copper plating, for example, is formed, and insulative body (13b) is filled inside. Connection conductor 13 is a conformal conductor. However, connection conductor 13 is not limited to such, and it may be a filled conductor, for example. Wiring layer 21 and wiring layer 31 are electrically connected to each other by means of connection conductor 13.

Figure 4:
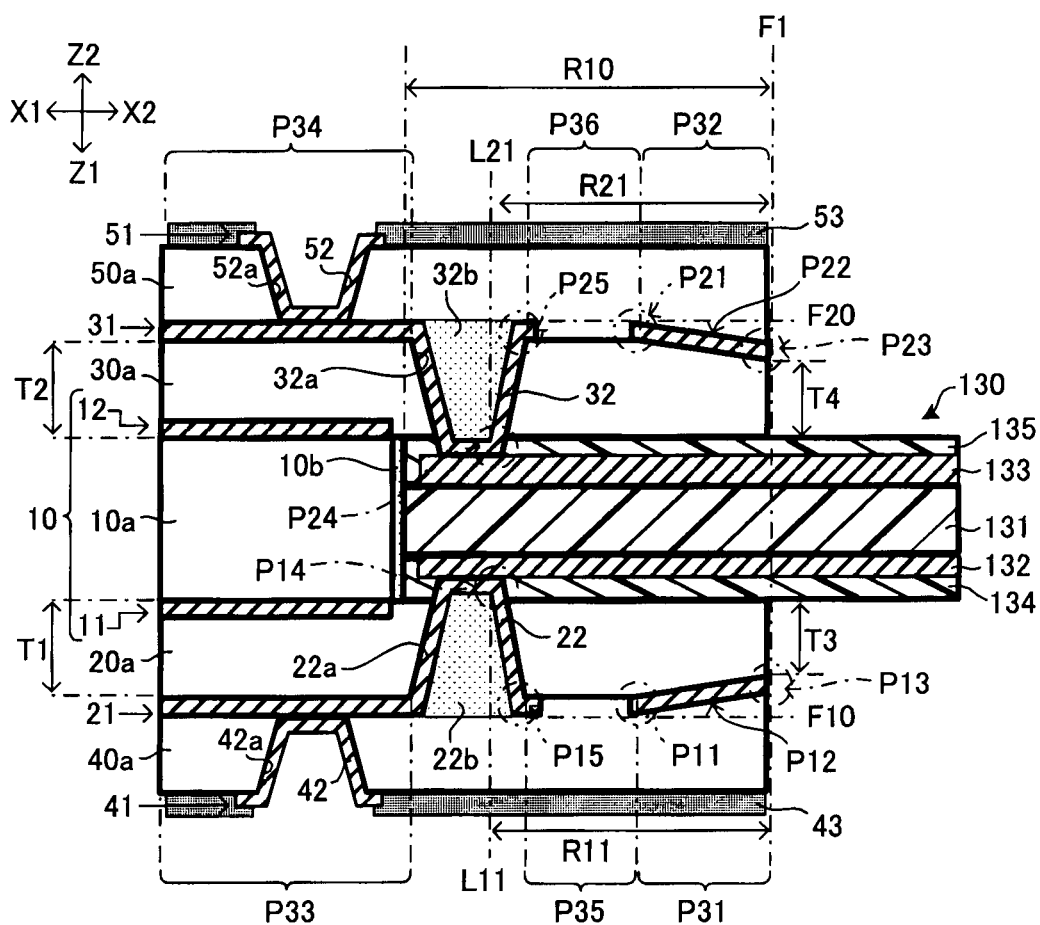
FIG. 4 is a magnified cross-sectional view showing part of a region in FIG. 1.

FIG. 4 shows a magnified view of region "R" in FIG. 1 (connection section between rigid section 110 and flexible wiring board 130). The structure of the connection section between rigid section 120 and flexible wiring board 130 is the same as the structure of the connection section between rigid section 110 and flexible wiring board 130. Hereinafter, the connection sections between flexible wiring board 130 and rigid sections (110, 120) are referred to as F-R connection sections.

As shown in FIG. 4, flexible wiring board 130 is positioned beside insulation layer (10a) (in direction X). The thickness of insulation layer (10a) and the thickness of flexible wiring board 130 are set to be substantially the same. In the space partitioned by flexible wiring board 130 and insulation layers (10a, 20a, 30a) (the clearance among such members), resin (10b) is filled. Resin (10b) is flowed from the surrounding insulation layers (such as insulation layers 20a, 30a) by pressing, for example, and is cured to be integrated with the surrounding insulation layers. Insulation layer (20a) and insulation layer (30a) sandwich the end portion of flexible wiring board 130 and are laminated and connected to inner coverlays (134, 135) in region (R10).

As described above, connection conductor 22 is formed in insulation layer (20a), and connection conductor 32 is formed in insulation layer (30a). Connection conductor 22 is connected to both wiring layer 132 and wiring layer 21, and connection conductor 32 is connected to both wiring layer 133 and wiring layer 31. Accordingly, wiring layer 21 is electrically connected to wiring layer 132 included in flexible wiring board 130 by means of connection conductor 22 in insulation layer (20a). Also, wiring layer 31 is electrically connected to wiring layer 133 included in flexible wiring board 130 by means of connection conductor 32 in insulation layer (30a).

In flex-rigid wiring board 100 of the present embodiment, rigid sections (110, 120) and flexible wiring board 130 are electrically connected without using connectors. Thus, even if the impact of being dropped or the like is received, it is thought that connection failure due to detached connectors does not occur.

By the end portions of flexible wiring board 130 entered (embedded) into rigid sections (110, 120) respectively, rigid section 110 and rigid section 120 are electrically connected at the entered portions (embedded portions). Accordingly, it is thought that their connections are strong.

Insulation layer (20a) has tapered portion (P31) and non-tapered portions (P33, P35). Insulation layer (20a) becomes thinner from taper start point (P11) toward an end surface (F-R boundary surface F1) in the direction of flexible wiring board 130. Then, a conductor (wiring layer 21) is formed on tapered portion (P31).

Wiring layer 21 has sloping portion (P12) and tip (P13). Taper start point (P11) of insulation layer (20a) is positioned between raised point (P14) (position L11) of connection conductor 22 and tip (P13) of wiring layer 21 (hereinafter referred to as range R11). The position of tip (P13) corresponds to F-R boundary surface (F1). However, the position of tip (P13) is not limited to such, and may be near F-R boundary surface (F1) (see later-described FIG. 39). Sloping portion (P12) is positioned on tapered portion (P31), and inclines toward the second-surface side in the direction of tip (P13). Surface (F10) in the drawings indicates a main surface of the non-sloping portion in wiring layer 21 (a surface parallel to the first surface of non-tapered portions P33, P35).

Insulation layer (30a) has tapered portion (P32) and non-tapered portions (P34, P36). Insulation layer (30a) becomes thinner from taper start point (P21) of tapered portion (P32) toward an end surface (F-R boundary surface F1) in the direction of flexible wiring board 130. Then, a conductor (wiring layer 31) is formed on tapered portion (P32).

Wiring layer 31 has sloping portion (P22) and tip (P23). Taper start point (P21) of insulation layer (30a) is located between raised point (P24) (position L21) of connection conductor 32 and tip (P23) of wiring layer 31 (hereinafter referred to as range R21). The position of tip (P23) corresponds to F-R boundary surface (F1). However, the position of tip (P23) is not limited to such, and may be near F-R boundary surface (F1) (see later-described FIG. 39). Sloping portion (P22) is positioned on tapered portion (P32), and inclines toward the first-surface side in the direction of tip (P23). Surface (F10) in the drawings indicates a main surface of the non-sloping portion in wiring layer 31 (a surface parallel to the second surface of non-tapered portions P34, P36).

In tapered portions (P31, P32), the thickness of insulation layers (20a, 30a) decreases as they come closer to flexible wiring board 130 (F-R boundary surface F1). In the present embodiment, the thickness of insulation layers (20a, 30a) decreases continuously; more specifically, they become thinner in a straight line. Namely, the first surface of tapered portion (P31) and the second surface of tapered portion (P32) are inclined surfaces. However, the present invention is not limited to such, and the thickness of insulation layer (20a) or (30a) in tapered portion (P31, P32) may also decrease on a curved line (see later-described FIG. 34A). Also, the thickness of insulation layer (20a) or (30a) may decrease intermittently instead of continuously (see later-described FIG. 34B).

In flex-rigid wiring board 100 of the present embodiment, not only tapered portions (P31, P32) but also non-tapered portions (P35, P36) are formed in ranges (R11, R21). In particular, from returned point (P15) of wiring layer 21 toward F-R boundary surface (F1), non-tapered portion (P35) and tapered portion (P31) are positioned in that order, and from returned point (P25) of wiring layer 31 toward F-R boundary surface (F1), non-tapered portion (P36) and tapered portion (P32) are positioned in that order. However, the present invention is not limited to such, and non-tapered portions (P35, P36) are not always required to be formed (see later-described FIGS. 31, 32).

In flex-rigid wiring board 100 of the present embodiment, conductors are not formed on non-tapered portions (P35, P36). Therefore, conductors on tapered portions (P31, P32) (sloping portions P12, P22) and connection conductors (22, 32) are detached. However, the present invention is not limited to such, and conductors may be formed on non-tapered portions (P35, P36) (see later-described FIGS. 29, 30).

Thicknesses (T1, T2) of non-tapered portions (P33-P36) are 85 μm, for example.

Thicknesses (T3, T4) at the tips (F-R boundary surface F1 or F2) where the thickness is the thinnest in tapered portions (P31, P32) are 50 μm, for example.

In flex-rigid wiring board 100 of the present embodiment, insulation layer (20a) has tapered portion (P31) which becomes thinner toward an end surface (F-R boundary surface F1 or F2) in the direction of flexible wiring board 130 (in the direction of flexible section (R100)). Then, a conductor (wiring layer 21) is formed on tapered portion (P31). Thus, since the conductor on tapered portion (P31) works as a frame, it is thought that the shape of insulation layer (20a) may be maintained. In addition, it is thought that the F-R connection section is formed to have substantially the same structure as a mortise joint. Moreover, in tapered portion (P31), since insulation layer (20a) becomes thinner toward an end surface in the direction of flexible wiring board 130, it is thought that especially high connection reliability is achieved against the stresses in a direction to pull out flexible wiring board 130 which are generated when flexible wiring board 130 is bent or the like.

Also, on the second-surface side, insulation layer (30a) has tapered portion (P32). Tapered portion (P32) becomes thinner toward an end surface (F-R boundary surface F1 or F2) in the direction of flexible wiring board 130 (in the direction of flexible section (R100)). Then, a conductor (wiring layer 31) is formed on tapered portion (P32). Accordingly, the F-R connection section has also the above-described connection structure on the second-surface side, and it is thought that connection reliability at the F-R connection section is further enhanced.

Figure 5A:
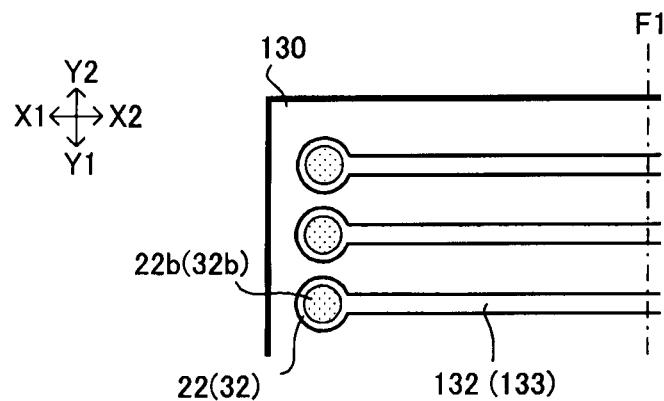
FIG. 5A is a view showing an example where wiring layers near an F-R connection section are formed straight.
Figure 5B:
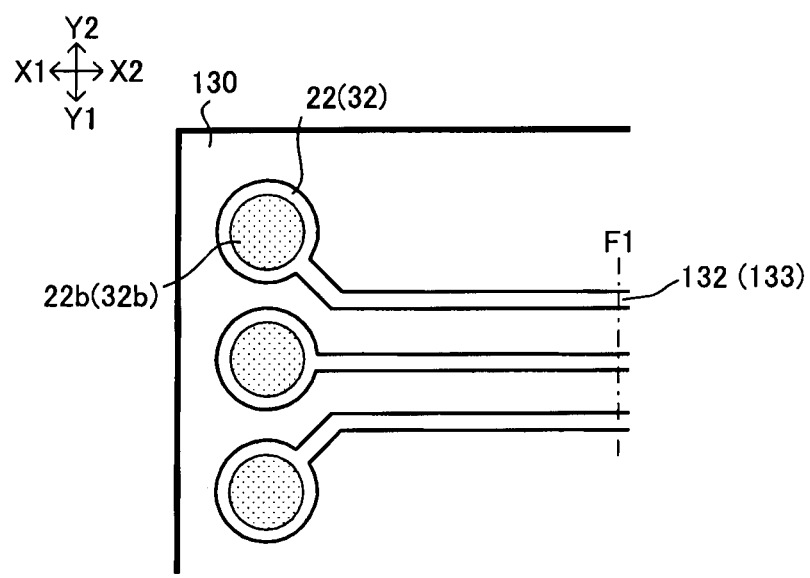
FIG. 5B is a view showing an example where wiring layers are formed to fan out near an F-R connection section.

As shown in FIGS. 4, 5A and 5B, connection conductor 22 (or hole 22a) is formed to be a tapered cylinder, widening from the second-surface side toward the first-surface side. Connection conductor 32 (or hole 32a) is formed to be a tapered cylinder, widening from the first-surface side toward the second-surface side. However, their shapes are not limited to such, and connection conductor 22 or the like may be formed freely (see later-described FIGS. 47A-48B).

In flex-rigid wiring board 100 of the present embodiment, the position of connection conductor 22 and the position of connection conductor 32 overlap when seen on the X-Y plane. Therefore, connection conductor 22 and connection conductor 32 face each other. Accordingly, it is thought that both end portions of flexible wiring board 130 are sandwiched and held even more firmly. Even if the position of connection conductor 22 and the position of connection conductor 32 do not completely overlap, it is thought that substantially the same effect is achieved if either connection conductor 22 or 32 faces at least part of the other.

In addition, wiring layer 21 and connection conductor 22 are made of contiguous conductor. Accordingly, it is thought that both end portions of flexible wiring board 130 are sandwiched and held more firmly, compared with situations where wiring layer 21 and connection conductor 22 are formed intermittently (see FIG. 42). The same apply to wiring layer 31 and connection conductor 32.

Furthermore, connection conductors (22, 32) are made of plating. Accordingly, both end portions of flexible wiring board 130 are sandwiched and held more firmly, compared with situations where connection conductors (22, 32) are made of conductive paste (see FIG. 42).

Connection conductors (22, 32) are conductors in holes (22a, 32a), which penetrate only through their respective insulation layers (20a, 30a), so-called via holes.

Such a structure is advantageous to enhance connection reliability between flexible wiring board 130 and rigid section 110 or 120. However, the present invention is not limited to such a structure, and the conductor in flexible wiring board 130 and conductive patterns on insulation layers (20a, 30a) may be electrically connected by means of conductors in holes that penetrate through multiple layers (see later-described FIGS. 43A, 43B).

Conductive patterns on both surfaces of flexible wiring board 130 are electrically connected to conductive patterns (wiring layers 21, 31) in rigid sections (110, 120) by means of connection conductors (22, 32). However, the present invention is not limited to such, and only the conductive pattern on one surface of flexible wiring board 130 may be electrically connected to a conductive pattern (wiring layer 21 or 31) in rigid sections (110, 120) by means of connection conductor 22 or 32 (see later-described FIG. 46).

Basically, conductive patterns (wiring layers 132, 133) of flexible wiring board 130 may be formed freely. Therefore, wiring layers (132, 133) near an F-R connection section may be formed straight as shown in FIG. 5A, for example. However, to enhance connection reliability near the F-R connection section, as shown in FIG. 5B, for example, it is preferred that wiring layers (132, 133) be formed to fan out near the F-R connection section, namely, that terminal pitches be widened like a fan. By setting so, the distance between adjacent wiring lines is secured and interference between wiring lines is suppressed. Accordingly, the width of filled conductors (22, 32) may be enlarged. If the width of filled conductors (22, 32) is enlarged, the connection area between flexible wiring board 130 and rigid section 110 or 120 increases. As a result, connection reliability is enhanced at the F-R connection section.

As shown in FIG. 1, insulation layer (40a) is laminated on the first-surface side of insulation layer (20a), and insulation layer (50a) is laminated on the second-surface side of insulation layer (30a). Wiring layer 41 is formed on the first surface of insulation layer (40a), and wiring layer 51 is formed on the second surface of insulation layer (50a). Moreover, solder-resist layer 43 is formed on the first surface of insulation layer (40a), and solder-resist layer 53 is formed on the second surface of insulation layer (50a).

Insulation layers (40a, 50a) correspond to interlayer insulation layers. Hole (42a) is formed in insulation layer (40a), and hole (52a) is formed in insulation layer (50a). On wall surfaces of holes (42a, 52a), connection conductors (42, 52) made of copper plating, for example, are formed respectively. Connection conductors (42, 52) are conformal conductors. However, connection conductors (42, 52) are not limited to such, and they may be filled conductors, for example.

Wiring layers (11, 12, 21, 31, 41, 51) are made of copper foil and copper plating, for example. However, they are not limited to such, and may be conductors using material other than copper.

In the present embodiment, insulation layers (20a, 30a, 40a, 50a) are made of substantially the same material as that of insulation layer (10a). By using such a material, it is thought that the effect of the conductor on tapered portion (P31) working as a frame is enhanced, and that the above structure of the F-R connection section as a mortise joint becomes even stronger. Also, even if those materials are not substantially the same, substantially the same effect is achieved if insulation layer (10a) contains at least one material that forms either insulation layer (20a) or (30a). However, insulation layers (20a, 30a, 40a, 50a) are not limited to such, and they may be formed by using a different material from that of insulation layer (10a). As the material for insulation layers (20a, 30a, 40a, 50a), the following may be used: those made by impregnating base material made of inorganic material such as glass fiber or aramid fiber with resins such as epoxy resin, polyester resin, bismaleimide triazine resin (BT resin), imide resin (polyimide), phenol resin and allyl polyphenylene ether resin (A-PPE resin).

Connection conductors (13, 42, 52) are made of copper plating, for example. Holes (42a, 52a) in which connection conductors (42, 52) are formed are formed to be tapered cylinders, for example. Through hole (13a) in which connection conductor 13 is formed is formed to be a cylinder, for example.

The above flex-rigid wiring board 100 is manufactured in the procedure shown in

Figure 6:
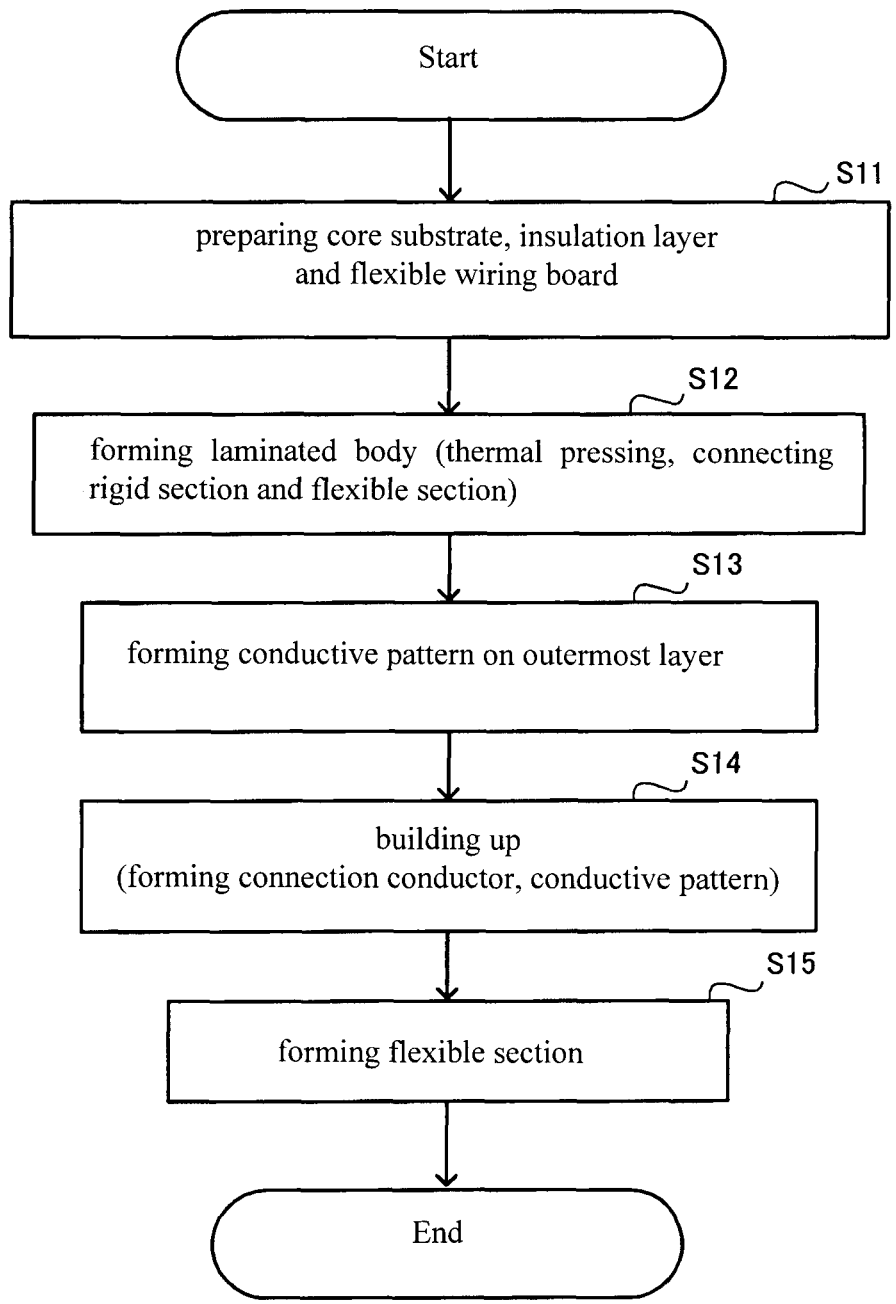
FIG. 6 is a flowchart showing a method for manufacturing a flex-rigid wiring board according to the first embodiment of the present invention.

FIG. 6, for example.

In step (S11), substrate 10 (core substrate), insulation layers (20a, 30a) and flexible wiring board 130 are prepared.

A method for manufacturing substrate 10 is shown in FIGS. 7A-7D.

Figure 7A:
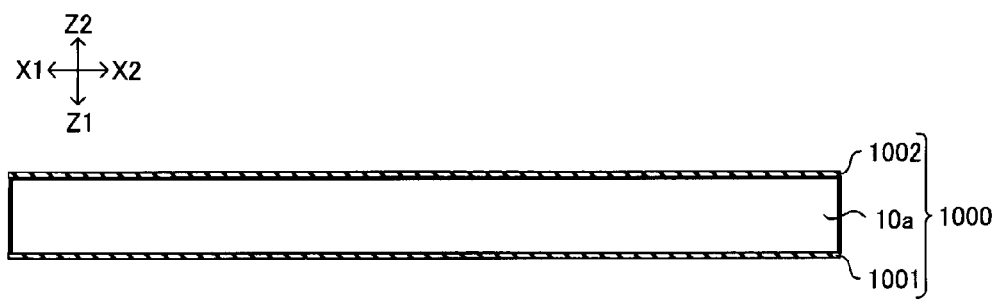
FIG. 7A is a view to illustrate a first step of a method for manufacturing a core substrate.

First, as shown in FIG. 7A, double-sided copper-clad laminate 1000 (starting material) is prepared. Double-sided copper-clad laminate 1000 has insulation layer (10a) and copper foils (1001, 1002). Copper foil 1001 is formed on the first surface of insulation layer (10a) and copper foil 1002 is formed on the second surface of insulation layer (10a). The material for insulation layer (10a) is epoxy resin containing reinforcing material, for example, as described earlier.

Figure 7B:
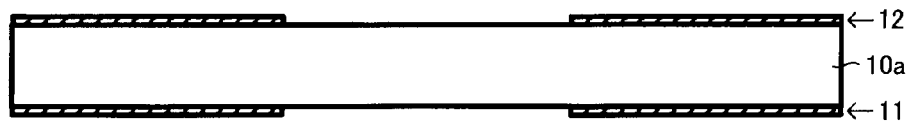
FIG. 7B is a view to illustrate a second step subsequent to the step in FIG. 7A.

Next, as shown in FIG. 7B, wiring layers (11, 12) are formed. Specifically, conductive layers on both surfaces of insulation layer (10a) are patterned by a lithographic technique after copper panel plating (full plane plating) is performed. By doing so, wiring layer 11 is formed on the first surface of insulation layer (10a), and wiring layer 12 is formed on the second surface of insulation layer (10a).

Figure 7C:
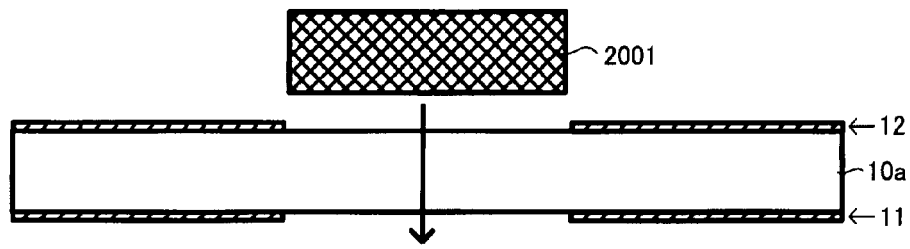
FIG. 7C is a view to illustrate a third step subsequent to the step in FIG. 7B.
Figure 7D:
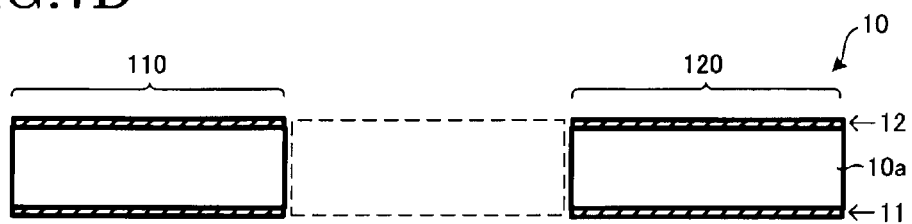
FIG. 7D is a view to illustrate a fourth step subsequent to the step in FIG. 7C.

Next, as shown in FIG. 7C, blanking is performed on insulation layer (10a) using die 2001. Accordingly, as shown in FIG. 7D, insulation layer (10a) is separated into rigid section 110 and rigid section 120. As a result, substrate 10 is completed.

Figure 8:
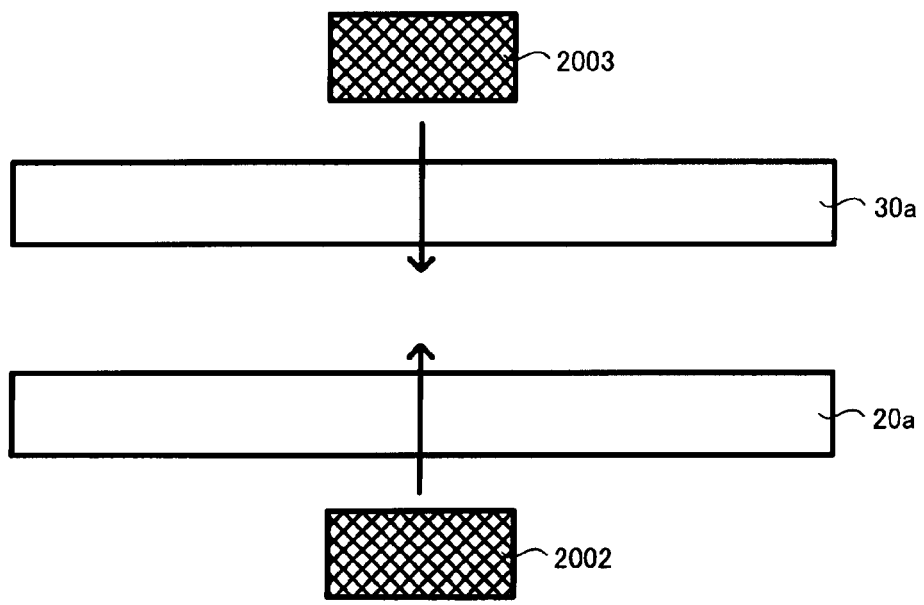
FIG. 8 is a view to illustrate a first step of a method for processing insulation layers.
Figure 9:
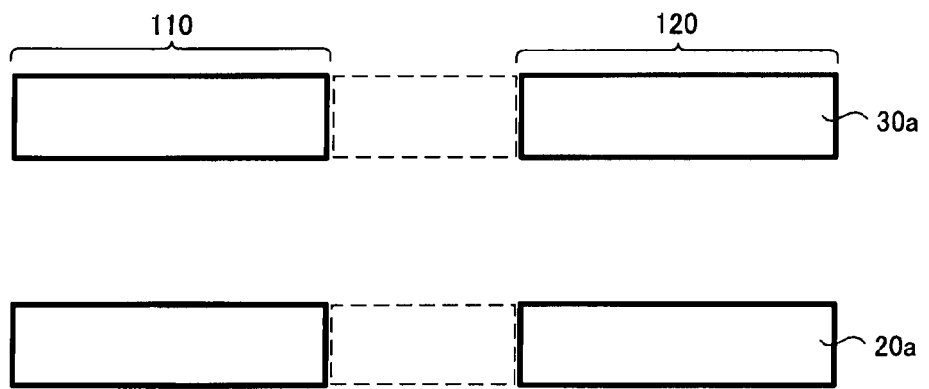
FIG. 9 is a view to illustrate a second step subsequent to the step in FIG. 8.

A method for processing insulation layers (20a, 30a) is shown in FIGS. 8 and 9.

First, as shown in FIG. 8, insulation layers (20a, 30a) prior to processing are prepared. As described previously, the material for insulation layers (20a, 30a) is the following: those made by impregnating base material made of inorganic material such as glass fiber or aramid fiber with resins such as epoxy resin, polyester resin, bismaleimide triazine resin (BT resin), imide resin (polyimide), phenol resin, or allyl polyphenylene ether resin (A-PPE resin). At this stage, insulation layers (20a, 30a) are prepreg (semi-cured adhesive sheet). Especially, such prepreg is preferred to be low-flow prepreg. However, instead of prepreg, RCF (resin-coated copper foil) or the like may also be used.

Next, blanking is performed on insulation layer (20a) using die 2002, and blanking is performed on insulation layer (30a) using die 2003. Accordingly, as shown in FIG. 9, insulation layers (20a, 30a) are each separated into rigid section 110 and rigid section 120.

A method for manufacturing flexible wiring board 130 is shown in FIGS. 10A-12. In the present embodiment, multiple flexible wiring boards 130 are simultaneously manufactured in a single manufacturing panel, and one of them is separated in a step in FIG. 12. However, the present invention is not limited to such, and one flexible wiring board 130 may be formed using a single manufacturing panel.

Figure 10A:
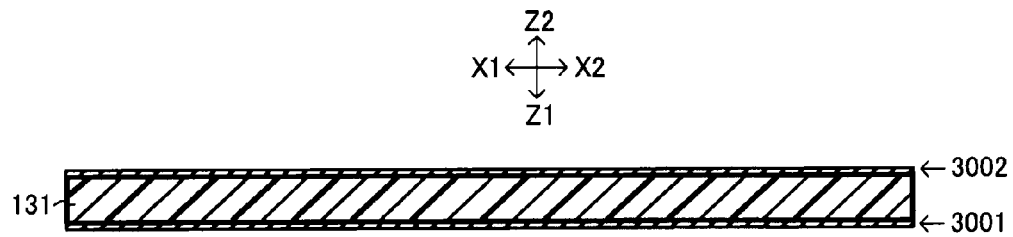
FIG. 10A is a view to illustrate a first step of a method for manufacturing a flexible wiring board.

First, as shown in FIG. 10A, a double-sided copper-clad laminate (starting material) is prepared. Such a double-sided copper-clad laminate has flexible substrate 131 and copper foils (3001, 3002). Copper foil 3001 is formed on the first surface of flexible substrate 131, and copper foil 3002 is formed on the second surface of flexible substrate 131. As described previously, the material for flexible substrate 131 is, for example, insulative polyimide or liquid-crystal polymer. The thickness of copper foils (3001, 3002) is 18 μm, for example.

Figure 10B:
FIG. 10B is a view to illustrate a second step subsequent to the step in FIG. 10A.

Next, as shown in FIG. 10B, wiring layers (132, 133) and connection conductor (131b) are formed.

Specifically, first, hole (131a) is formed in flexible substrate 131 using a laser, for example. Hole (131a) penetrates through flexible substrate 131 and reaches copper foil 3001. After that, desmearing and soft etching are conducted if required.

Next, copper panel plating (plating in hole (131a) and on the entire surface) is performed on the second surface. In doing so, copper plating (such as electroless plating and electrolytic plating), for example, is filled in hole (131a). As a result, connection conductor (131b) is formed. In the present embodiment, plating is formed only on one surface (second surface). However, the present invention is not limited to such and plating may also be formed on both surfaces (first and second surfaces). By plating on both surfaces, the thickness of wiring layer 132 and the thickness of wiring layer 133 may be set to be the same.

Next, conductive layers on both surfaces of flexible substrate 131 are patterned using a lithographic technique. Accordingly, wiring layer 132 is formed on the first surface of flexible substrate 131, and wiring layer 133 is formed on the second surface of flexible substrate 131. Furthermore, if required, a horizontal roughening process is carried out.

Figure 10C:
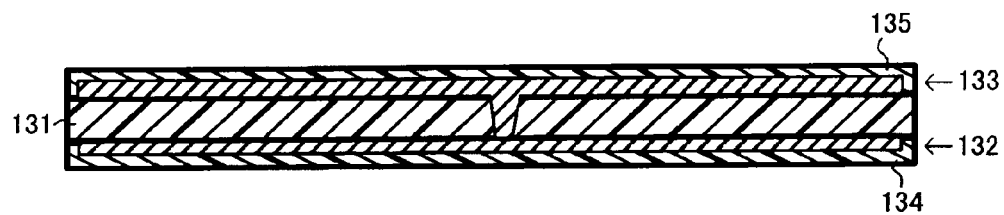
FIG. 10C is a view to illustrate a third step subsequent to the step in FIG. 10B.

Next, as shown in FIG. 10C, by pressing, for example, inner coverlay 134 is attached on the first-surface side of flexible substrate 131 and inner coverlay 135 is attached on the second-surface side of flexible substrate 131. Accordingly, wiring layers (132, 133) are coated with inner coverlays (134, 135) respectively. As a result, multiple flexible wiring boards 130 are manufactured. After that, jig holes and electrolytic gold plating are formed if required.

Figure 11:
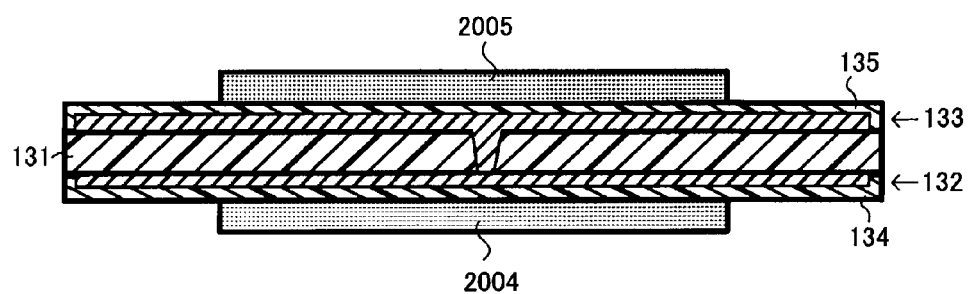
FIG. 11 is a view to illustrate a fourth step subsequent to the step in FIG. 10C.

Next, as shown in FIG. 11, by printing, for example, strip mask 2004 (spacer) is formed on the first-surface side of inner coverlay 134, and strip mask 2005 (spacer) is formed on the second-surface side of inner coverlay 135.

Figure 12:
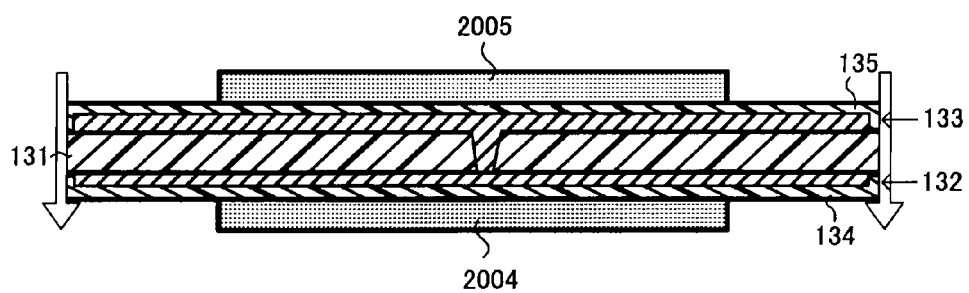
FIG. 12 is a view to illustrate a fifth step subsequent to the step in FIG. 11.

Next, as shown in FIG. 12, one flexible wiring board 130 is pulled out by using a die, for example. Accordingly, flexible wiring board 130 as previously shown in FIG. 3 is obtained. A method for detaching flexible wiring board 130 is not limited to using a die, and any other method may be employed. For example, a laser and a drill may be used for such detaching.

Next, in step (S12) of FIG. 6, a laminated body is formed with substrate 10 (core substrate), insulation layers (20a, 30a) and flexible wiring board 130.

Figure 13:
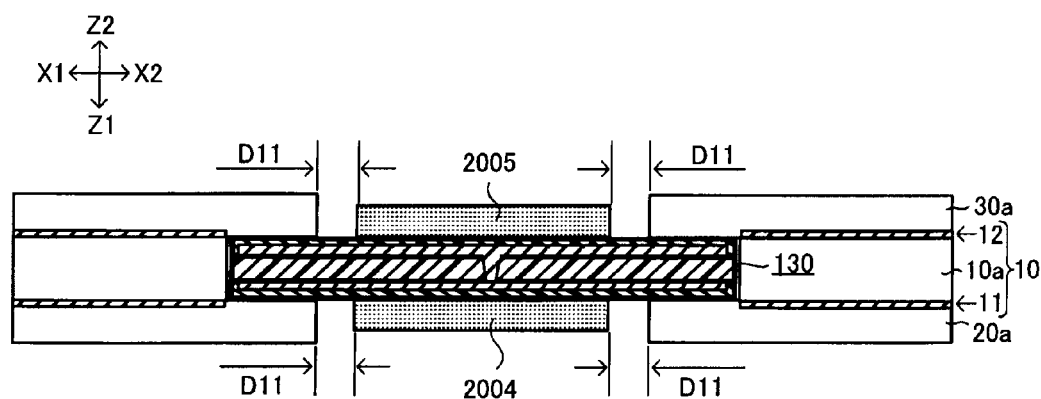
FIG. 13 is a view to illustrate a first step for forming a laminated body.

Specifically, first, substrate 10 (FIG. 7D), insulation layers (20a, 30a) (FIG. 9) and flexible wiring board 130 (FIG. 12) are aligned and positioned as shown in FIG. 13, for example. Then, insulation layers (20a, 30a) are provisionally melted and adhered to substrate 10.

Substrate 10 is positioned beside (in direction X) flexible wiring board 130. Insulation layer (20a) is positioned beside (in direction X) strip mask 2004, and insulation layer (30a) is positioned beside (in direction X) strip mask 2005. Because there are strip masks (2004, 2005) (spacers), the difference in the levels of the first and second surfaces is reduced. Both end portions of flexible wiring board 130 are sandwiched by insulation layers (20a, 30a). It is preferred that clearance (D11) be set at 100 μm or greater, for example, especially at 400 μm, between insulation layer (20a) and strip mask 2004 and between insulation layer (30a) and strip mask 2005. By doing so, prepreg flows into such clearances (D11) during pressing. As a result, tapered sections (P31, P32) may be formed easily.

Figure 14:
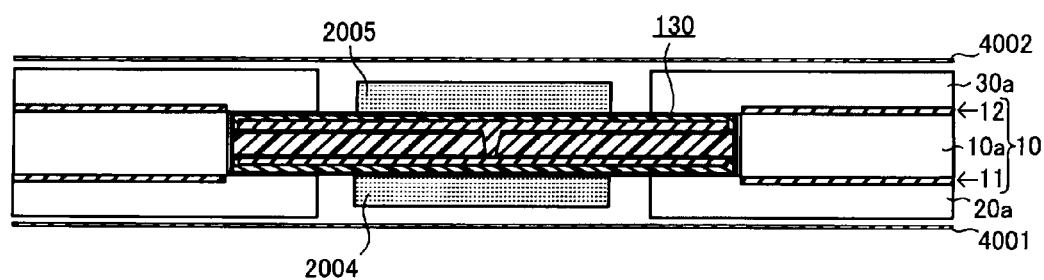
FIG. 14 is a view to illustrate a second step subsequent to the step in FIG. 13.
Figure 15A:
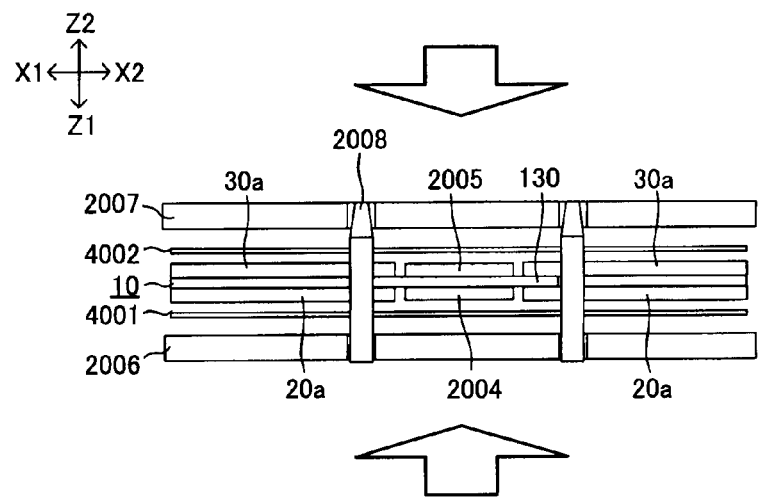
FIG. 15A is a view to illustrate a third step subsequent to the step in FIG. 14.

Next, as shown in FIG. 14, for example, copper foils (4001, 4002) (metal foils) are arranged outside (on the first-surface side and second-surface side) of the above members. Then, as shown in FIG. 15A, such members are sandwiched by pressing jigs (2006, 2007) and thermal pressed all at once. Namely, pressing and heating are conducted simultaneously. During that time, jigs (2006, 2007) are aligned by using pins 2008. Accordingly, pressure is exerted substantially perpendicular to the main surfaces.

Figure 15B:
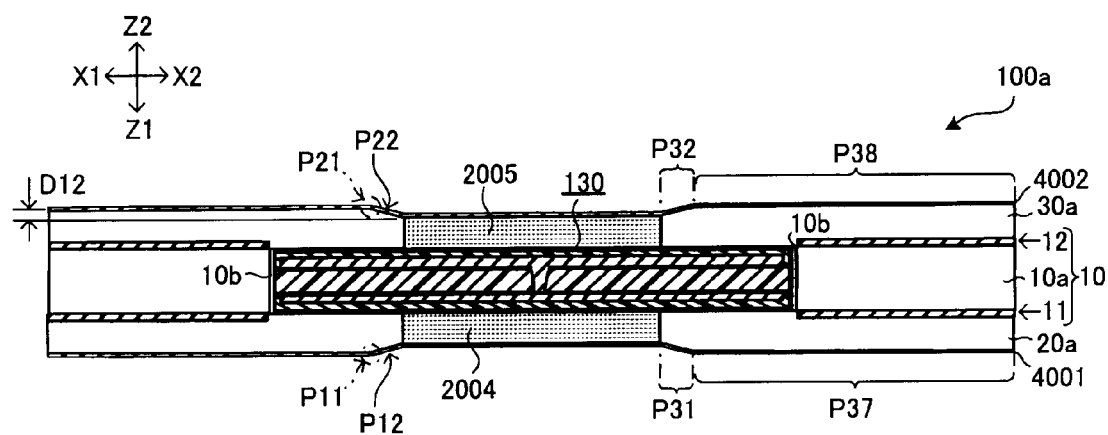
FIG. 15B is a view showing the results of the step in FIG. 15A.

As shown in FIG. 15B, copper foils (4001, 4002) are bent by the above pressing.

Specifically, by the prepreg flowed into clearances (D11) (FIG. 13), insulation layer (20a) beside strip mask 2004 as well as insulation layer (30a) beside strip mask 2005, namely, a portion near the boundary between insulation layer (20a) and strip mask 2004 as well as a portion near the boundary between insulation layer (30a) and strip mask 2005, become lower. Accordingly, level difference (D12) of 10 μm, for example, is formed, and inclined surfaces are formed on insulation layers (20a, 30a) and copper foils (4001, 4002) on such insulation layers. As a result, tapered portion (P31) is formed on the first-surface side and tapered portion (P32) is formed on the second-surface side.

Also, resin is flowed from the surrounding insulation layers (insulation layers 20a, 30a, or the like), and is integrated with the surrounding insulation layers.

Furthermore, prepreg (insulation layers 20a, 30a) are cured by the above heating, and insulation layer (10a) and insulation layers (20a, 30a) become adhered. Insulation layers (20a, 30a) and flexible wiring board 130 are also bonded.

The above pressing and heating may be divided into multiple procedures. Also, heating and pressing may be conducted separately. However, it is more efficient if they are conducted simultaneously. After the thermal pressing, another heating process may be conducted separately for integration.

Figure 16:
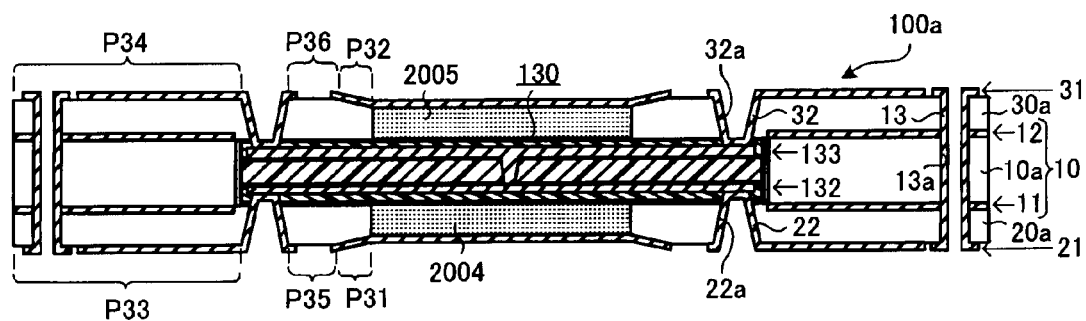
FIG. 16 is a view to illustrate a fourth step subsequent to the step in FIG. 15A.

Next, as shown in FIG. 16, wiring layers (21, 31) and connection conductors (13, 22, 32) are formed.

Specifically, hole (22a) is formed in non-tapered portion (P37) of insulation layer (20a), and hole (32a) is formed in non-tapered portion (P38) of insulation layer (30a), by using a laser, for example. Also, through hole (13a) is formed in insulation layers (10a, 20a, 30a). Hole (22a) reaches wiring layer 132 of flexible wiring board 130, and hole (32a) reaches wiring layer 133 of flexible wiring board 130. Through hole (13a) penetrates entirely through insulation layers (10a, 20a, 30a). After that, desmearing and soft etching are conducted if required.

Next, for example, by copper panel plating (plating in holes (22a, 32a) and through hole (13a) and on the entire surface), copper plating, for example, is formed on the wall surfaces of holes (22a, 32a), and copper plating, for example, is formed on the wall surface of through hole (13a). Such plating is made of electroless plating and electrolytic plating, for example. However, the plating is not limited to such, and may only be performed by either electroless plating or electrolytic plating. In addition, the plating may also be formed by dry plating such as PVD (physical vapor deposition) and CVD (chemical vapor deposition).

Accordingly, connection conductors (13, 22, 32) are formed. Connection conductor 22 is bonded with wiring layer 132, and connection conductor 32 is bonded with wiring layer 133. Connection conductor 13 electrically connects conductive layers on both surfaces (wiring layers (21, 31) prior to patterning) with each other.

Through the above procedure, laminated body (100a) is formed with substrate 10, insulation layers (20a, 30a) and flexible wiring board 130. Insulation layer (10a) is sandwiched between insulation layer (20a) and insulation layer (30a).

Next, in step (S13) of FIG. 6, the conductive layers (outermost layers) on both surfaces are patterned by a lithographic technique, for example. Accordingly, wiring layer 21 is formed on insulation layer (20a) and wiring layer 31 is formed on insulation layer (30a). Wiring layer 21 and connection conductor 22 as well as wiring layer 31 and connection conductor 32 are formed to be contiguous by the above panel plating.

Next, in step (S14) of FIG. 6, build-up is conducted on laminated body (100a).

Figure 17:
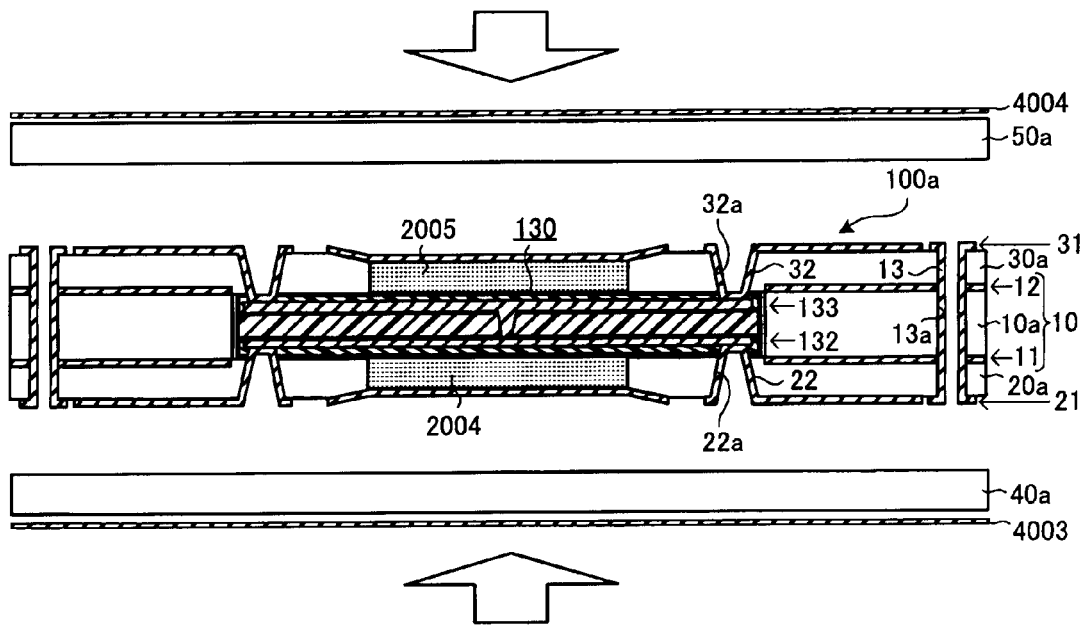
FIG. 17 is a view to illustrate a first step for building up on the laminated body (core section)

Specifically, first, as shown in FIG. 17, copper foil 4003, insulation layer (40a), laminated body (100a), insulation layer (50a) and copper foil 4004 are positioned so as to be laminated in that order. By doing so, laminated body (100a) is sandwiched by insulation layer (40a) and insulation layer (50a). At this stage, insulation layers (40a, 50a) are prepreg (semi-cured adhesive sheet). However, RCF (resin-coated copper foil) may be used instead of prepreg.

Figure 18:
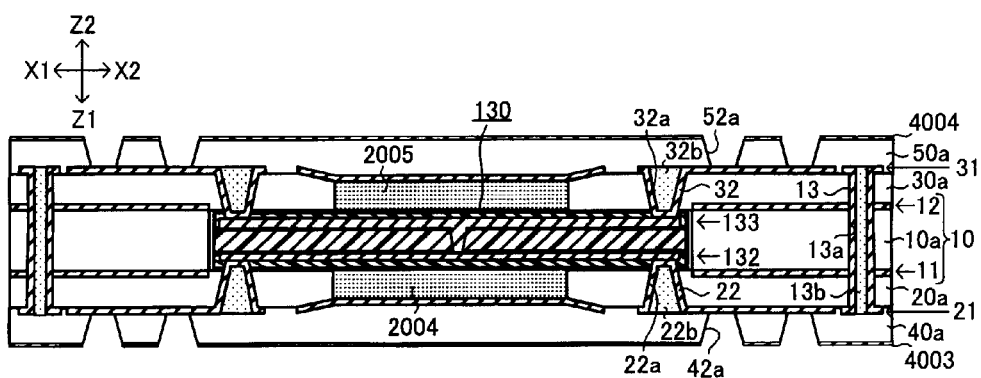
FIG. 18 is a view to illustrate a second step subsequent to the step in FIG. 17.

Next, thermal pressing is conducted. Accordingly, prepreg (insulation layers 40a, 50a) are cured, and copper foil 4003, insulation layer (40a), laminated body (100a), insulation layer (50a) and copper foil 4004 become integrated. Also, resin flowed from insulation layers (40a, 50a) is filled in through hole (13a) and holes (22a, 32a) as shown in FIG. 18, becoming insulative bodies (13b, 22b, 32b). Insulative bodies (13b, 22b, 32b) may be filled in advance, prior to pressing.

Next, as shown in FIG. 18, hole (42a) is formed in insulation layer (40a), and hole (52a) is formed in insulation layer (50a) by a laser, for example. After that, desmearing and soft etching are conducted if required.

Figure 19:
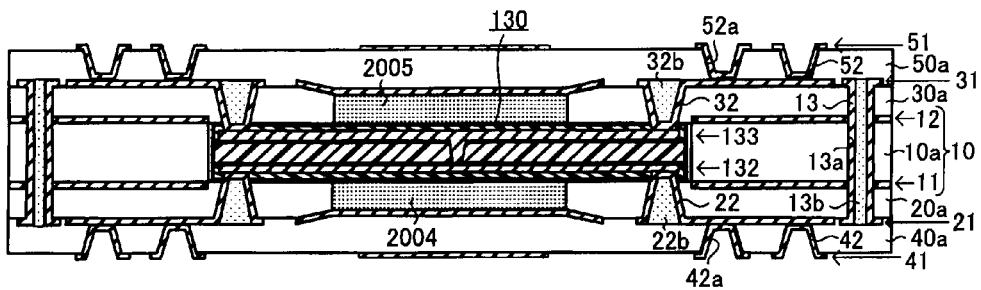
FIG. 19 is a view to illustrate a third step subsequent to the step in FIG. 18.

Next, as shown in FIG. 19, copper plating, for example is formed in hole (42a) and copper plating, for example, is formed in hole (52a) by copper panel plating (such as electroless plating or electrolytic plating, or both), for example. Accordingly, connection conductors (42, 52) are formed.

Furthermore, conductive layers on both surfaces are patterned by a lithographic technique, for example. By doing so, wiring layer 41 is formed on insulation layer (40a) and wiring layer 51 is formed on insulation layer (50a). The conductive patterns of wiring layers (41, 51) remain respectively on strip masks (2004, 2005).

Figure 20:
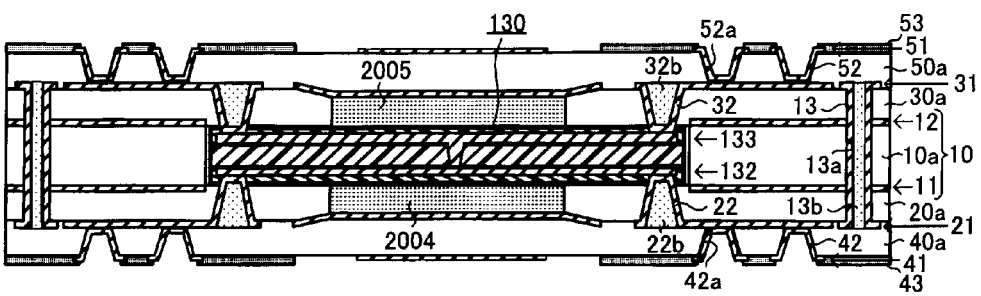
FIG. 20 is a view to illustrate a fourth step subsequent to the step in FIG. 19.

Next, as shown in FIG. 20, solder-resist layers (43, 53) are formed on both surfaces by screen printing or lamination, for example. Then, solder-resist layers (43, 53) are cured by heating, for example. Also, patterning, drilling and exterior processing are conducted if required.

Figure 21:
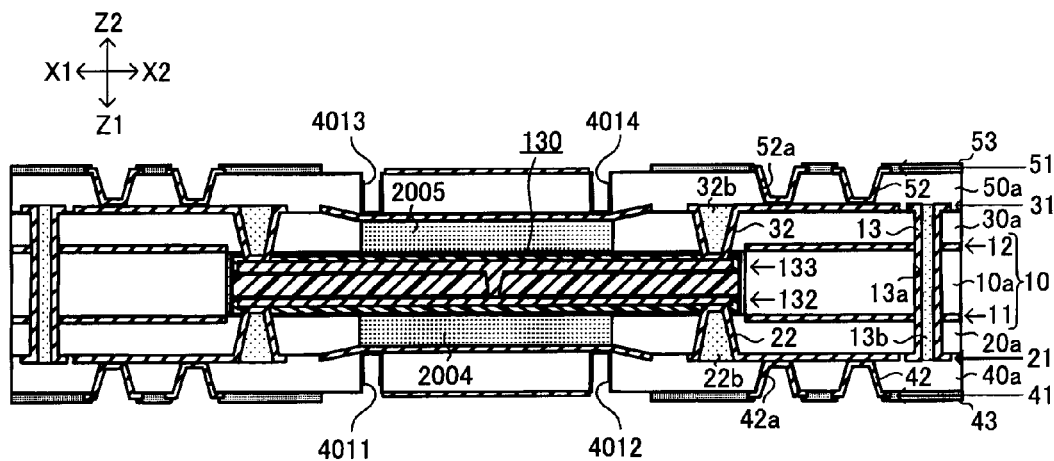
FIG. 21 is a view to illustrate a fifth step subsequent to the step in FIG. 20.

Next, by etching while covering the first and second surfaces with a mask having predetermined openings, or by beaming a laser at partial portions, for example, cut lines (4011-4014) are formed as shown in FIG. 21. Cut lines (4011, 4012) are formed in insulation layer (40a), and cut lines (4013, 4014) are formed in insulation layer (50a). Cut lines (4011-4014) reach a conductive pattern (wiring layer 41 or 51) on strip mask 2004 or 2005. After that, desmearing and soft etching is conducted if required.

Next, in step (S15) of FIG. 6, space is formed on both sides of the central section of flexible wiring board 130 (first-surface side and second-surface side). In doing so, flexible section (R100) (FIG. 1) is formed.

Figure 22:
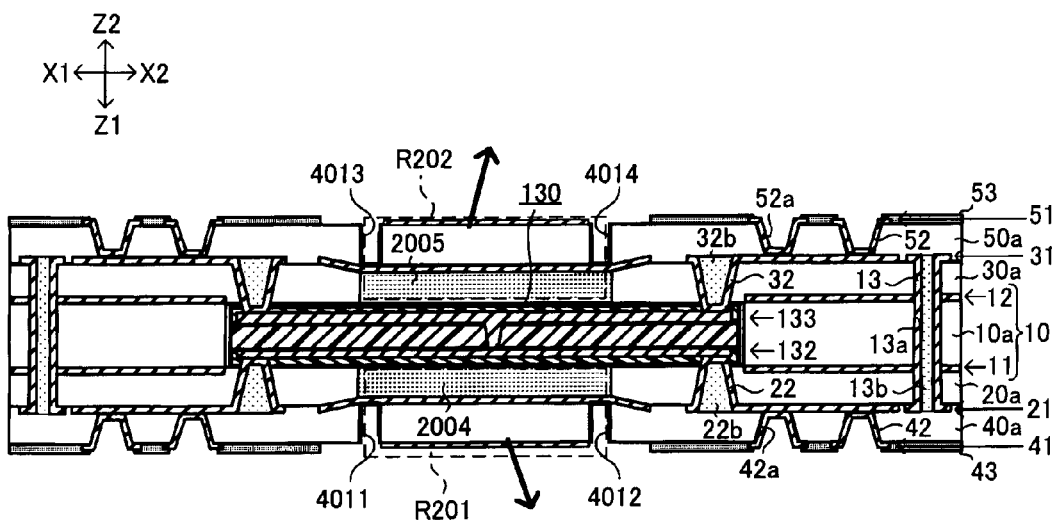
FIG. 22 is a view to illustrate a step for forming a flexible section.

Specifically, as shown in FIG. 22, portions in regions (R201, R202) partitioned by cut lines (4011-4014) are removed by peeling them from both surfaces of flexible wiring board 130. During that time, detaching is easy since strip masks (2004, 2005) are arranged. Accordingly, the central section of flexible wiring board 130 is exposed, and space that allows flexible wiring board 130 to curve (bend) is formed on the upper and lower surfaces of flexible wiring board 130 (lamination directions of insulation layers). As a result, flex-rigid wiring board 100 (FIG. 1) is completed.

Then, if required, remaining conductors are removed by mask etching, for example. Also, by printing solder paste, reflowing or the like, external connection terminals (solder bumps) are formed in opening portions in solder-resist layers (43, 53). Accordingly, connecting flex-rigid wiring board 100 to other wiring boards, mounting electronic components on flex-rigid wiring board 100 and so forth become possible through such external connection terminals. In addition, if required, exterior processing, warping correction, conductivity inspection, exterior inspection, final inspection or the like may be conducted.

The manufacturing method according to the present embodiment is suitable for manufacturing the above flex-rigid wiring board 100. Using such a manufacturing method, an excellent flex-rigid wiring board 100 may be obtained.

Second Embodiment

The description of the second embodiment of the present invention is provided by focusing on differences with the above first embodiment. Here, the same reference number is used for an element which is the same as that in the above FIG. 1 or the like, and common portions already described above, namely, portions whose description would be redundant, will be omitted from being described here for convenience sake.

Figure 23:
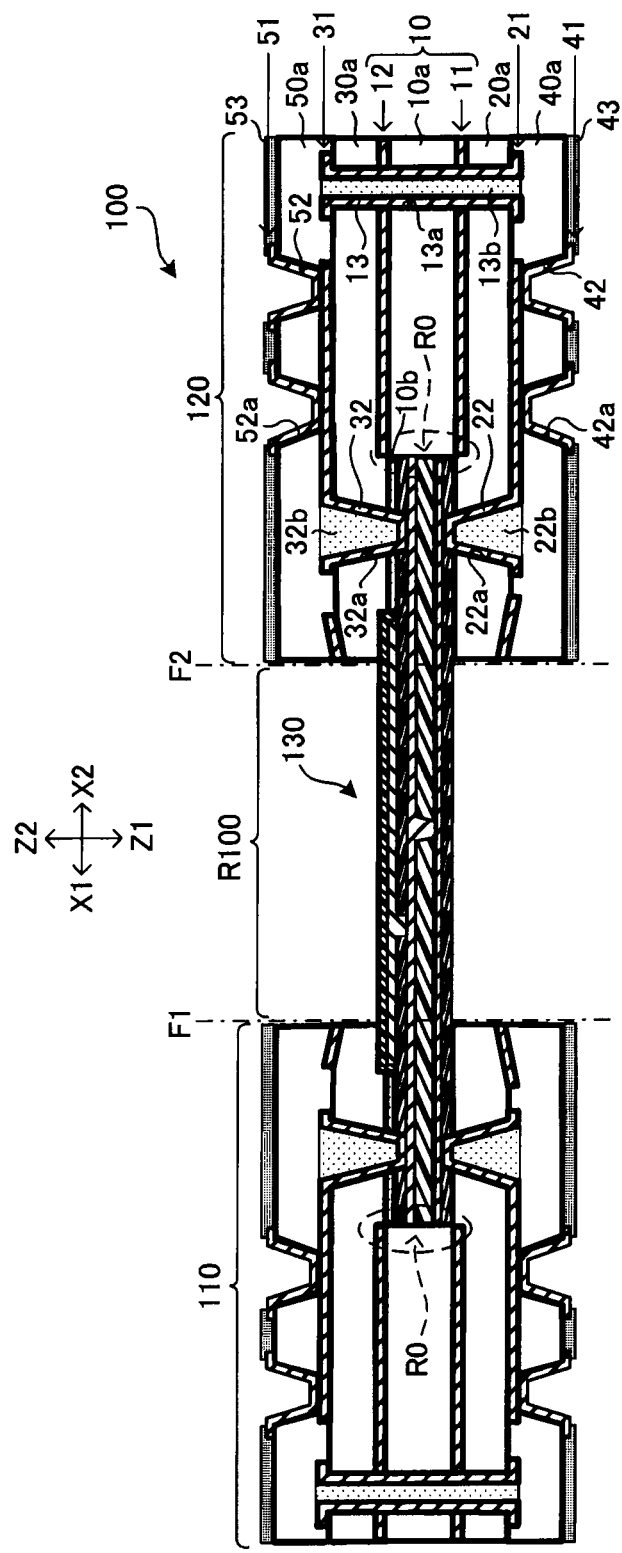
FIG. 23 is a cross-sectional view of a flex-rigid wiring board according to the second embodiment of the present invention.
Figure 24:
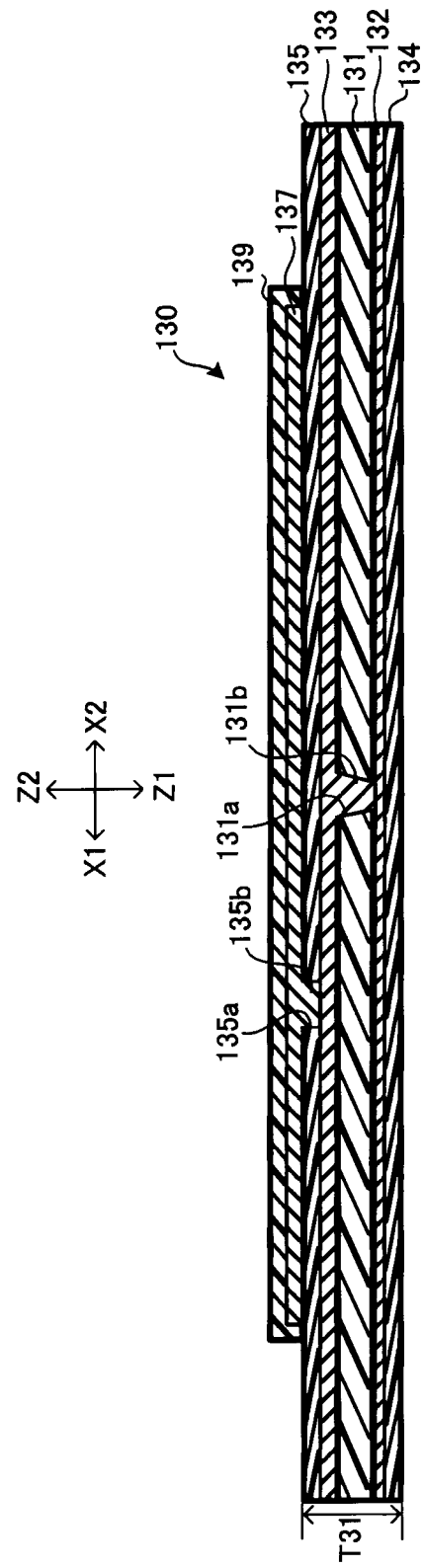
FIG. 24 is a cross-sectional view of a flexible wiring board according to the second embodiment.
Figure 25:
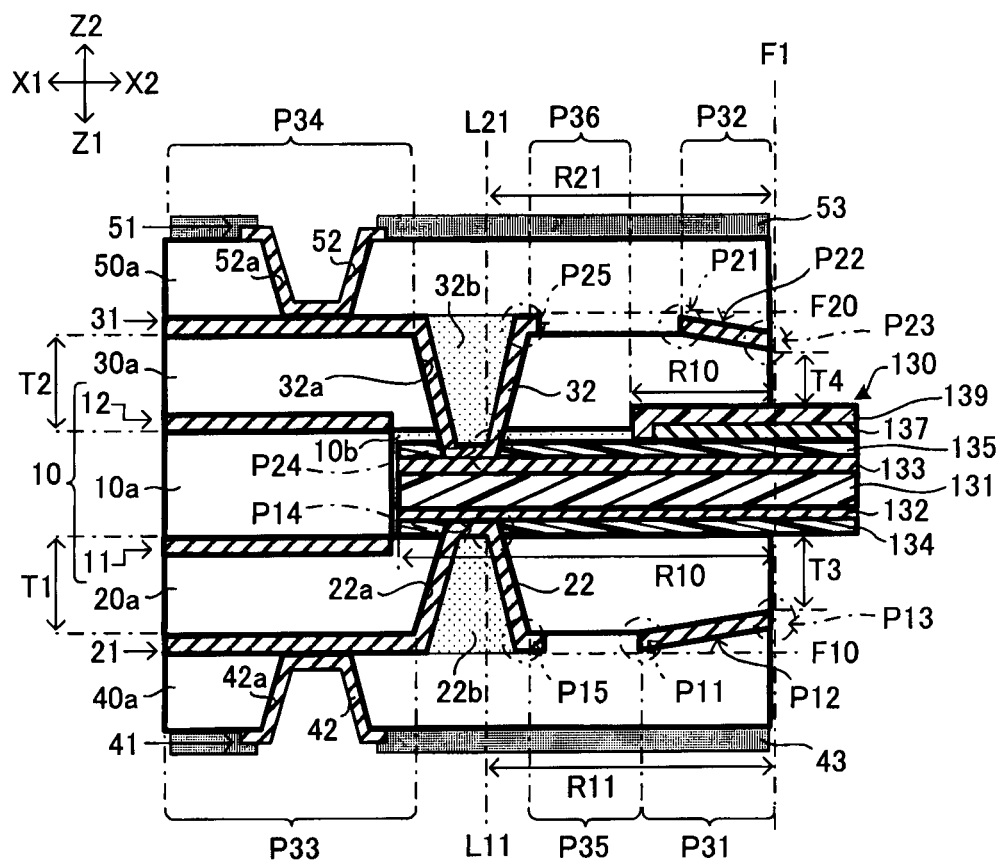
FIG. 25 is a magnified cross-sectional view showing part of a region in FIG. 23.

As shown in FIGS. 23-25, flexible wiring board 130 in flex-rigid wiring board 100 of the present embodiment has shield layer 137 and outer coverlay 139 on one surface (such as the second surface).

Shield layer 137 is formed on inner coverlay 135. Shield layer 137 shields electromagnetic noise from the outside (especially from the second-surface side) to wiring layers (132, 133), as well as shields electromagnetic noise from wiring layers (132, 133) to the outside (especially to the second-surface side). Shield layer 137 is made of conductive paste, for example. The thickness of shield layer 137 is approximately 10-30 μm, for example.

The conductive paste forming shield layer 137 contains fine silver particles, for example. Conductive paste is preferred to contain at least one kind from among silver, gold, copper and carbon. Especially, silver is effective to reduce noise due to its high electrical conductivity. However, the material for shield layer 137 is not limited to such, and any other type may be used.

In addition, inner coverlay 135 has connection conductor (135*b*). Specifically, hole (135*a*) is formed in inner coverlay 135. Hole (135*a*) may be formed by a laser, for example. Connection conductor (135*b*) is formed by filling conductive paste in hole (135*a*). Conductive paste may be filled by screen printing, for example. Shield layer 137 and wiring layer 133 are electrically connected by connection conductor (135*b*).

Outer coverlay 139 is formed over inner coverlay 135. Outer coverlay 139 coats shield layer 137. Outer coverlay 139 insulates and protects flexible wiring board 130 from the outside. Outer coverlay 139 is made of polyimide, for example. The thickness of outer coverlay 139 is approximately 5-30 μm, for example.

As shown in FIG. 25, resin (10*b*) is filled in the space partitioned by flexible wiring board 130 and insulation layers (10*a*, 20*a*, 30*a*,) (the clearance among those members). Resin (10*b*) flows out from the surrounding insulation layers (insulation layers 20*a*, 30*a* and the like) during pressing (see FIG. 15A), for example, and is cured to be integrated with the surrounding insulation layers.

In flex-rigid wiring board 100 of the present embodiment, since wiring layers (132, 133) are protected by shield layer 137, it is thought that flexible wiring board 130 becomes tolerant to noise. Also, by protecting flexible wiring board 130 with outer coverlay 139, it is thought that the strength or the like of flexible wiring board 130 increases.

Other than the above, regarding the structure the same as in the first embodiment, it is thought that substantially the same effects as those in the above-described first embodiment are achieved.

Third Embodiment

The description of the third embodiment of the present invention is provided by focusing on differences with the above second embodiment. Here, the same reference number is used for an element which is the same as that in the above FIG. 1 or the like, and common portions already described above, namely, portions whose description would be redundant, will be omitted from being described here for convenience sake.

Figure 26:
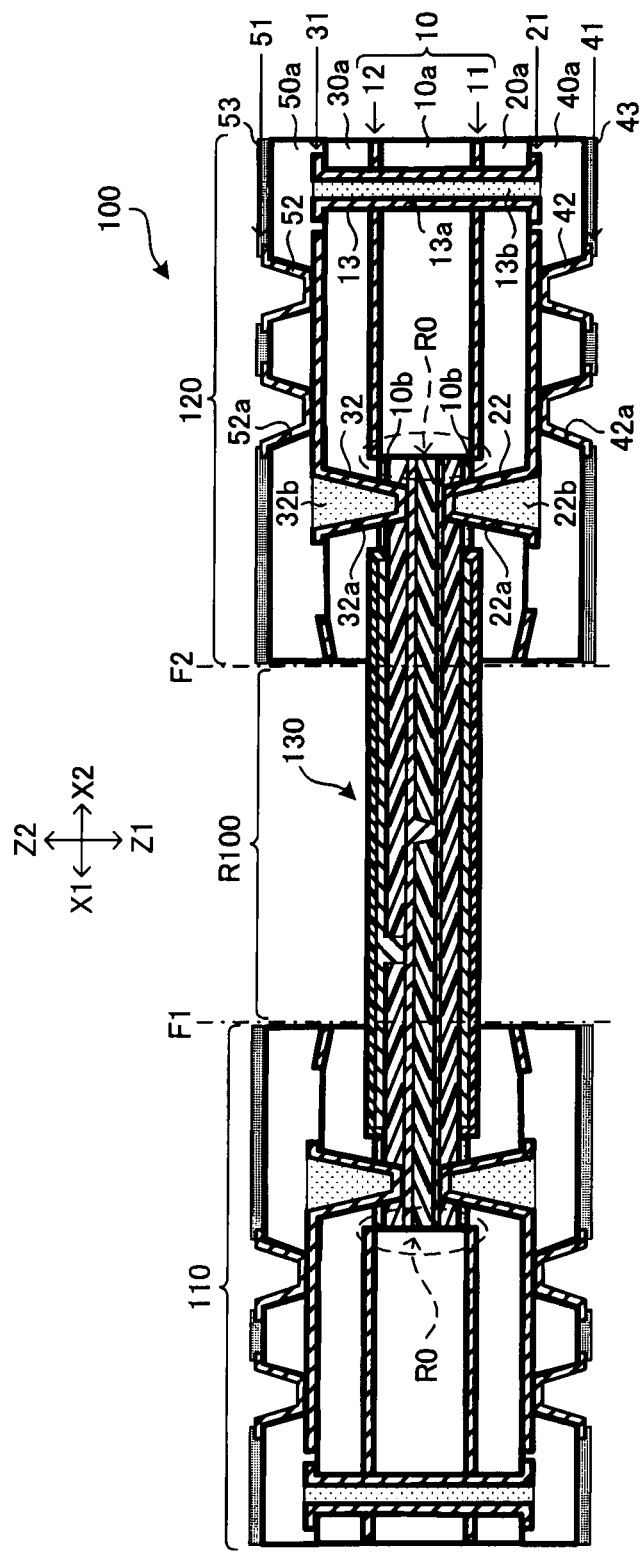
FIG. 26 is a cross-sectional view of a flex-rigid wiring board according to the third embodiment of the present invention.
Figure 27:
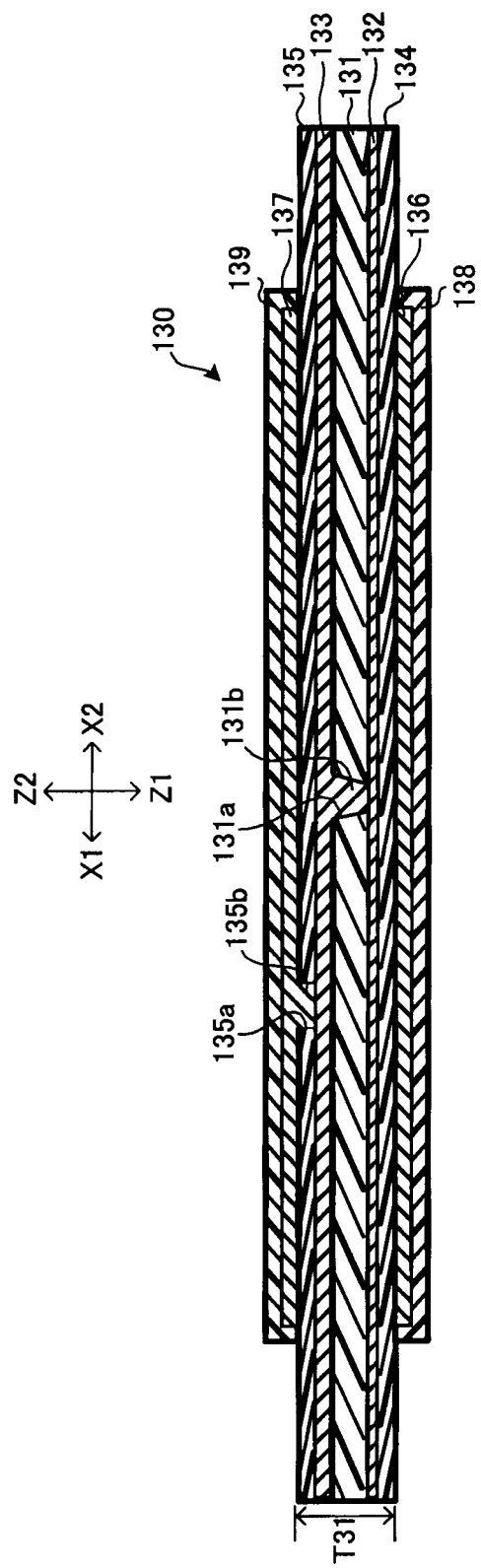
FIG. 27 is a cross-sectional view of a flexible wiring board according to the third embodiment.
Figure 28:
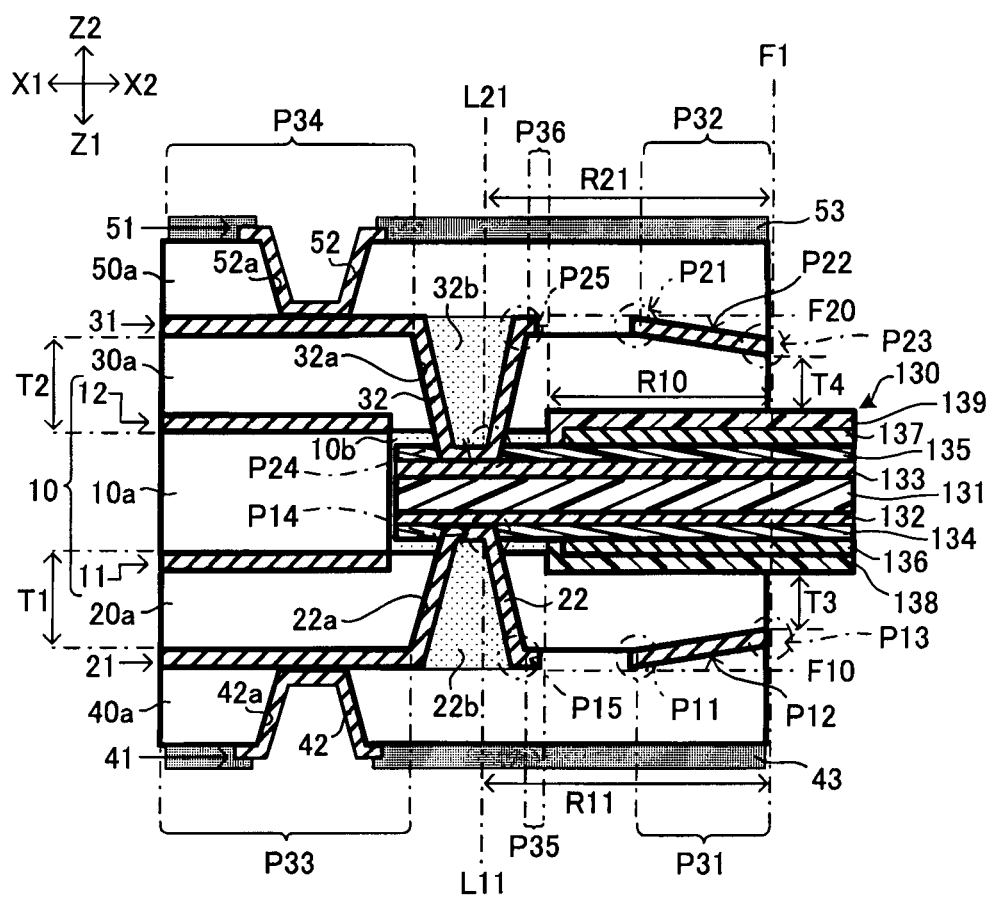
FIG. 28 is a magnified cross-sectional view showing part of a region in FIG. 26.

As shown in FIGS. 26-28, flexible wiring board 130 in flex-rigid wiring board 100 of the present embodiment has shield layers (136, 137) and outer coverlays (138, 139) on both surfaces (such as first and second surfaces).

If such a structure is employed, since wiring layers (132, 133) are protected by shield layers (136, 137) from both surfaces, it is thought that flexible wiring board 130 becomes further tolerant to noise. In addition, since flexible wiring board 130 is protected from both surfaces by outer coverlays (138, 139), it is thought that the strength or the like of flexible wiring board 130 further increases.

Fourth Embodiment

The description of the fourth embodiment of the present invention is provided by focusing on differences with the above first embodiment. Here, the same reference number is used for an element which is the same as that in the above FIG. 1 or the like, and common portions already described above, namely, portions whose description would be redundant, will be omitted from being described here for convenience sake.

Figure 29:
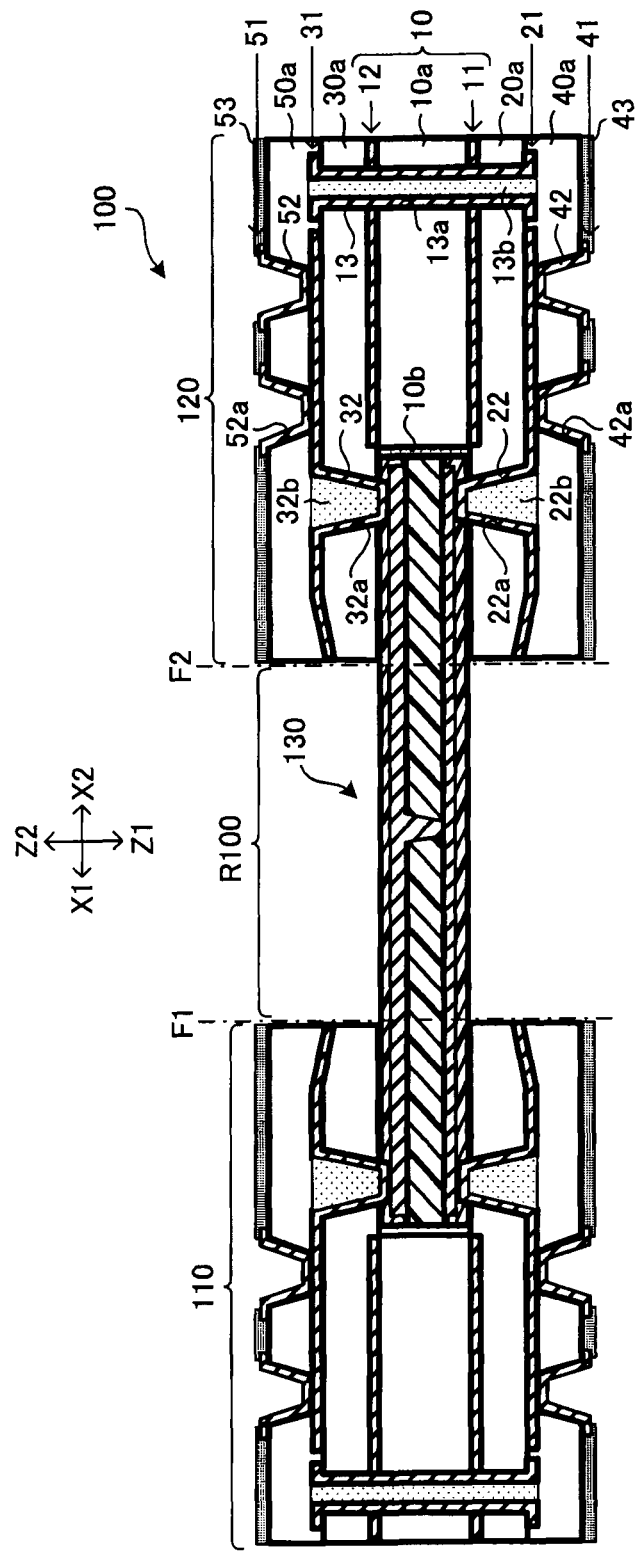
FIG. 29 is a cross-sectional view of a flex-rigid wiring board according to the fourth embodiment of the present invention.
Figure 30:
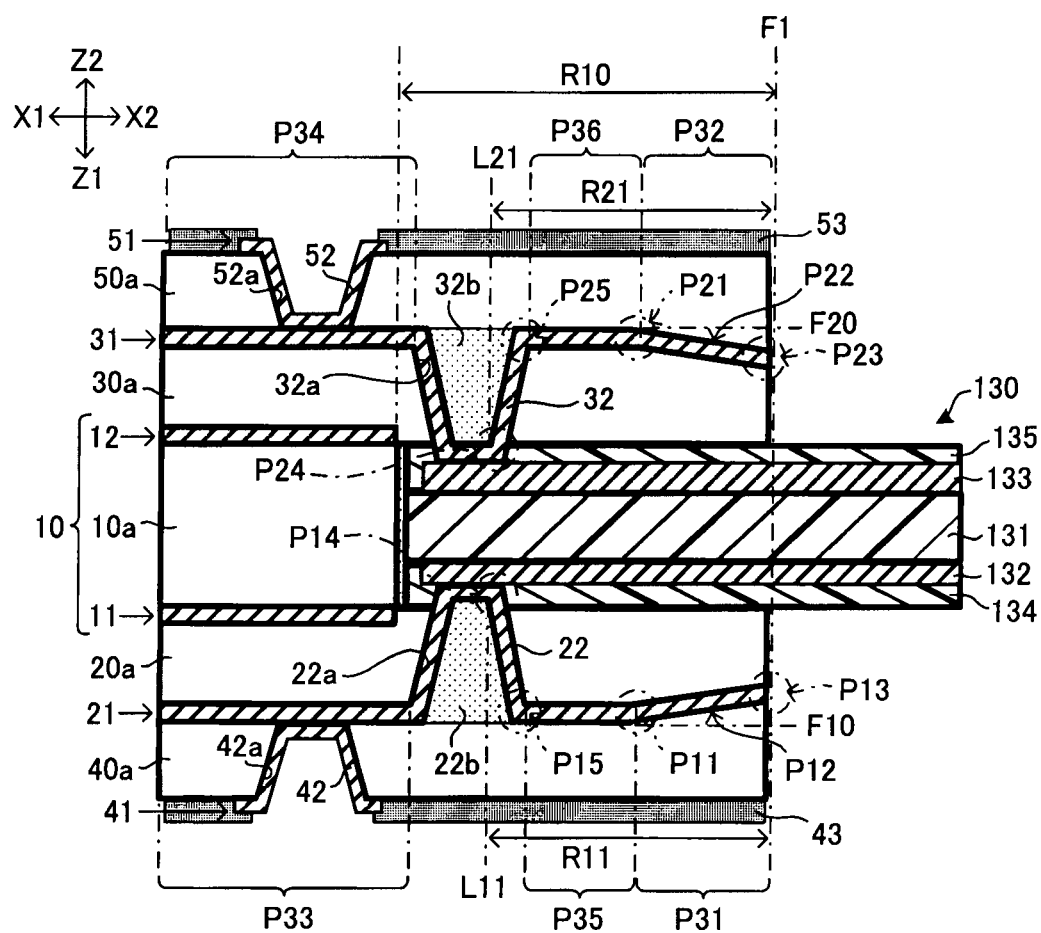
FIG. 30 is a magnified cross-sectional view showing part of a region in FIG. 29.

As shown in FIG. 29 and FIG. 30 (partially magnified view of FIG. 29), flex-rigid wiring board 100 of the present embodiment has conductors (wiring layers 21, 31) on non-tapered portions (P35, P36). Then, conductors on tapered portions (P31, P32) (sloping portions P12, P22) are connected to connection conductors (22, 32) by means of the conductors on non-tapered portions (P35, P36). In addition, the conductors on tapered portions (P31, P32) and connection conductors (22, 32) are formed to be contiguous to each other. Therefore, it is thought that the conductors on tapered portion (P31, P32) become stronger frames. Also, as a result, it is thought that such a connection structure, substantially the same as the above-described mortise joint, shows higher connection reliability against the stresses in a direction to pull out flexible wiring board 130 than the structure in the first embodiment.

Other than the above, regarding the structure the same as in the first embodiment, it is thought that substantially the same effects as those in the above-described first embodiment are achieved.

Flex-rigid wiring board 100 of the present embodiment may be manufactured using the procedure previously shown in FIG. 6, for example, by steps that correspond to those described above with reference to FIGS. 7A-22. For example, in the step shown in FIG. 16 (a step for patterning conductive layers), conductors may remain on non-tapered portions (P35, P36).

Fifth Embodiment

The description of the fifth embodiment of the present invention is provided by focusing on differences with the above first embodiment. Here, the same reference number is used for an element which is the same as that in the above FIG. 1 or the like, and common portions already described above, namely, portions whose description would be redundant, will be omitted from being described here for convenience sake.

Figure 31:
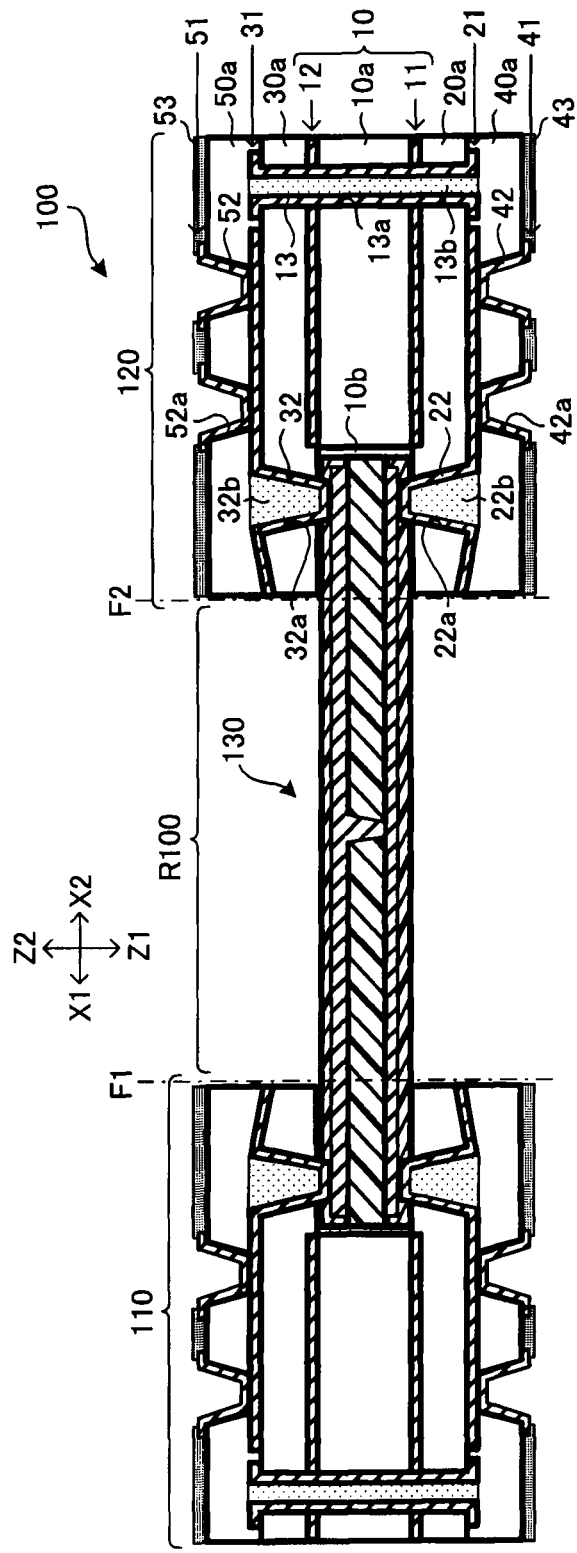
FIG. 31 is a cross-sectional view of a flex-rigid wiring board according to the fifth embodiment of the present invention.
Figure 32:
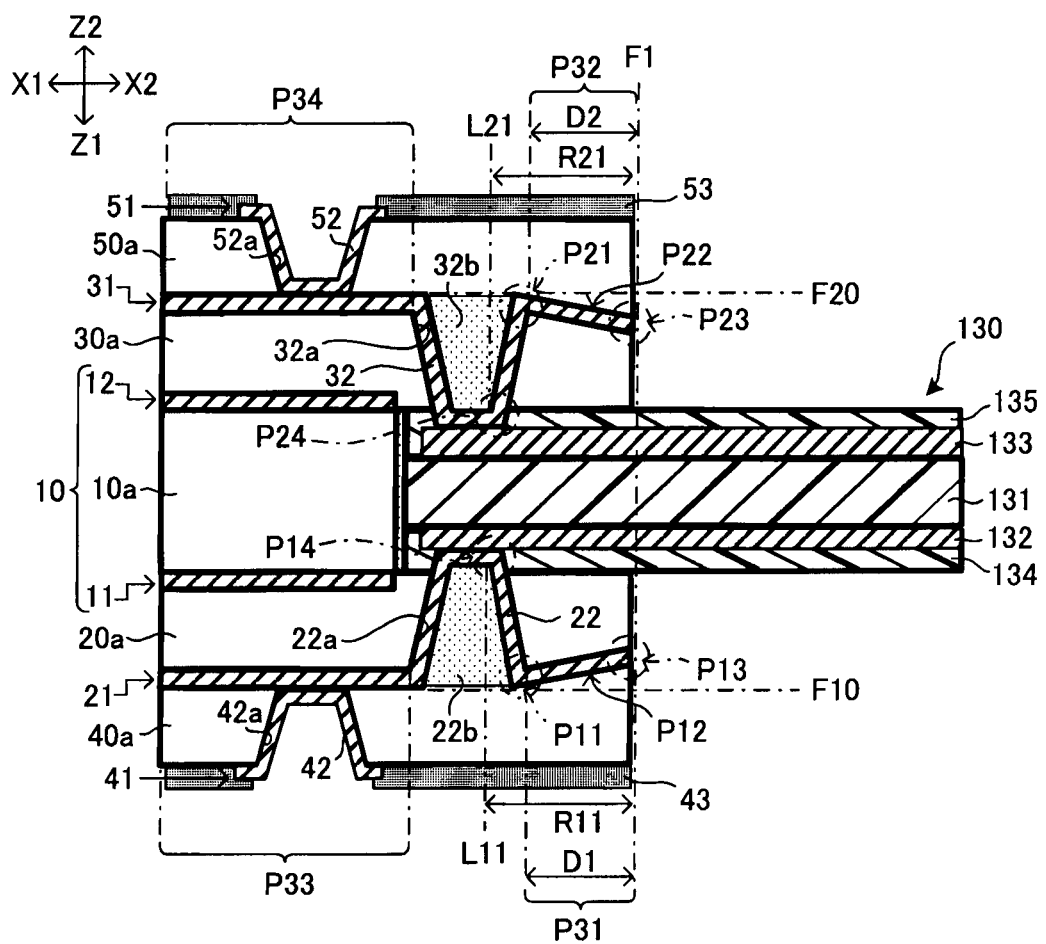
FIG. 32 is a magnified cross-sectional view showing part of a region in FIG. 31.

As shown in FIG. 31 and FIG. 32 (partially magnified view of FIG. 31), in flex-rigid wiring board 100 of the present embodiment, non-tapered portions (P35, P36) are not formed. Even if such a structure is employed, it is thought that substantially the same effects as those in the above-described first embodiment are also achieved in the structure the same as in the first embodiment.

Flex-rigid wiring board 100 of the present embodiment may be manufactured using the procedure previously shown in FIG. 6, for example, by steps that correspond to those described above with reference to FIGS. 7A-22. Taper start points (P11, P21) may be set at desired positions by adjusting, for example, the size of insulation layers (20a, 30a) and positioning insulation layers (20a, 30a) or the like in the step shown in FIG. 13.

Other Embodiments

So far, flex-rigid wiring boards according to embodiments of the present invention and methods for manufacturing such wiring boards have been described. However, the present invention is not limited to the above embodiments.

Figure 33:
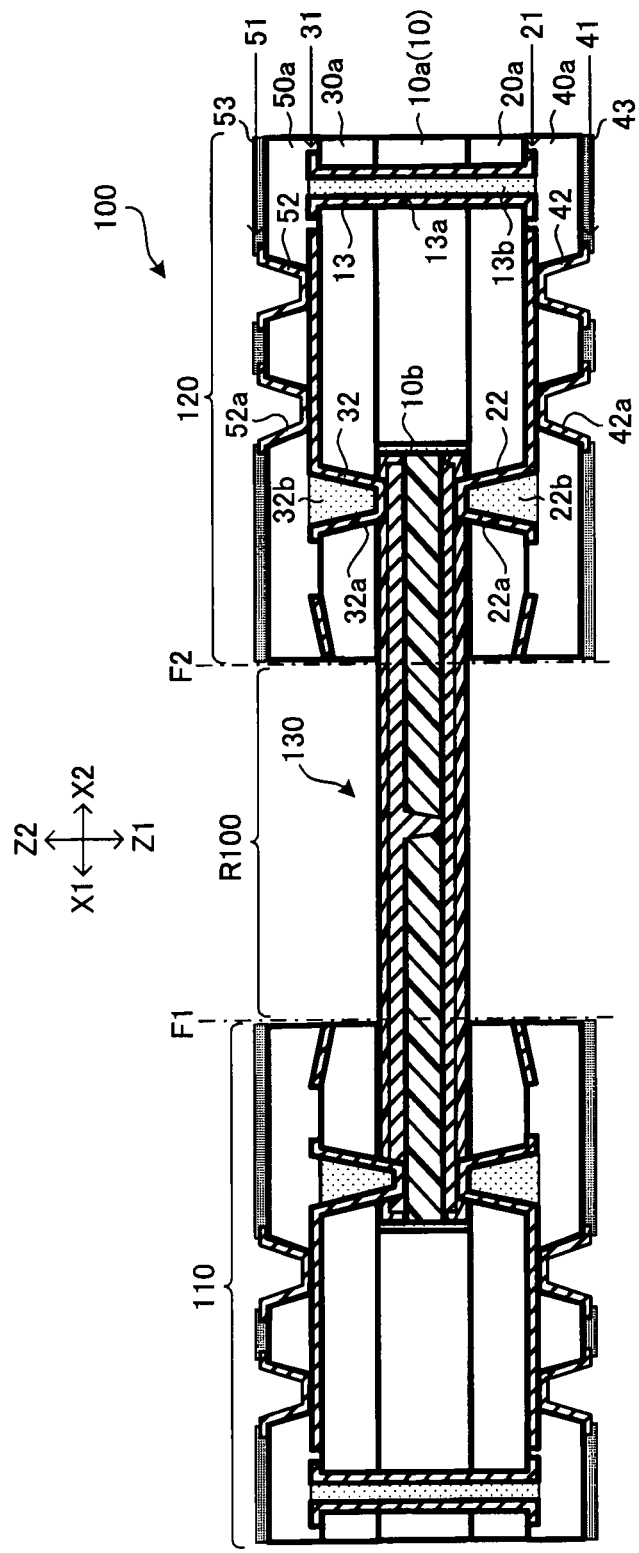
FIG. 33 is a view showing an example where the core substrate of a flex-rigid wiring board is structured only with insulation layers (insulative substrate)

For example, as shown in FIG. 33, substrate 10 (core substrate of flex-rigid wiring board 100) may be formed only with insulation layer (10a) (insulative substrate). When manufacturing such a flex-rigid wiring board 100, it is thought that a step for forming wiring layers (11, 12) may be omitted. As a result, it is thought that a reduction in manufacturing costs is achieved.

Figure 34A:
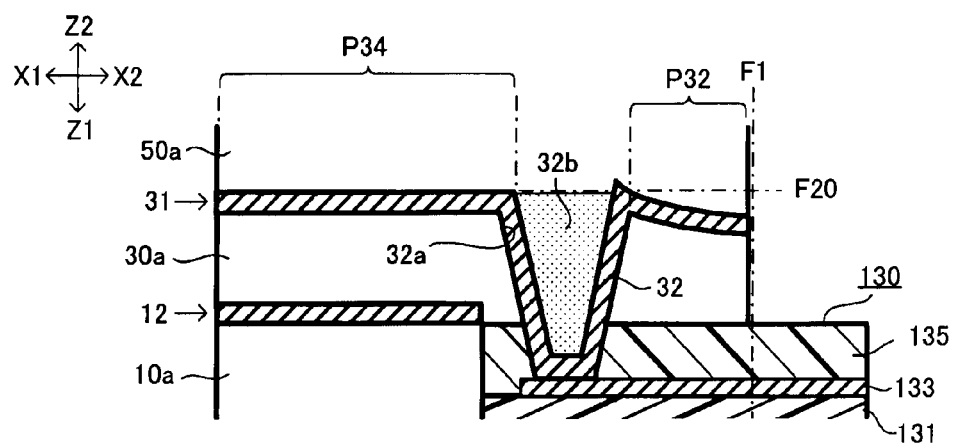
FIG. 34A is a view showing an example where the thickness of an insulation layer in a tapered section decreases on a curved line.

As shown in FIG. 34A, the thickness of insulation layer (30a) at tapered portion (P32) may decrease on a curved line. In such a case, the second surface of tapered portion (P32) becomes a curved surface. The same applies to tapered portion (P31).

Figure 34B:
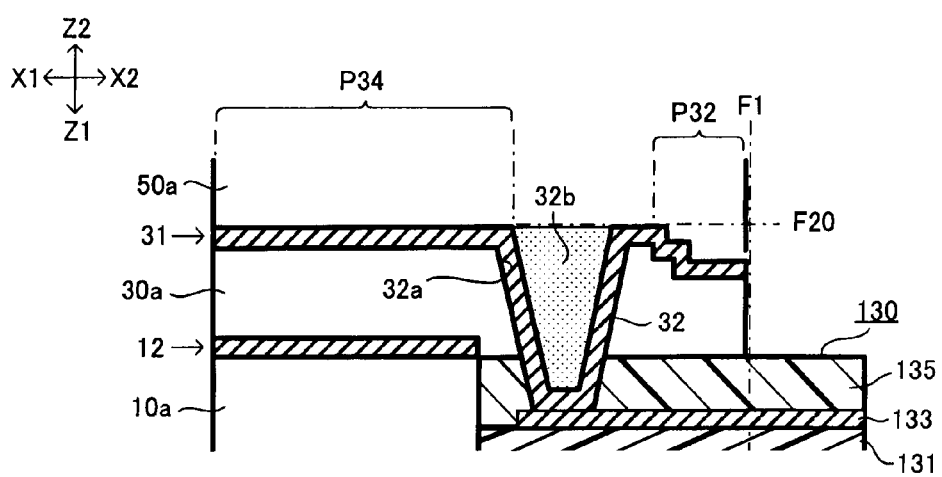
FIG. 34B is a view showing an example where the thickness of an insulation layer in a tapered section decreases in steps.

Also, as shown in FIG. 34B, the thickness of insulation layer (30a) at tapered portion (P32) may decrease in steps. The same applies to tapered portion (P31).

A method for forming tapered portions (P31, P32) is not limited to the above pressing, and any other method may be used. For example, prior to pressing (the step in FIG. 15A), a predetermined shape may be formed by using a laser, a die, a guillotine cutter or the like. However, if such a method is employed, the number of steps increases compared with using a pressing method. Thus, it is thought that pressing is preferred to easily form tapered portions (P31, P32).

Figure 35:
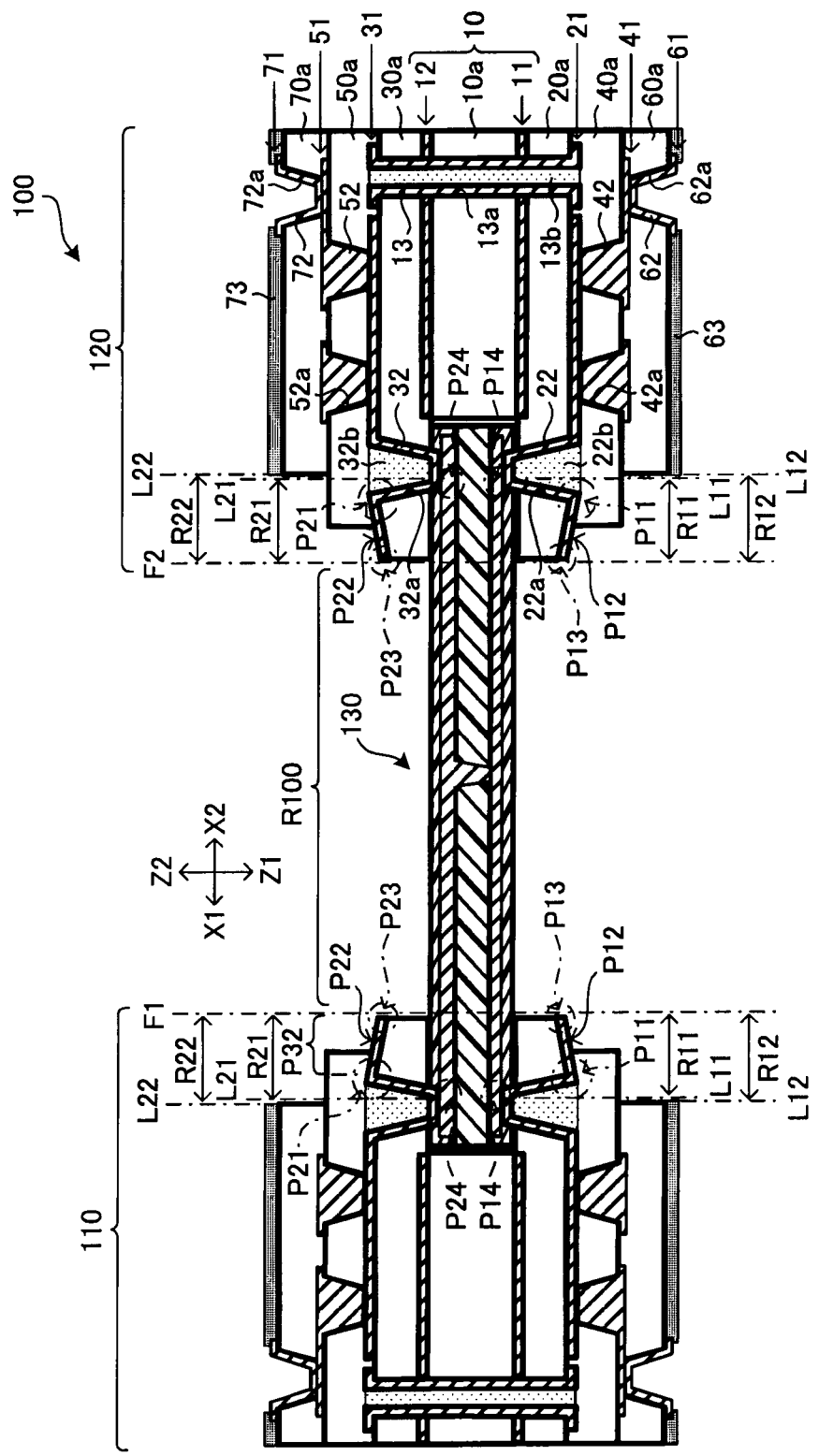
FIG. 35 is a view showing a structure where insulation layers become thinner in steps as they come closer to a flexible section.
Figure 36:
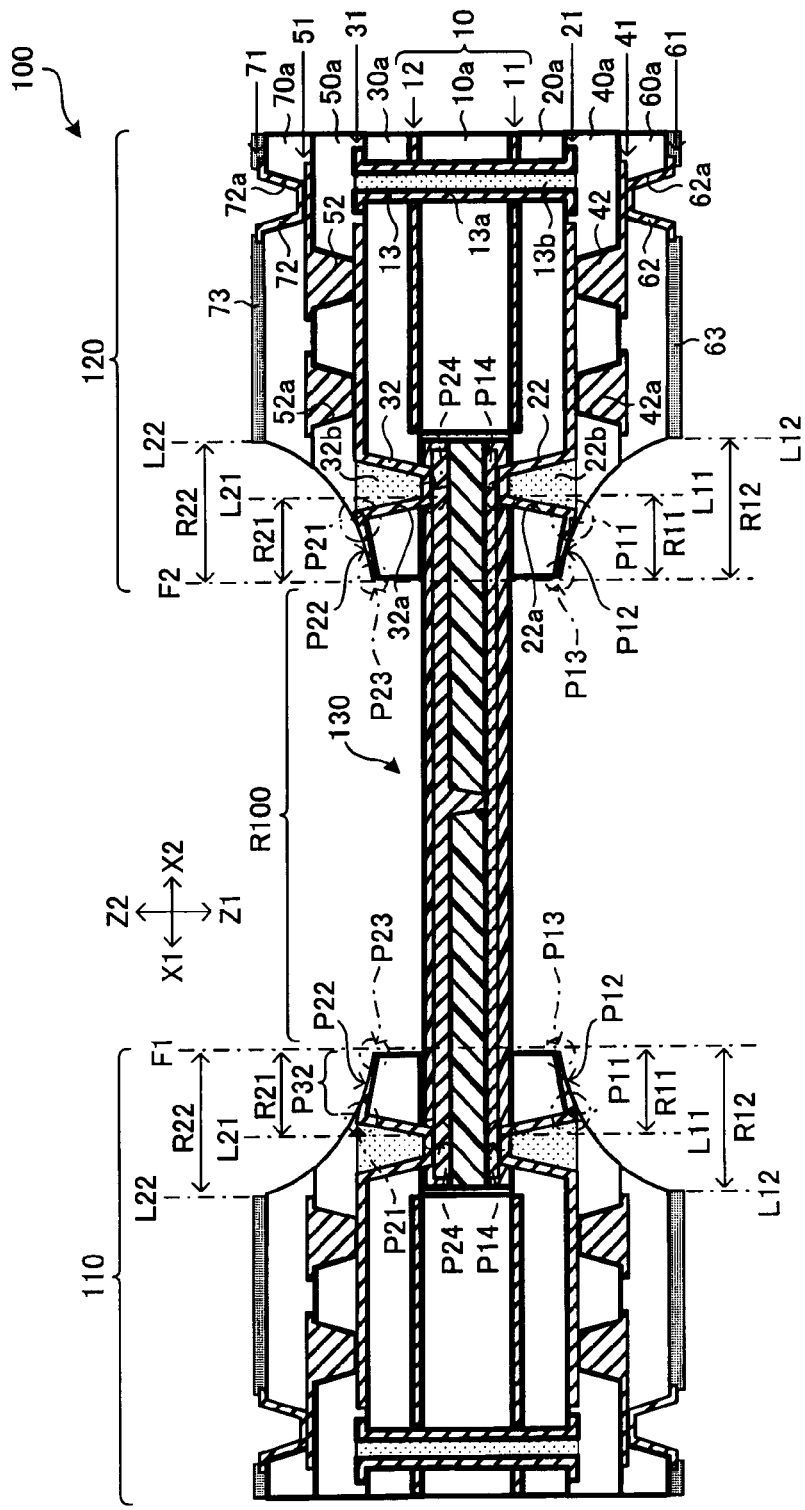
FIG. 36 is a view showing a first structure where insulation layers become continuously thinner as they come closer to a flexible section.
Figure 37:
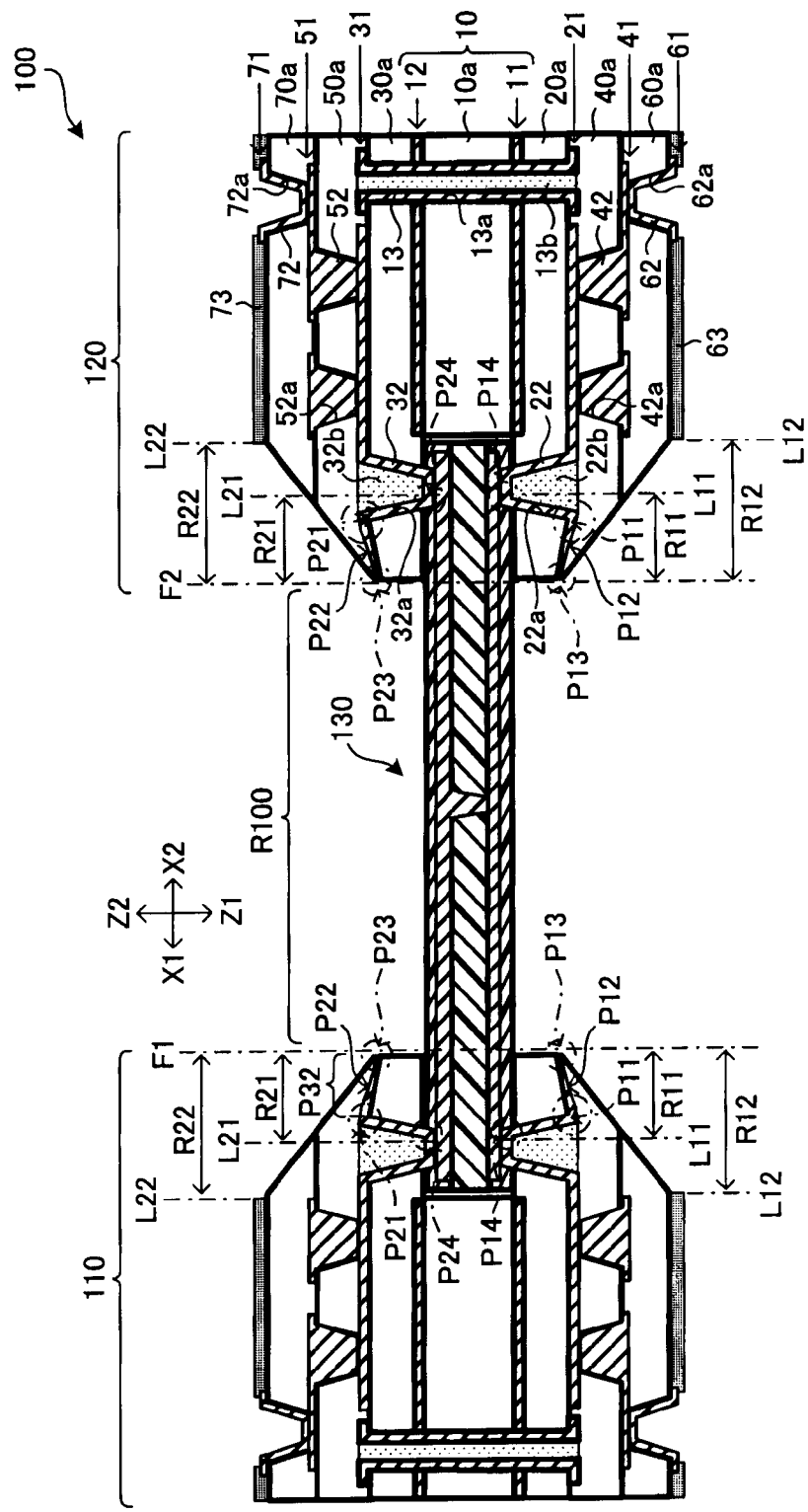
FIG. 37 is a view showing a second structure where insulation layers become continuously thinner as they come closer to a flexible section.

As shown in FIGS. 35-37, insulation layers (20a, 40a, 60a) on the first-surface side and insulation layers (30a, 50a, 70a) on the second-surface side may have portions that become thinner as they come closer to flexible section (R100). By employing such a structure, it is thought that both end portions of flexible wiring board 130 are sandwiched and held even more firmly.

In an example shown in FIGS. 35-37, the number of layers is greater than that in flex-rigid wiring board 100 according to each of the above embodiments. Namely, insulation layer (60a) is laminated on the first-surface side of insulation layer (40a), and insulation layer (70a) is laminated on the second-surface side of insulation layer (50a). Wiring layer 61 is formed on insulation layer (60a), and wiring layer 71 is formed on insulation layer (70a). Moreover, solder-resist layer 63 is formed on insulation layer (60a), and solder-resist layer 73 is formed on insulation layer (70a). Also, hole (62a) is formed in insulation layer (60a), and hole (72a) is formed in insulation layer (70a). On the wall surfaces of holes (62a, 72a), connection conductors (62, 72) made of copper plating, for example, are formed respectively.

In an example shown in FIG. 35, in range (R12) from position (L12), which is at an end of the outermost insulation layer (insulation layer 60a) on the first-surface side of rigid section 110 or 120 in the direction of flexible section (R100), to F-R boundary surface (F1) or (F2), insulation layers (20a, 40a, 60a) on the first-surface side become thinner in steps as they come closer to flexible section (R100). An end position of insulation layer (60a) in the direction of flexible section (R100) is position (L12); an end position of insulation layer (40a) in the direction of flexible section (R100) is midway between position (L12) and F-R boundary surface (F1) or (F2); and an end position of insulation layer (20a) in the direction of flexible section (R100) corresponds to F-R boundary surface (F1) or (F2). The same structure applies to insulation layers (30a, 50a, 70a) on the second-surface side. However, in that situation, position (L22) shown in FIG. 35 replaces position (L12), and range (R22) replaces range (R12).

By contrast, in examples shown in FIGS. 36 and 37, in range (R12) from position (L12), which is at an end of the outermost insulation layer (insulation layer 60a) on the first-surface side of rigid section 110 or 120 in the direction of flexible section (R100), to F-R boundary surface (F1) or (F2), insulation layers (20a, 40a, 60a) on the first-surface side become continuously thinner as they come closer to flexible section (R100).

In an example shown in FIG. 36, the end surfaces of first-surface-side insulation layers (20a, 40a, 60a) in the direction of flexible section (R100) are curved surfaces that continue through such insulation layers (20a, 40a, 60a). Also, the same applies to insulation layers (30a, 50a, 70a) on the second-surface side.

In an example shown in FIG. 37, the end surfaces of first-surface-side insulation layers (20a, 40a, 60a) in the direction of flexible section (R100) are sloping surfaces that continue through such insulation layers (20a, 40a, 60a). Also, the same applies to insulation layers (30a, 50a, 70a) on the second-surface side.

The structures shown in FIGS. 35-37 may be formed by shifting insulation layers when positioning them from the lower layer toward the upper layer, or by shaving insulation layers through etching or beaming a laser when forming cut lines (4011-4014) (FIG. 21) or the like.

Figure 38:
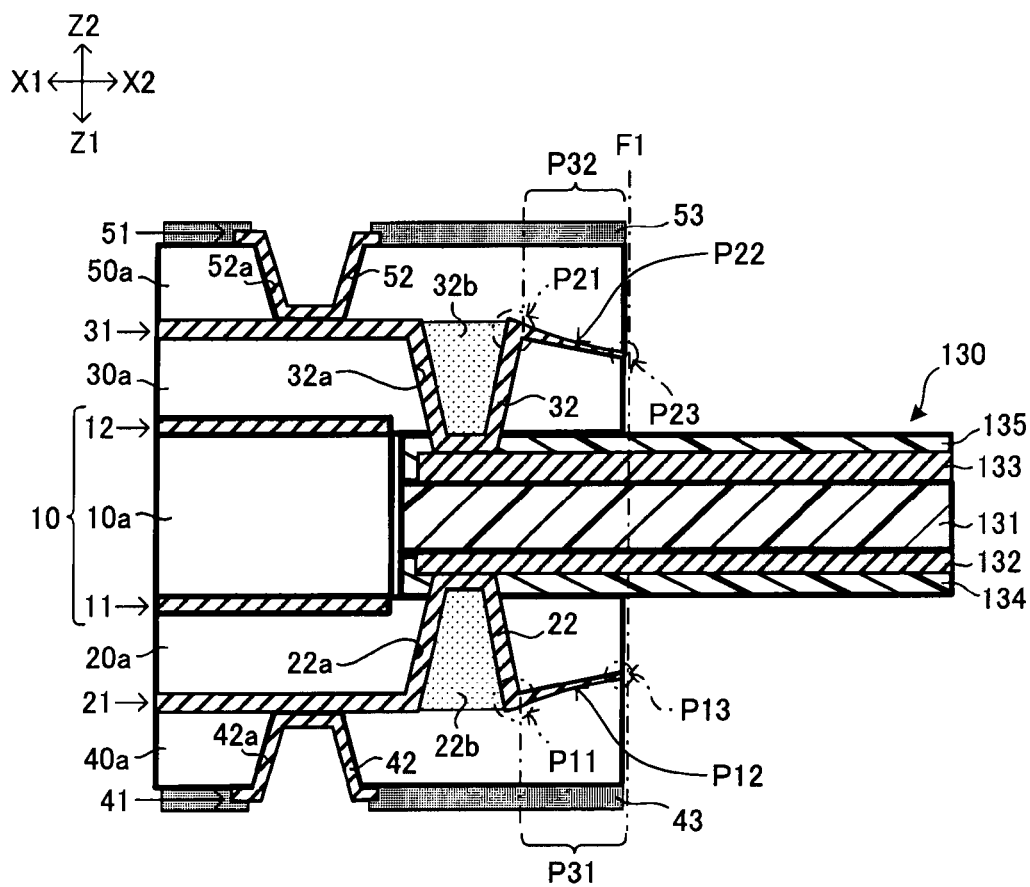
FIG. 38 is a view showing a structure where the thickness of a sloping portion decreases as it comes closer to the tip from the taper start point.

As shown in FIG. 38, the thickness of sloping portion (P12) or (P22) may decrease as it comes closer to tip (P13) or (P23) of wiring layer 21 or 31 from taper start point (P11) or (P21) of insulation layer (20a) or (30a). By employing such a structure, it is thought that the bendability of flexible section (R100) improves. Such a structure may be formed by forming wiring layers (21, 31) during pressing (FIG. 15A) or while forming conductive patterns (FIG. 16), for example, or by shaving wiring layers (21, 31) through etching or beaming a laser or the like.

Figure 39:
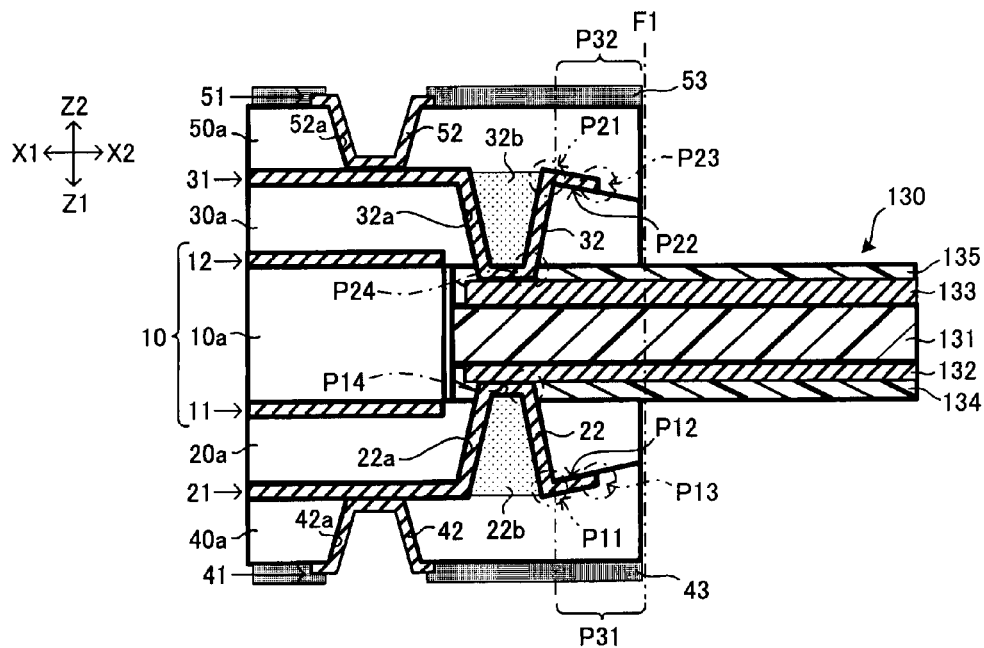
FIG. 39 is a view showing a structure where the position of a tip of a conductive pattern does not overlap an F-R boundary surface.

Positions of tips (P13, P23) are not always required to correspond to F-R boundary surface (F1) or (F2). As shown in FIG. 39, tips (P13, P23) may be positioned near F-R boundary surface (F1) or (F2). With such a structure, it is thought that connection reliability in F-R connection sections is enhanced as described previously.

Figure 40:
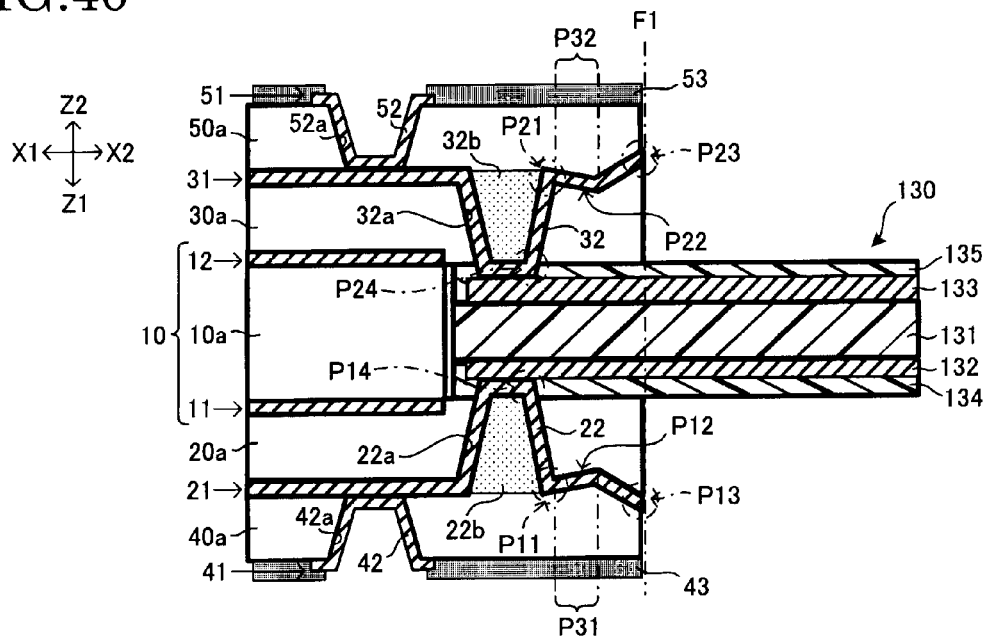
FIG. 40 is a view showing a conductive pattern having a sloping portion in part of a region between the taper start point and the tip.

Not all portions from taper start point (P11) or (P21) in insulation layer (20a) or (30a) to F-R boundary surface (F1) or (F2) are required to be tapered portion (P31) or (P32). As shown in FIG. 40, it is sufficient if tapered portion (P31) or (P32) is at least partially formed. With such a structure, it is thought that connection reliability in F-R connection sections is enhanced as described previously.

Figure 41:
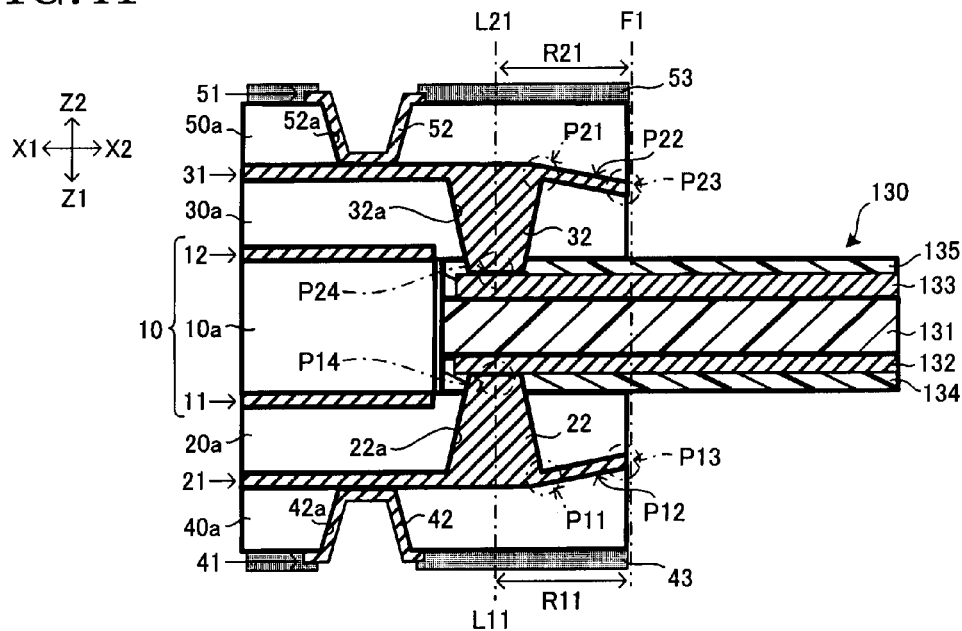
FIG. 41 is a view showing an example where connection conductors in the core section are made to be filled conductors.

Connection conductors (22, 32) to electrically connect conductive patterns (wiring layers 132, 133) of flexible wiring board 130 and conductive patterns (wiring layers 21, 31) of rigid section 110 or 120 are not limited to being conformal conductors, and they may be set as filled conductors as shown in FIG. 41. In such a case, lines (L11, L12) which indicate raised points (P14, P24) are an axis which passes through the center (gravity center) of connection conductors (22, 32) (filled conductors). When connection conductors (22, 32) are made as filled conductors, it is thought that conductive patterns (wiring layers 132, 133) of flexible wiring board 130 and conductive patterns (wiring layers 21, 31) of rigid section 110 or 120 are connected more firmly.

Figure 42:
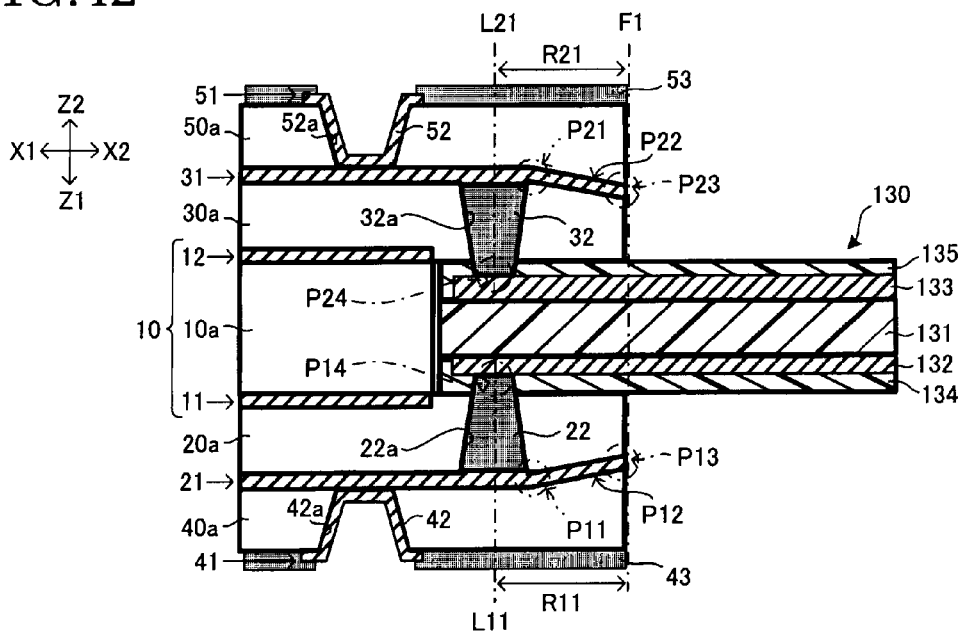
FIG. 42 is a view showing an example where connection conductors in the core section are made of conductive paste.

Connection conductors (22, 32) to electrically connect conductive patterns (wiring layers 132, 133) of flexible wiring board 130 and conductive patterns (wiring layers 21, 31) of rigid section 110 or 120 may be formed with conductive paste as shown in FIG. 42. Connection conductors (22, 32) may be filled conductors or conformal conductors. Also, as shown in FIG. 42, wiring layer 21 or 31 and connection conductor 22 or 32 may be formed using different conductive material from each other.

Figure 43A:
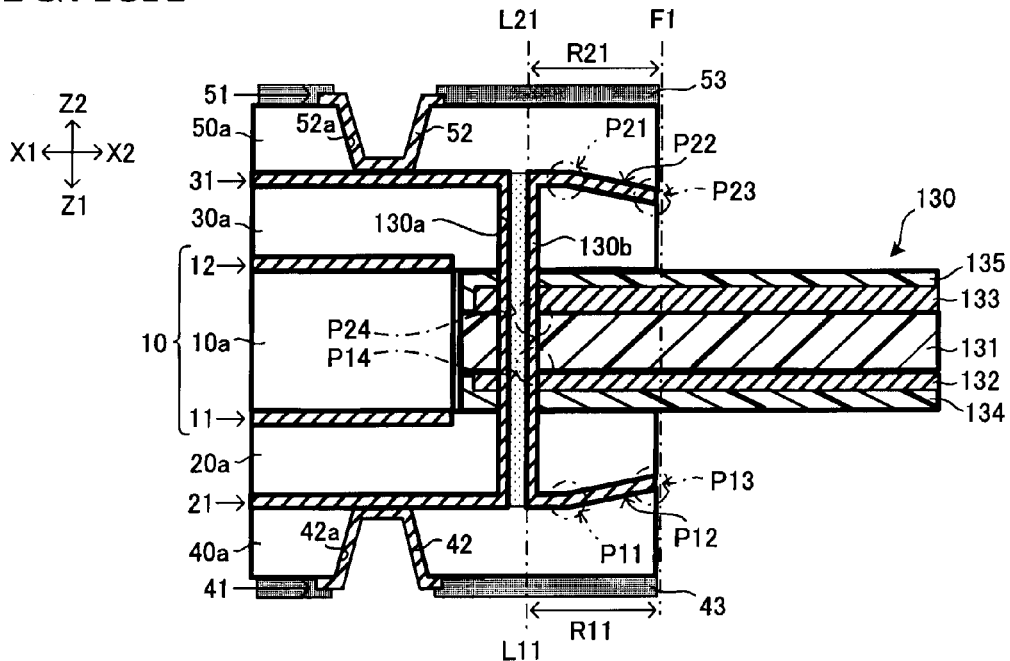
FIG. 43A is a view showing a first example where a connection conductor in the core section is the conductor in a through hole.
Figure 43B:
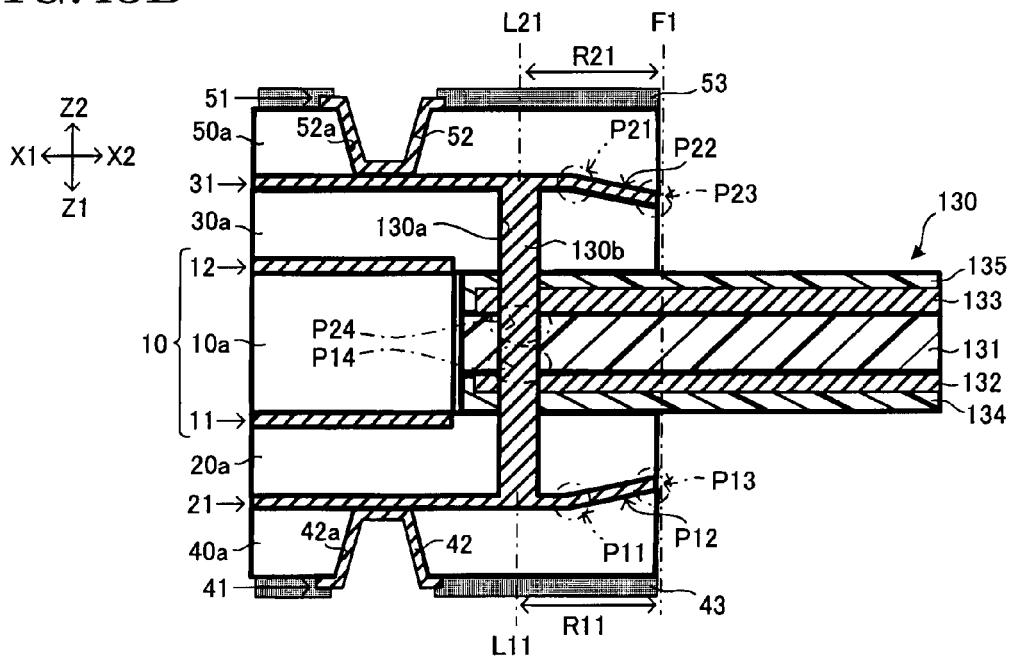
FIG. 43B is a view showing a second example where a connection conductor in the core section is the conductor in a through hole.

As shown in FIGS. 43A and 43B, conductive patterns (wiring layers 132, 133) of flexible wiring board 130 and conductive patterns (wiring layers 21, 31) of rigid section 110 or 120 may be electrically connected to each other by means of conductor (130b) (conformal conductor or filled conductor) in through hole (130a) which penetrates through insulation layer (30a), flexible wiring board 130 and insulation layer (20a). In those examples, cross-sectional surfaces of wiring layers (132, 133) are exposed, and wiring layers (21, 31, 132, 133) are electrically connected by conductor (130b). If such a connection method is employed, since holes are formed all at once in multiple layers, manufacturing flex-rigid wiring board 100 becomes simple compared with situations in which holes are formed separately in each layer. Through hole (130a) may penetrate through rigid section 110 or 120.

Figure 44:
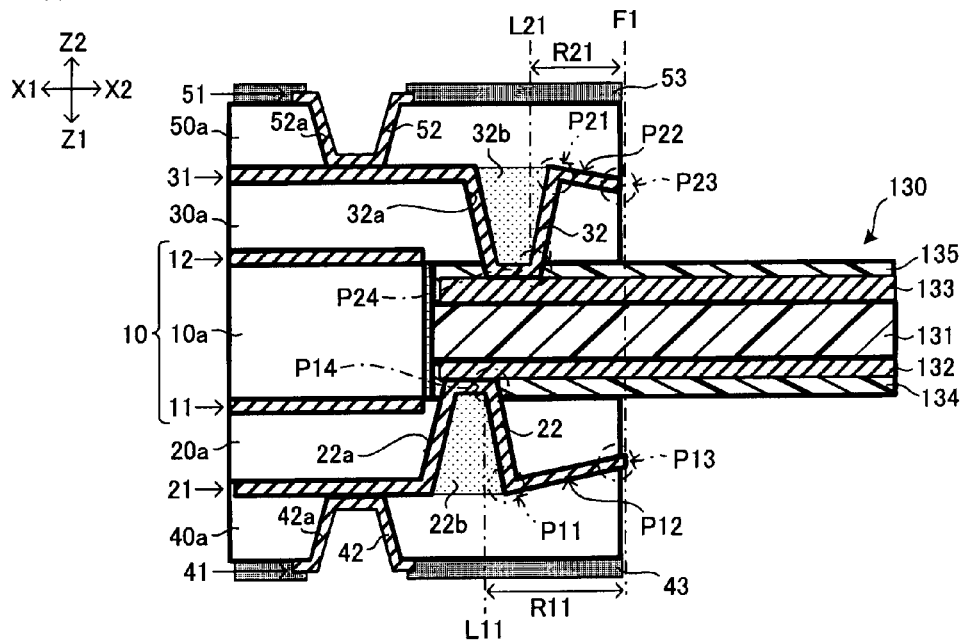
FIG. 44 is a view showing an example where connection conductors in the core section are positioned not to face each other.

As shown in FIG. 44, connection conductor 22 and connection conductor 32 may be positioned away from an axis Z (for example, to be shifted in direction X or direction Y). In such a case, connection conductor 22 and connection conductor 32 do not face each other. However, if connection conductor 22 and connection conductor 32 are positioned on an axis Z, it is thought that effects such as enhancing connection reliability are greater, as described previously.

Figure 45:
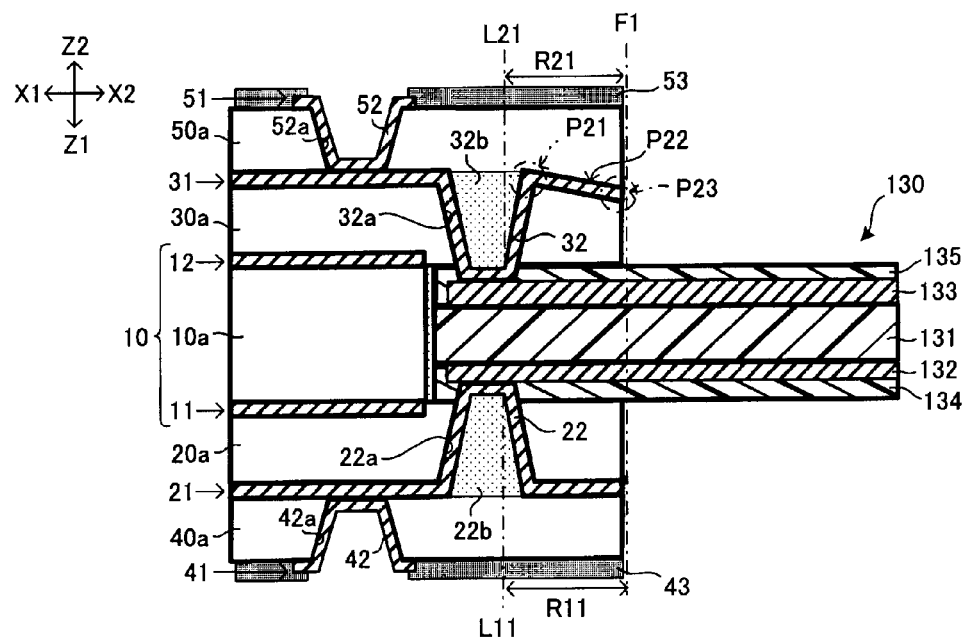
FIG. 45 is a view showing an example where a tapering structure is employed only in an F-R connection section of either surface.

It is not required to employ the above tapered structure (such as tapered portions P31, P32) for conductive patterns in all F-R connection sections. For example, as shown in FIG. 45, a tapered structure may be employed only in the F-R connection section on the second-surface side. However, if tapered structures are employed for both surfaces, it is thought that effects such as enhancing connection reliability or the like are greater, as described previously.

Figure 46:
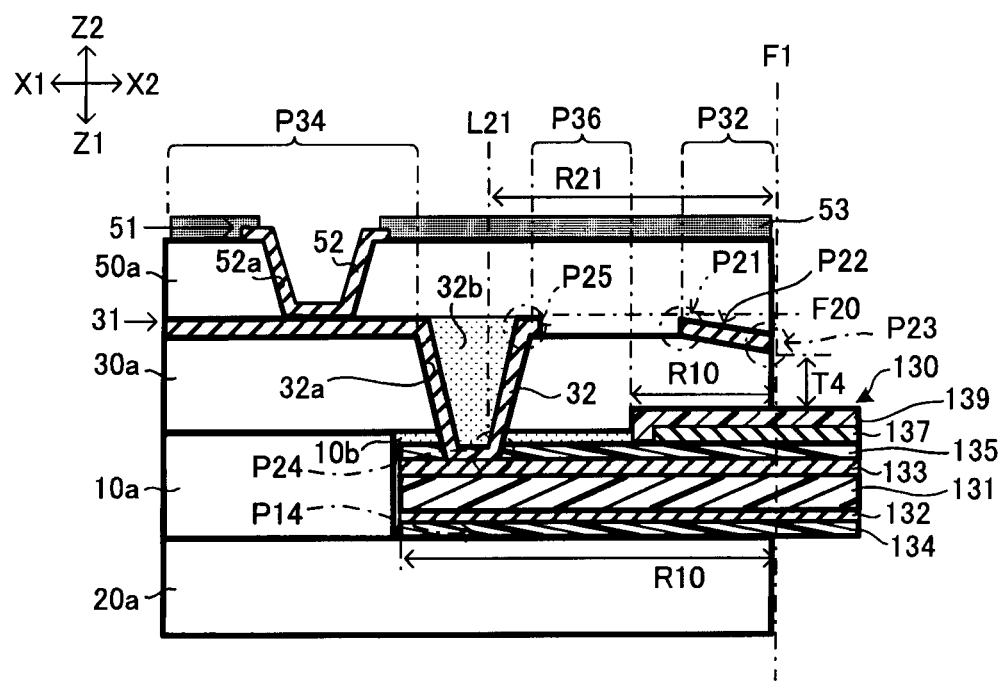
FIG. 46 is a view showing an example where a wiring layer only on one side of the flexible wiring board is electrically connected to a conductive pattern in a rigid section.

As shown in FIG. 46, only one surface (either wiring layer 132 or 133) of flexible wiring board 130 may be electrically connected to a conductive pattern (wiring layer 21 or 31) of rigid sections (110, 120) by means of connection conductor 22 or 32. In an example in FIG. 46, only wiring layer 31 is connected to wiring layer 133 by means of connection conductor 32.

Figure 47A:
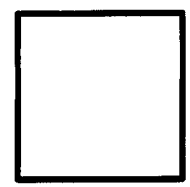

The shape of horizontal cross sections (X-Y plane) of connection conductors or their holes is not limited to a circle (completely round circle), and any other shape may be employed. The shape of such cross sections may be a square as shown in FIG. 47A, for example, or may be any other regular polygon, such as a regular hexagon or a regular octagon. The shape of angles in such polygons is not limited to any type, and may be a right angle, an acute angle, or an obtuse angle, or may even be roundish, for example. However, to prevent thermal stress from being concentrated, it is preferred that angles be roundish.

Also, the shape of the above horizontal cross sections may be oval, rectangular, triangular or the like.

The above circles, ovals and regular polygons have advantages since their shapes tend to be similar to the shape of the holes.

Figure 47B:
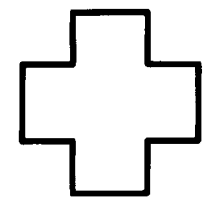
Figure 47C:
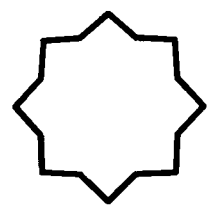

Alternatively, as shown in FIG. 47B or 47C, shapes such as a cross or a regular polygonal star formed by drawing straight lines to radiate out from the center (shapes in which multiple spokes are positioned in a radial pattern) are effective as the shape of the above horizontal cross sections.

Figure 48A:
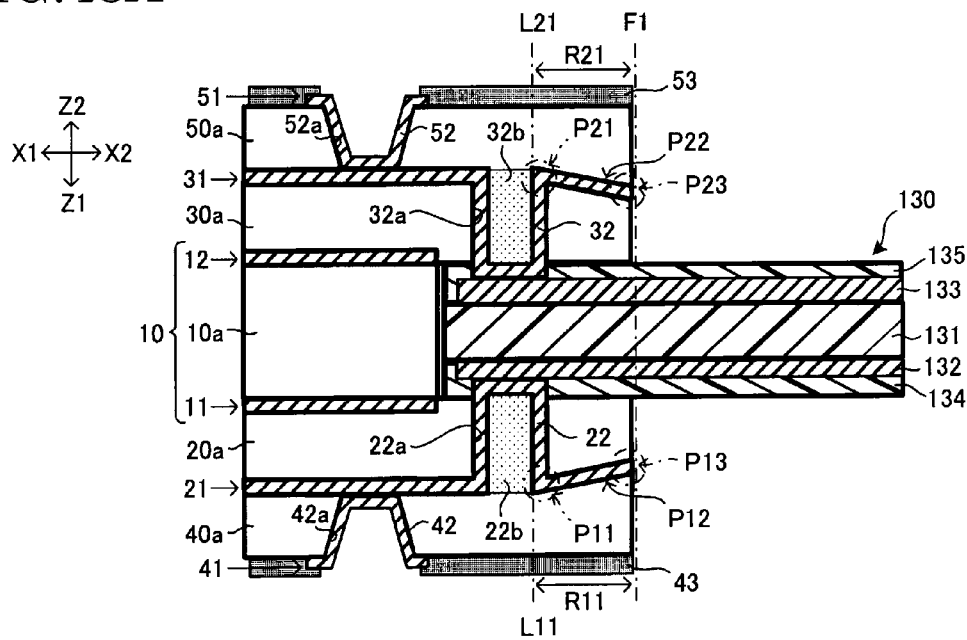
FIG. 48A is a view showing a first alternative example of vertical cross-sectional shapes of connection conductors in a core section.
Figure 48B:
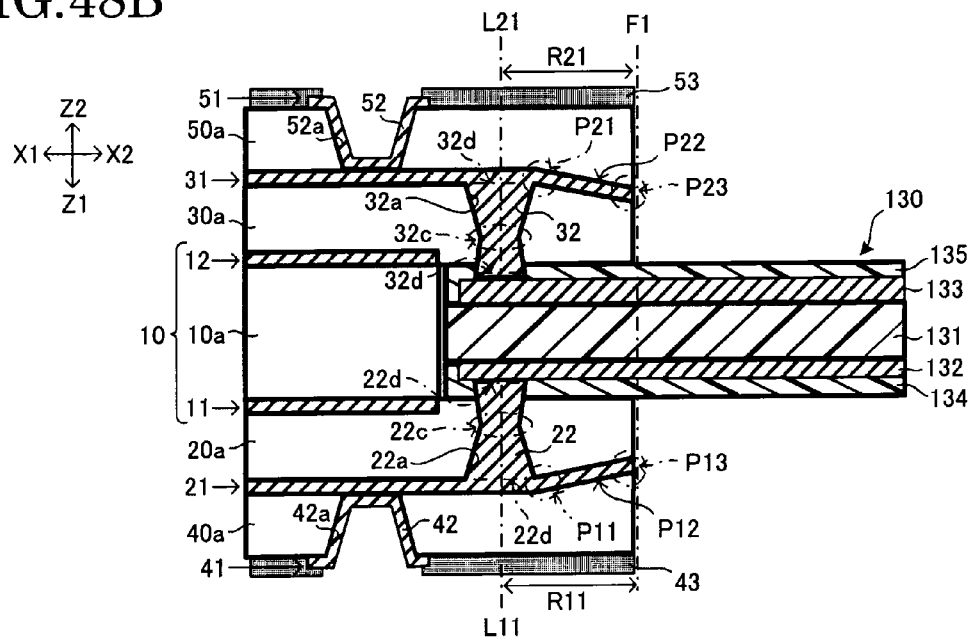
FIG. 48B is a view showing a second alternative example of vertical cross-sectional shapes of connection conductors in a core section.

The shape of vertical cross sections of connection conductors may be formed freely. For example, as shown in FIG. 48A, holes (22a, 32a) in which connection conductors (22, 32) are formed may be formed to be cylindrical. Alternatively, as shown in FIG. 48B, connection conductors (22, 32) may be formed to be of such a shape that the width of middle portions (22c, 32c), which are positioned substantially in the middle in a thickness direction, is smaller than the width of opening portions (22d, 32d) on the first surface and the second surface. If such a shape is employed, since the width of opening portions (22d, 32d) is greater than the width of middle portions (22c, 32c), it is thought that filling performance may be better during plating. As a result, it is thought that surface flatness features are enhanced. Also, in middle portions (22c, 32c), connection conductors (22, 32) have portions with the smallest cross-sectional area. Thus, it is thought that connection areas increase between insulation layers (20a, 30a) and connection conductors (22, 32). In addition, stresses concentrate on portions of connection conductors (22, 32) away from wiring layers (21, 31). Accordingly, it is thought that stresses from horizontal directions (directions X or directions Y) are dispersed, and that peeling in connection conductors (22, 32) due to stress concentration are suppressed. Also, as a result, it is thought that connection reliability increases.

Figure 49:
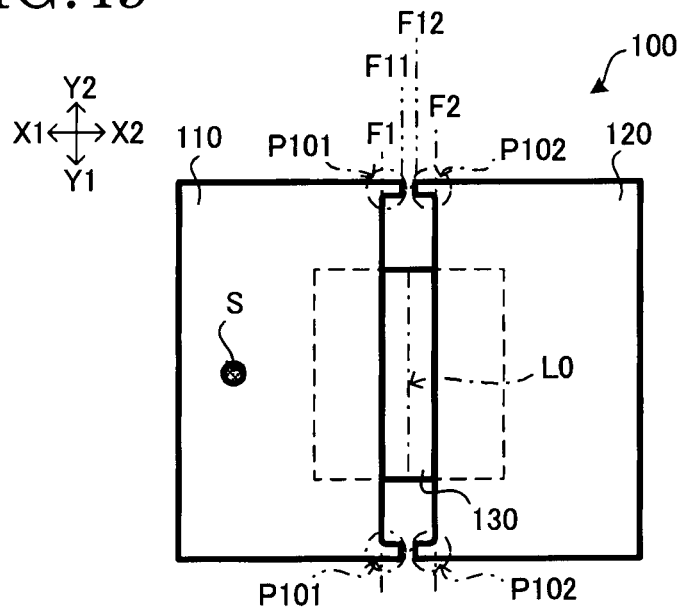
FIG. 49 is a view showing an example where rigid sections have protruding portions that protrude from their boundary surfaces with a flexible section.

As shown in FIG. 49, rigid sections (110, 120) may have protruding portions (P101, P102) that protrude from F-R boundary surfaces (F1, F2) positioned between flexible section (R100) and the rigid sections. In an example shown in FIG. 49, rigid section 110 has two protruding portions (P101), and rigid section 120 has two protruding portions (P102). Protruding portions (P101) are positioned on the Y1 side and Y2 side of flexible wiring board 130, and protrude toward the X2 side from F-R boundary surface (F1) between rigid section 110 and flexible section (R100). On the other hand, protruding portions (P102) are positioned on the Y1 side and Y2 side of flexible wiring board 130, and protrude toward the X1 side from F-R boundary surface (F2) between rigid section 120 and flexible section (R100). The planar shape of protruding portions (P101, P102) (the shape on the X-Y plane) is rectangular, for example. It is thought that excessive stress is prevented from occurring in the F-R connection sections by forming such protruding portions (P101, P102). Descriptions of such an effect are provided in the following with reference to FIG. 50.

It is thought that flex-rigid wiring board 100 may be folded in two at line (L0) in FIG. 49, for example, and accommodated in casing 5001 of a cell phone or the like. When being folded in two, curved portion (P103) is formed near line (L0) of flexible wiring board 130. In such a case, flex-rigid wiring board 100 may be pressed against casing 5001 due to vibrations or swinging.

Figure 50:
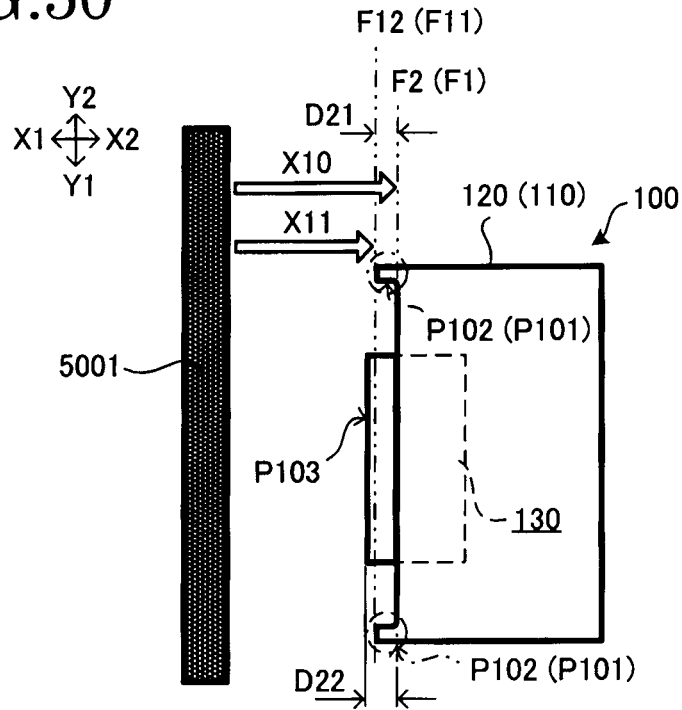
FIG. 50 is a view to illustrate the effects of the protruding portions shown in FIG. 49.

During such time, without protruding portions (P101, P102), casing 5001 may move freely until it touches F-R boundary surface (F1) or (F2) as indicated by arrow (X10) in FIG. 50. In such a situation, if force toward the X2 side is exerted on casing 5001 due to vibrations or the like, it is thought that curved portion (P103) of flexible wiring board 130 is pushed into the X2 side by casing 5001. Moreover, if curved portion (P103) of flexible wiring board 130 is further pushed into near F-R boundary surface (F1) or (F2), great force is generated at the F-R connection sections, and line breakage or the like becomes a concern.

By contrast, with protruding portions (P101, P102), as indicated by arrow (X11) in FIG. 50, the movement of casing

5001 is restricted by top surfaces (F11) of protruding portions (P101) or top surfaces (F12) of protruding portions (P102). Therefore, casing 5001 is push curved portion (P103) of flexible wiring board 130 any further. Accordingly, stress is seldom generated at the F-R connection sections. As a result, line breakage or the like is suppressed from occurring at the F-R connection sections.

Figure 51:
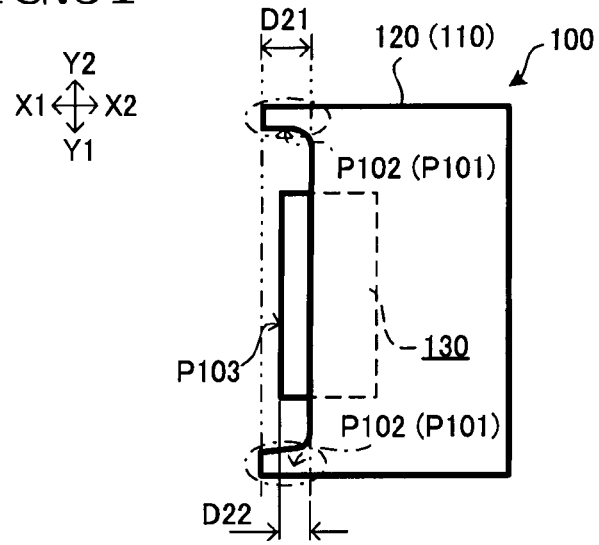
FIG. 51 is a view showing a first alternative example of the form of protruding portions.

The protruding amount (D21) of protruding portions (P101, P102) is approximately 1 mm, for example. The protruding amount (D22) of curved portion (P103) of flexible wiring board 130 is approximately 2-3 mm, for example. Namely, in such an example, (D22) is set greater than (D21) (D21<D22). However, the protruding amounts are not limited to such, and (D22) may be set smaller than (D21) (D22<D21) as shown in FIG. 51, for example. By so setting, it is difficult for casing 5001 to even touch curved portion (P103) of flexible wiring board 130.

Figure 52A:
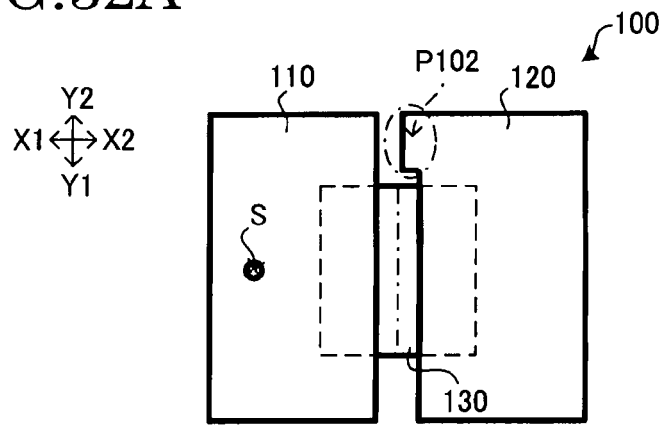
FIG. 52A is a view showing a second alternative example of the form of a protruding portion.
Figure 52B:
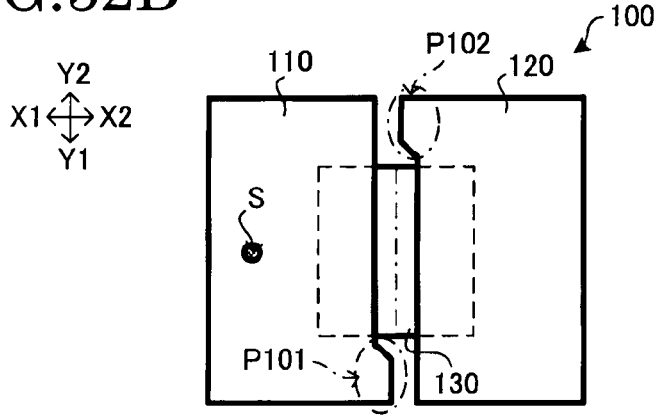
FIG. 52B is a view showing a third alternative example of the form of protruding portions.

The number, shape, positioning and so forth of protruding portions (P101, P102) are not limited specifically. For example, as shown in FIG. 52A, one protruding portion (P102) may be formed only in either rigid section 110 or 120; for example, only in rigid section 120. Alternatively, as shown in FIG. 52B, for example, the planar shape of protruding portions (P101, P102) may be trapezoidal. As in the example shown in FIG. 52B, protruding portion (P101) may be formed on the Y1 side of flexible wiring board 130, and protruding portion (P102) may be formed on the Y2 side of flexible wiring board 130.

Figure 53A:
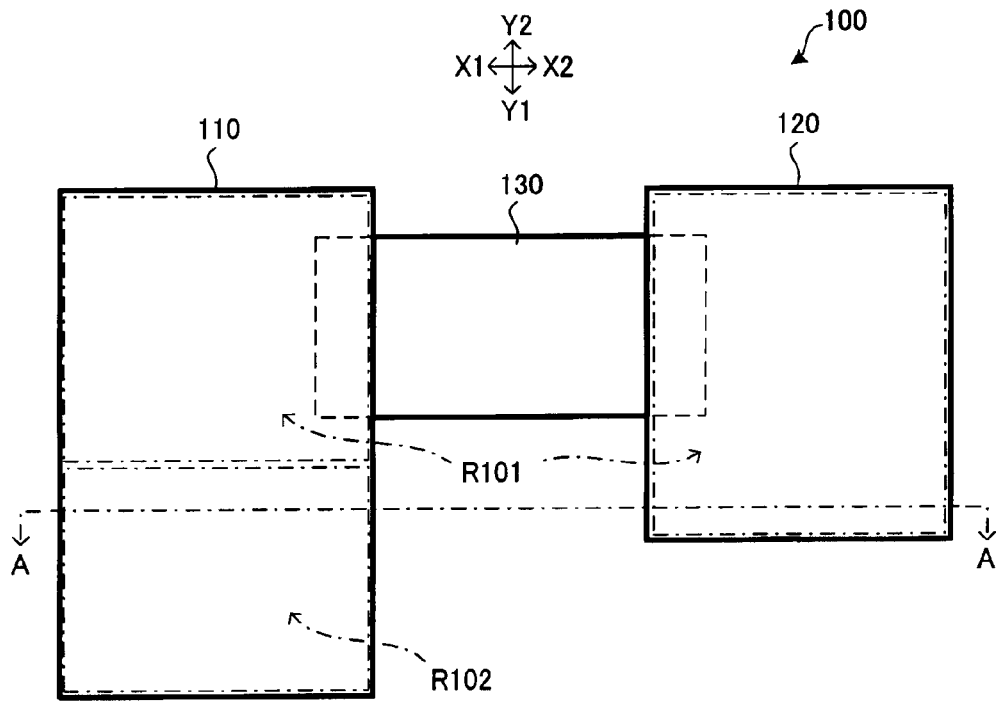
FIG. 53A is a view showing an example where a rigid section has multiple regions with a different number of layers from each other.
Figure 53B:
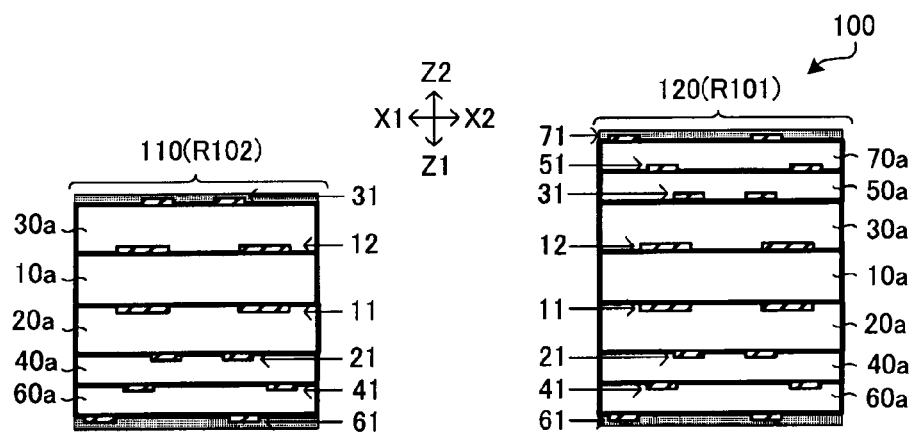
FIG. 53B is a cross-sectional view seen from the A-A line of FIG. 53A.

Rigid section 110 or 120 may contain multiple regions having a different number of layers from each other. For example, as shown in FIG. 53A and FIG. 53B (cross-sectional view seen from the (A-A) line in FIG. 53A), rigid section 110 may have nine-layered region (R101) and six-layered region (R102). Region (R102) having fewer layers than region (R101) may be formed by masking or the like so that more than a predetermined number of layers are not laminated. However, forming methods are not limited to the above, and the number of layers may be adjusted by removing the unnecessary layers after they are laminated.

Figure 54A:
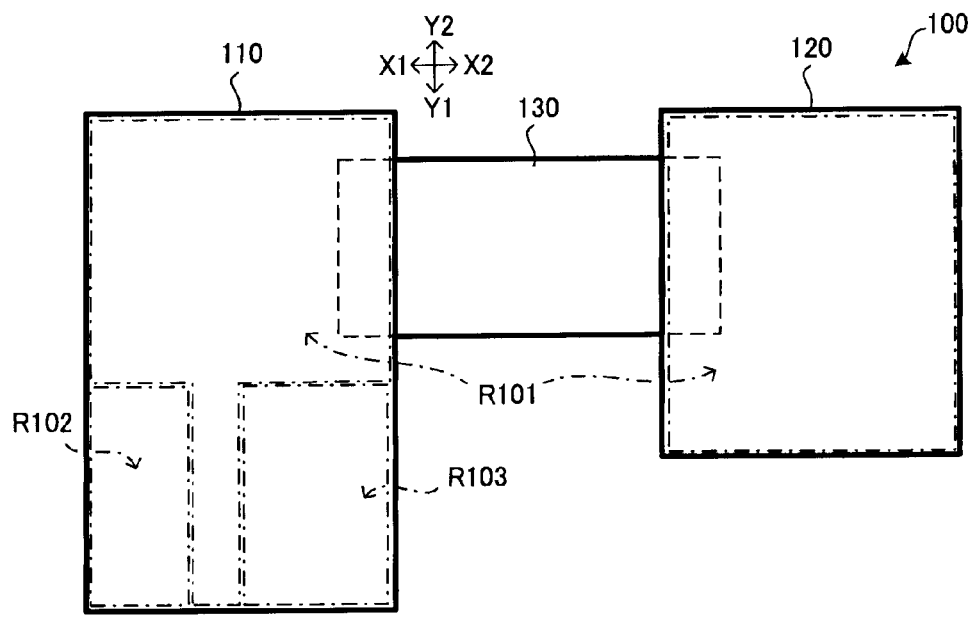
FIG. 54A is a view showing an example where a rigid section has three regions with a different number of layers from each other.

At least either rigid section 110 or 120 may contain three or more regions having a different number of layers from each other. For example, as shown in FIG. 54A, rigid section 110 may contain three regions (R101-R103) having a different number of layers from each other.

Figure 54B:
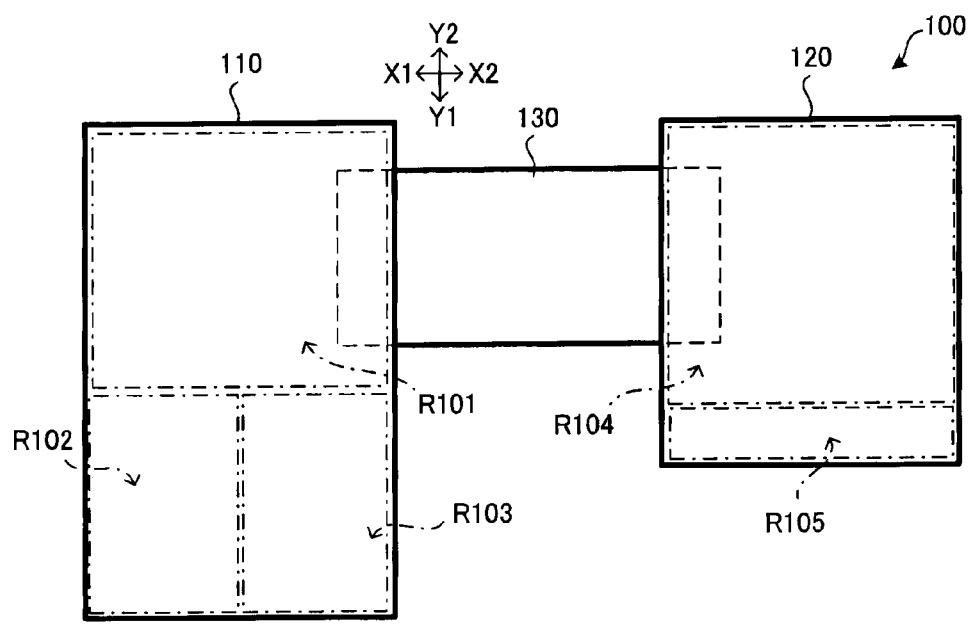
FIG. 54B is a view showing an example where two rigid sections each have multiple regions with a different number of layers from each other.

Both rigid sections 110 and 120 may contain multiple regions having a different number of layers from each other. For example, as shown in FIG. 54B, rigid section 110 may contain three regions (R101-R103) having a different number of layers from each other, and rigid section 120 may contain two regions (R104, R105) having a different number of layers from each other.

In FIGS. 53A-54B, regions (R101-R105) each have a different number of layers from the other regions. If regions (R101-R105) are listed in order of the region with the most layers to the region with the fewest layers, the order is, for example, region (R101), region (R102), region (R103), region (R104) and region (R105) (region (R101)>region (R102)>region (R103)>region (R104)>region (R105)).

The number of flexible wiring boards 130 is not limited specifically. For example, to enhance the bendability of flexible section (R100), as shown in FIG. 55 or FIG. 56, it is effective to position multiple flexible wiring boards so that they are detached from each other in a lamination direction (direction Z) of insulation layers (10a, 20a, 30a).

Figure 55:
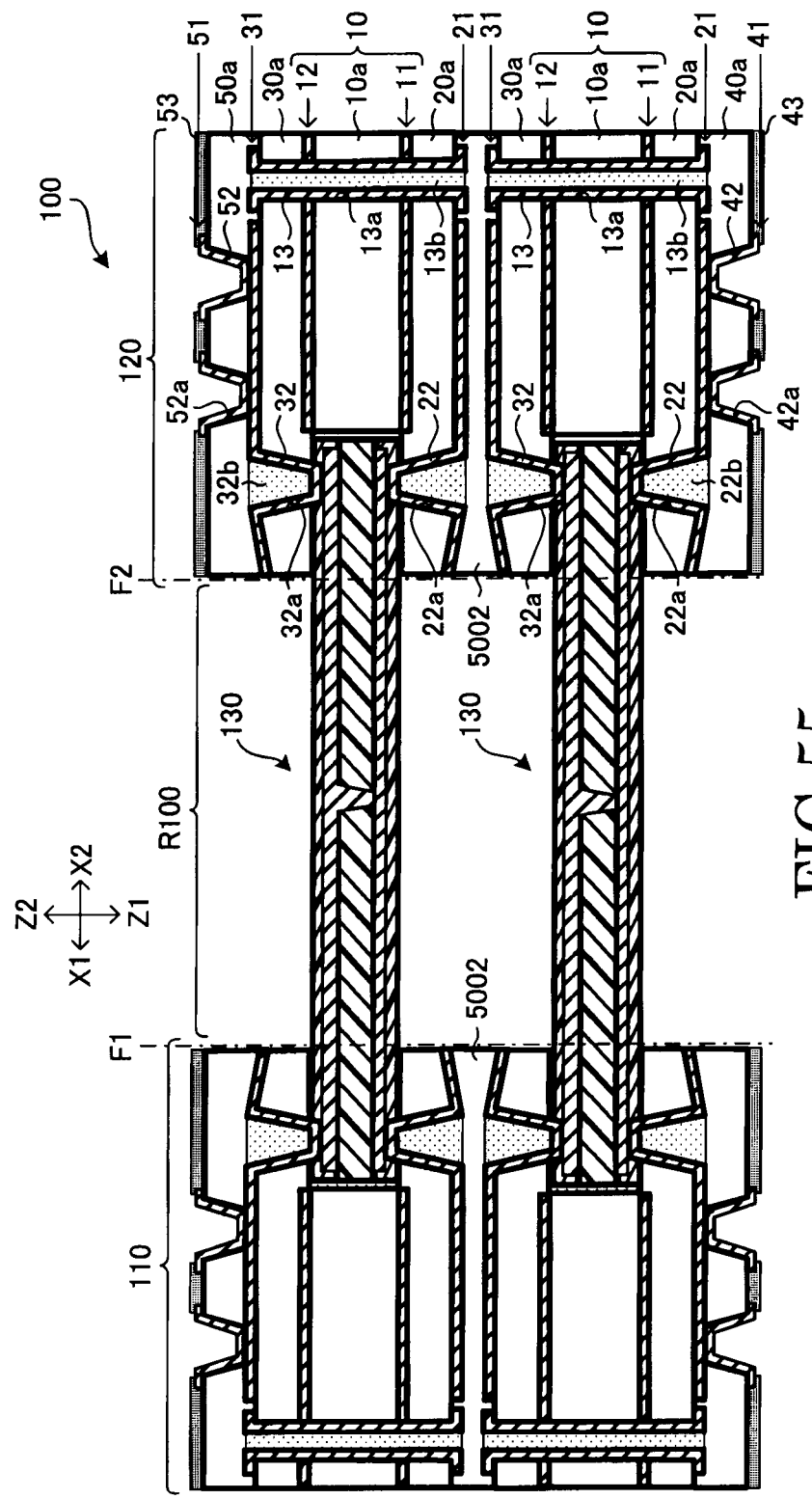
FIG. 55 is a view showing an example of a flex-rigid wiring board having two sets of core sections connected to the flexible wiring boards.

In an example shown in FIG. 55, flex-rigid wiring board 100 has two sets of core sections (substrate 10 and insulation layers (20a, 30a) and the like on both of its sides) which are connected to flexible wiring boards 130. The two sets of core sections are connected by means of connection layers 5002. Then, multiple flexible wiring boards 130 are positioned so as to be detached from each other in lamination directions (directions Z). The material for connection layers 5002 is, for example, the same as the above-described interlayer insulation layers (insulation layers (40a) and the like). Connection layers 5002 are formed by curing prepreg, for example.

Figure 56:
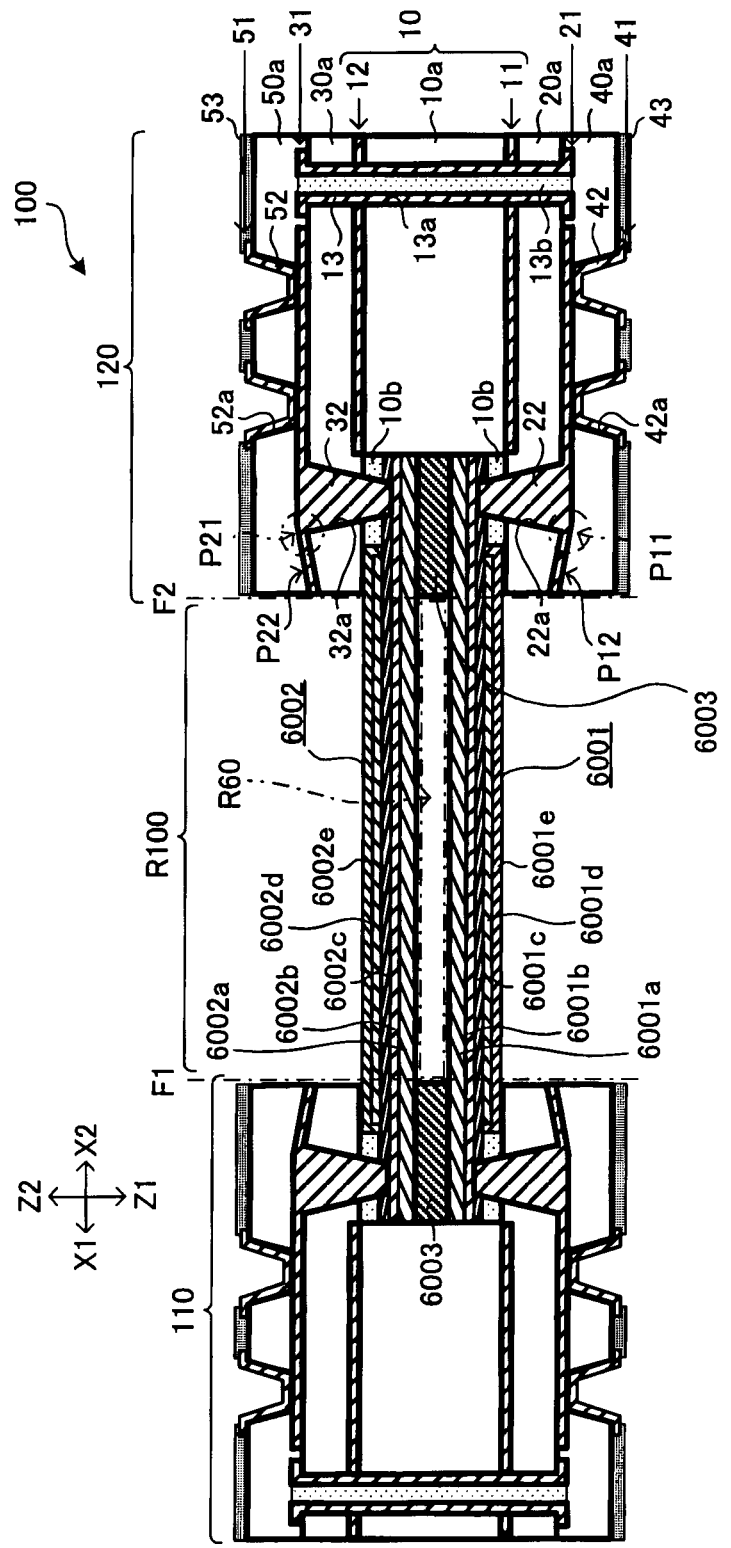
FIG. 56 is a view showing an example of a flex-rigid wiring board having two single-sided flexible wiring boards.

Alternatively, as shown in FIG. 56, for example, flex-rigid wiring board 100 may have two single-sided flexible wiring boards: flexible wiring board 6001 and flexible wiring board 6002. Flexible wiring board 6001 has flexible substrate (6001a), wiring layer (6001b), inner coverlay (6001c), shield layer (6001d) and outer coverlay (6001e). Shield layer (6001d) is formed over wiring layer (6001b). Therefore, electromagnetic noise or the like is blocked from reaching wiring layer (6001b) by shield layer (6001d). On the other hand, flexible wiring board 6002 has flexible substrate (6002a), wiring layer (6002b), inner coverlay (6002c), shield layer (6002d) and outer coverlay (6002e). Shield layer (6002d) is formed over wiring layer (6002b). Therefore, electromagnetic noise or the like is blocked from reaching wiring layer (6002b) by shield layer (6002d). The material or the like for each member is the same for flexible wiring board 130 as shown in FIG. 3, for example.

In an example shown in FIG. 56, flexible wiring board 6001 has wiring layer (6001b) on the first-surface side, and flexible wiring board 6002 has wiring layer (6002b) on the second-surface side. Then, the second-surface side of flexible wiring board 6001 and the first-surface side of flexible wiring board 6002 are physically connected by bonding sheet 6003. Space (R60) sealed by bonding sheet 6003 is formed between flexible wiring board 6001 and flexible wiring board 6002. Space (R60) is formed to be a rectangular cuboid, for example. However, the shape, number, positioning and the like of space (R60) are not limited to the above and any other type may be employed (see later-described FIGS. 61A-61C).

Wiring layer 21 is electrically connected to a conductive pattern (wiring layer 6001b) on the first-surface side of flexible wiring board 6001 by means of connection conductor 22 in insulation layer (20a). Wiring layer 31 is electrically connected to a conductive pattern (wiring layer 6002b) on the second-surface side of flexible wiring board 6002 by means of connection conductor 32 in insulation layer (30a). Connection conductors (22, 32) are conductors which are filled in holes (22a, 32a) formed in insulation layers (20a, 30a), namely, filled conductors. When connection conductors (22, 32) are formed to be filled conductors, it is thought that conductive patterns (wiring layers 6001b, 6002b) in flexible wiring boards (6001, 6002) and conductive patterns (wiring layers 21, 31) in rigid sections (110, 120) are connected even more firmly.

In the following, a method for manufacturing flex-rigid wiring board 100 shown in FIG. 56 is described. First, two examples are shown regarding a method for connecting flexible wiring board 6001 and flexible wiring board 6002.

Figure 57A:
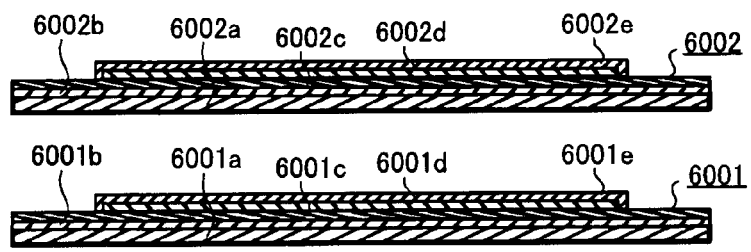
FIG. 57A is a view to illustrate a first step of a first method for connecting two single-sided flexible wiring boards.

In the first example, flexible wiring boards 6001 and 6002 are prepared as shown in FIG. 57A. Such flexible wiring boards 6001 and 6002 may be manufactured by steps that correspond to those shown in FIGS. 10A-10E, for example.

Figure 57B:
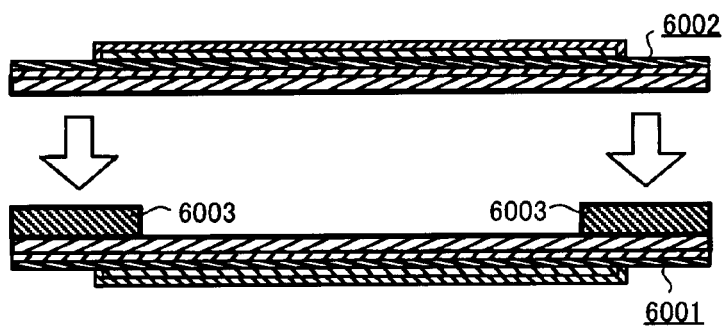
FIG. 57B is a view to illustrate a second step subsequent to the step in FIG. 57A.

Next, as shown in FIG. 57B, flexible wiring board 6001 and flexible wiring board 6002 are connected by means of bonding sheet 6003. In bonding sheet 6003, a hole corresponding to the shape of space (R60) is formed in advance.

Figure 58A:
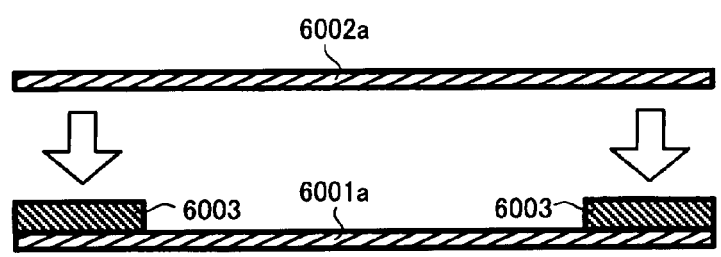
FIG. 58A is a view to illustrate a first step of a second method for connecting two single-sided flexible wiring boards.
Figure 58B:
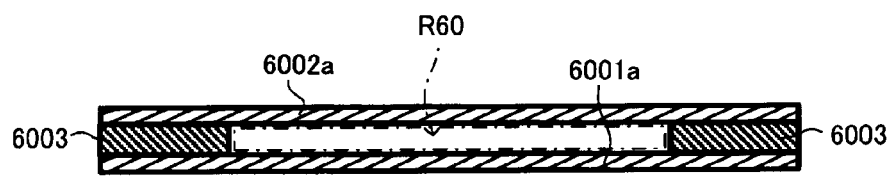
FIG. 58B is a view to illustrate a second step subsequent to the step in FIG. 58A.

On the other hand, in the second example, as shown in FIG. 58A, flexible substrates (6001a, 6002a) and bonding sheet 6003 are prepared, and flexible substrate (6001a) and flexible substrate (6002*a*) are connected by means of bonding sheet 6003 as shown in FIG. 58B. Then, flexible wiring boards 6001 and 6002 are manufactured by steps that correspond to those shown in FIGS. 10A-10E, for example.

Figure 59A:
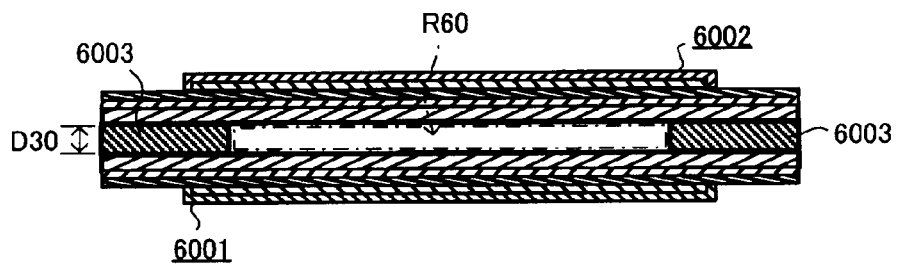
FIG. 59A is a view showing an example of a connected body of two single-sided flexible wiring boards.

A connected body of flexible wiring board 6001 and flexible wiring board 6002 may be manufactured as shown in FIG. 59A by taking either the above first example or the second example. Then, steps that correspond to those shown in FIGS. 11-22, for example, are conducted. In doing so, at both end portions of flexible wiring boards (6001, 6002), connection conductor 14 is connected to wiring layer (6001*b*), and connection conductor 34 is connected to wiring layer (6002*b*). Also, built-up sections, flexible section (R100) and the like are formed. As a result, flex-rigid wiring board 100 is completed as shown in FIG. 56.

It is thought that the bendability of flexible section (R100) is improved by positioning space (R60) between flexible wiring board 6001 and flexible wiring board 6002. Moreover, flexible section (R100) in an example shown in FIG. 56 is structured with two single-sided wiring boards (flexible wiring boards 6001 and 6002). Thus, flexible section (R100) is thinner than an example in which double-sided wiring boards are connected. As a result, it is thought that the bendability of flexible section (R100) is improved.

To improve bendability, height (D30) of space (R60) is preferred to be set at 2 mm or less. Height (D30) of space (R60) corresponds to the thickness of bonding sheet 6003.

Figure 59B:
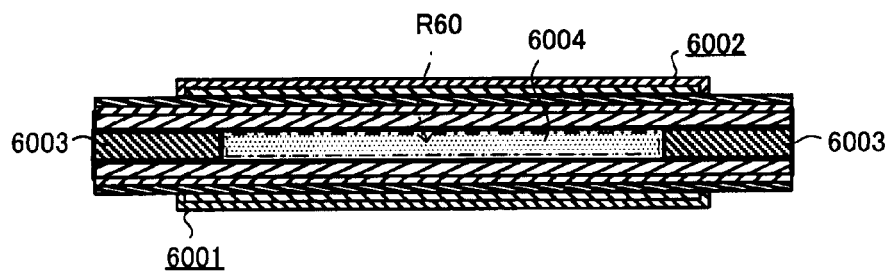
FIG. 59B is a view showing an example where filler is filled in a space arranged between two flexible wiring boards.

Gas such as air may be sealed in space (R60). However, when a heat cycle occurs during the manufacturing steps or the like, there is a concern that the quality of flex-rigid wiring board 100 deteriorates due to the repeated expansion/contraction of the gas in space (R60). Therefore, it is preferred that the gas in space (R60) be eliminated through decompression, for example. Alternatively, as shown in FIG. 59B, by filling filler 6004 (such as gel) in space (R60), the gas in space (R60) may be eliminated.

Figure 60:
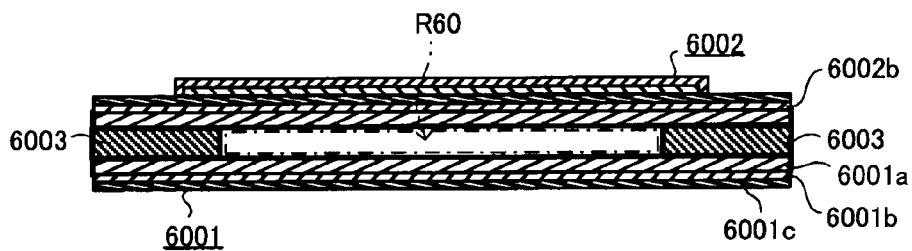
FIG. 60 is a view showing an example where the conductive pattern on either one of two flexible wiring boards is made to be a full plane conductive pattern.

A conductive pattern of either flexible wiring board 6001 or 6002, for example, wiring layer (6001*b*) of flexible wiring board 6001, may be formed as a full plane conductive pattern (such as a full plane copper pattern) as shown in FIG. 60, for example, and shield layer (6001*d*) and outer coverlay (6001*e*) may be omitted. In doing so, the flexible section becomes even thinner, and it is thought that the bendability of flexible section (R100) is further improved.

When a wiring pattern is formed only on one surface in a manufacturing method shown in FIGS. 58A, 58B), conductive layers are formed on both surfaces and then the conductive layer that becomes wiring layer (6001*b*) is masked entirely using resist, and the conductive layer that becomes wiring layer (6002*b*) is patterned using a lithographic technique, for example. Accordingly, wiring layer (6002*b*) is formed as a wiring pattern and wiring layer (6001*b*) may be formed as a full plane conductive pattern.

Figure 61A:
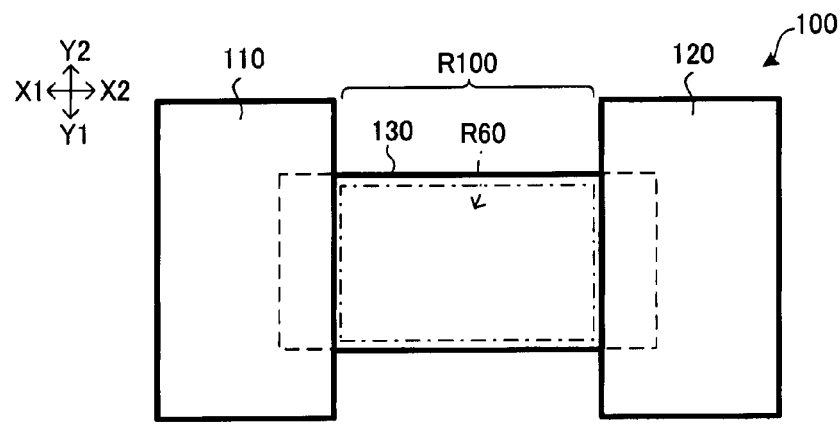
FIG. 61A is a view showing an example of the positioning of a space arranged between two flexible wiring boards.
Figure 61B:
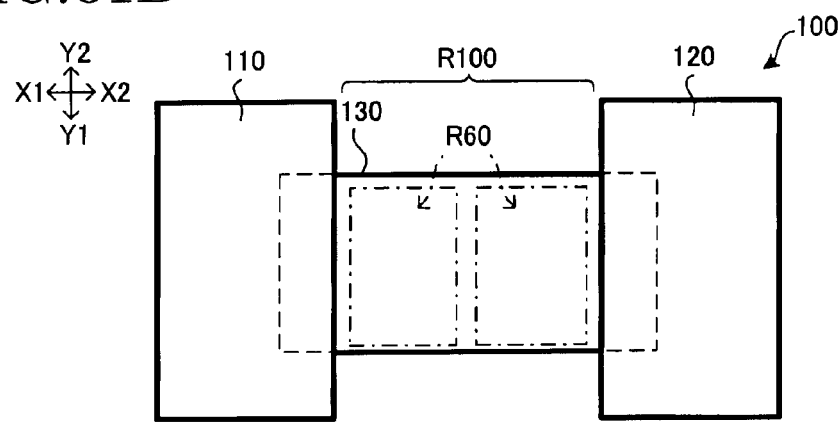
FIG. 61B is a view showing a first alternative example where the number of spaces arranged between two flexible wiring boards is modified.
Figure 61C:
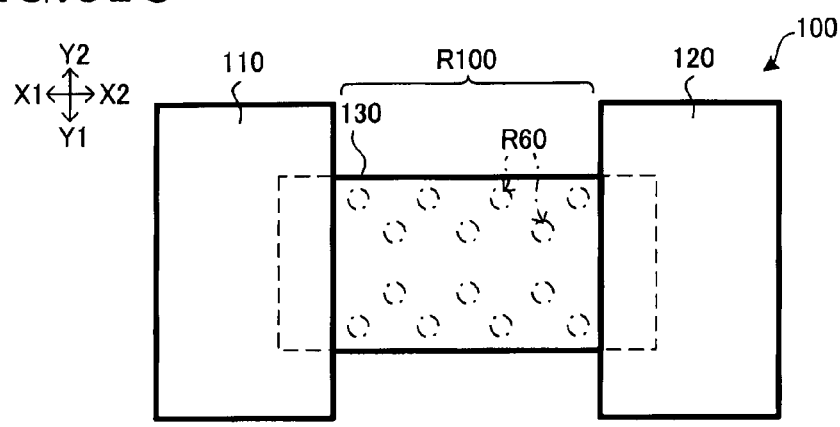
FIG. 61C is a view showing a second alternative example where the number of spaces arranged between two flexible wiring boards is modified.

It is preferred that space (R60) be positioned to extend entirely throughout flexible section (R100) as shown in FIG. 61A, for example. However, space (R60) is not limited to such, and may be positioned by being concentrated in required portions based on stress analysis or the like. The number of spaces (R60) is not limited to one, and multiple spaces (R60) may be formed. Namely, as shown in FIG. 61B, for example, two spaces (R60) may be formed, and as shown in FIG. 61C, for example, multiple spaces (R60) may also be formed. The shape of space (R60) is not limited to being a rectangular cuboid, and may be cylindrical as shown in FIG. 61C, for example. Basically, any shape, number, positioning and so forth may be employed for space (R60).

Figure 62:
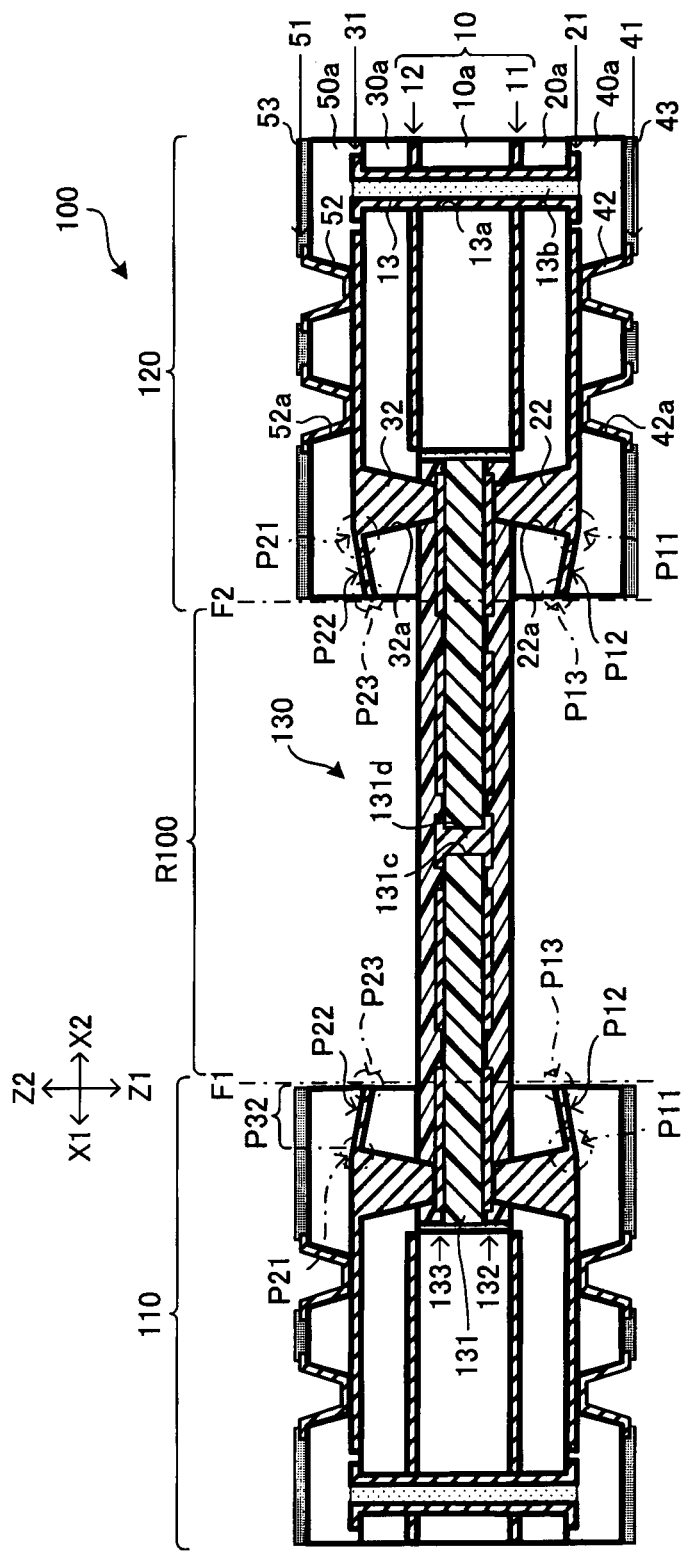
FIG. 62 is a view showing an example of a flex-rigid wiring board having a flexible wiring board where a through hole is formed in a flexible substrate.

As shown in FIG. 62, through hole (131*c*) may be formed in flexible substrate 131. Through hole (131*c*) penetrates through flexible substrate 131. In addition, through hole (13*a*) is formed to penetrate through insulation layers (20*a*, 10*a*, 30*a*). The conductive pattern (wiring layer 21) formed on insulation layer (20*a*) and the conductive pattern (wiring layer 31) formed on insulation layer (30*a*) are connected by means of the conductor (connection conductor 13) in through hole (13*a*). Using such a structure, wiring layer 21 and wiring layer 31 in rigid section (110, 120) may be electrically connected without going through flexible wiring board 130.

Wiring layer 21 is electrically connected to wiring layer 132 by means of connection conductor 22 in insulation layer (20*a*). Connection conductor 22 is a conductor which is filled in hole (22*a*) formed in insulation layer (20*a*), namely a filled conductor. Wiring layer 31 is electrically connected to wiring layer 133 (second conductor) by means of connection conductor 32 in insulation layer (30*a*). Connection conductor 32 is a conductor which is filled in hole (32*a*) formed in insulation layer (30*a*), namely a filled conductor. When connection conductors (22, 32) are formed to be filled conductors, it is thought that conductive patterns (wiring layers 132, 133) in flexible wiring board 130 and conductive patterns (wiring layers 21, 31) in rigid sections (110, 120) are connected even more firmly.

Figure 63A:
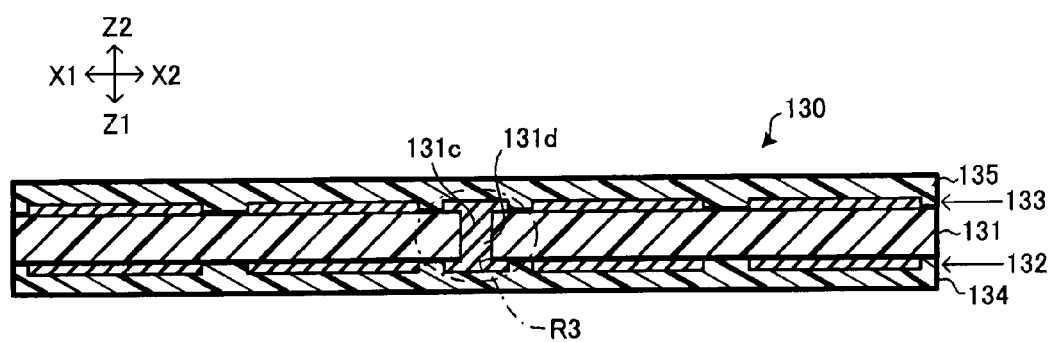
FIG. 63A is a magnified view of the flexible wiring board in the flex-rigid wiring board shown in FIG. 62.

A magnified view of flexible wiring board 130 is shown in FIG. 63A. In addition, a magnified view of region (R3) in FIG. 63A is shown in FIG. 63B.

Figure 63B:
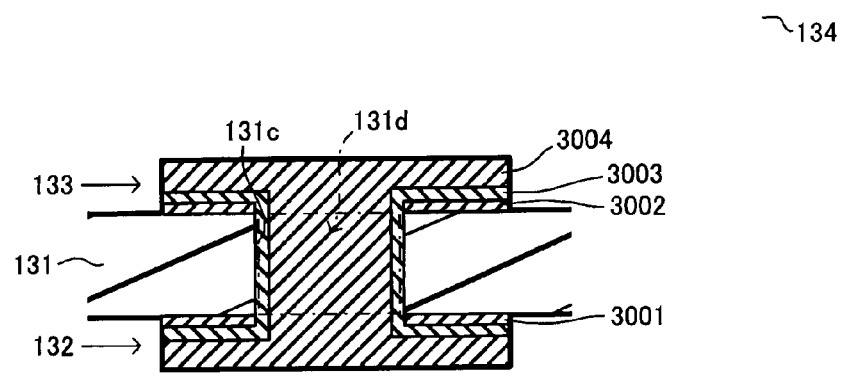
FIG. 63B is a magnified view showing part of a region in FIG. 63A.

In an example in FIG. 63B, conductor (131*d*) is filled in through hole (131*c*). A surface treatment such as an oxidation/reduction or the like, for example, is applied on the wall surface of through hole (131*c*). Through such a surface treatment, it is thought that the connection area increases between through hole (131*c*) and conductor (131*d*) and that their connection reliability is improved. Wiring layer 132 (first conductor) formed on the first-surface side of flexible substrate 131 and wiring layer 133 (second conductor) formed on the second-surface side of flexible substrate 131 are electrically connected by means of the conductor (conductor 131*d*) in through hole (131*c*) formed in flexible substrate 131.

On the first surface and the second surface of flexible substrate 131, copper foils 3001 or 3002, electroless plating 3003 and electrolytic plating 3004 are laminated respectively in that order from a lower layer toward an upper layer. By doing so, wiring layer 132 becomes a triple-layer conductive layer with copper foil 3001, electroless plating 3003 and electrolytic plating 3004. Also, wiring layer 133 becomes a triple-layer conductive layer with copper foil 3002, electroless plating 3003 and electrolytic plating 3004. When such a triple-layer structure is employed, copper foils (3001, 3002) and flexible substrate 131 are adhered, and then electroless plating 3003 and electrolytic plating 3004 are laminated on copper foils (3001, 3002). Accordingly, it is thought that flexible substrate 131 and wiring layers (132, 133) on both of its surfaces are adhered firmly.

Conductor (131*d*) is formed with electroless plating 3003 and electrolytic plating 3004. Flexible substrate 131 is made of polyimide, for example. Wiring layers (132, 133), electroless plating 3003 and electrolytic plating 3004 are made of copper, for example.

Wiring layer 132, conductor (131*d*) in through hole (131*c*) and wiring layer 133 are formed to be contiguous from the first-surface side of flexible substrate 131 toward the second-surface side. Wiring layer 132 and wiring layer 133 are connected by a junction conductor (131*d*). Accordingly, a cylinder (conductor 131*d*) which connects wiring layer 132 and wiring layer 133 is formed in flexible substrate 131. It is thought that wiring layers (132, 133) are secured through the pinning effect of the cylinder and that stability is enhanced in wiring layers (132, 133) formed on the upper and lower surfaces of flexible substrate 131, which has flexibility. In addition, as a result, it is also thought that the positioning stability of the F-R connection sections is improved, leading to enhanced connection reliability.

Figure 64A:
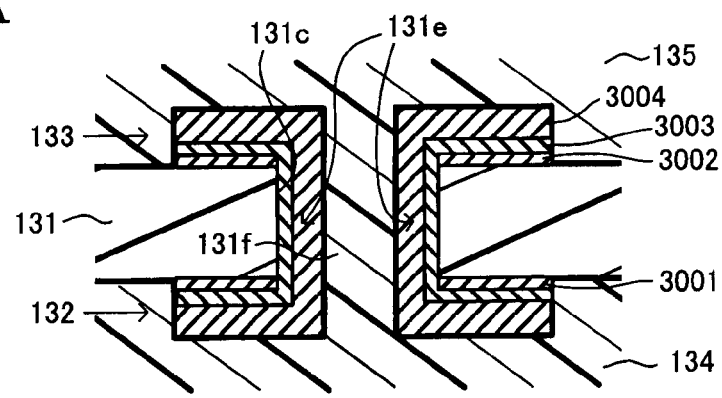
FIG. 64A is a view showing an example where the conductor in a through hole formed in a flexible substrate is set to be a conformal conductor.

As shown in FIG. 64A, a conformal conductor (conductor 131*e*) may be used instead of a connection conductor (conductor 131*d*) to obtain the same structure as above. In an example in FIG. 64A, conductor (131*e*) is formed on the wall surface of through hole (131*c*). Conductor (131*e*) is formed with electroless plating 3003 and electrolytic plating 3004. In such a case, resin (131*f*), for example, is filled inside conductor (131*e*). Resin (131*f*) is filled by the material of inner coverlay 134 or 135 flowing into through hole (131*c*), for example.

Figure 64B:
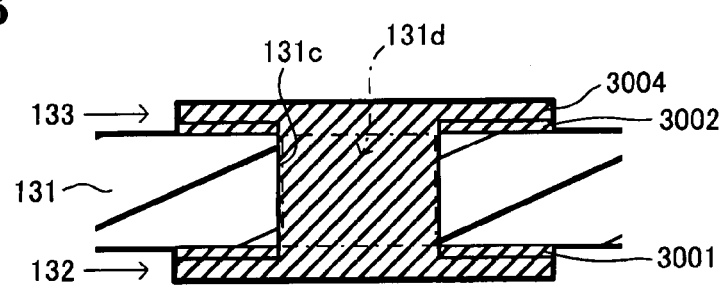
FIG. 64B is a view showing an example where the conductor in a through hole formed in a flexible substrate is made only of electrolytic plating.

If adhesiveness is achieved between electrolytic plating 3004 and flexible substrate 131, electroless plating 3003 may be omitted as shown in FIG. 64B. Alternatively, unless required, copper foils (3001, 3002) may be omitted as well.

Figure 65:
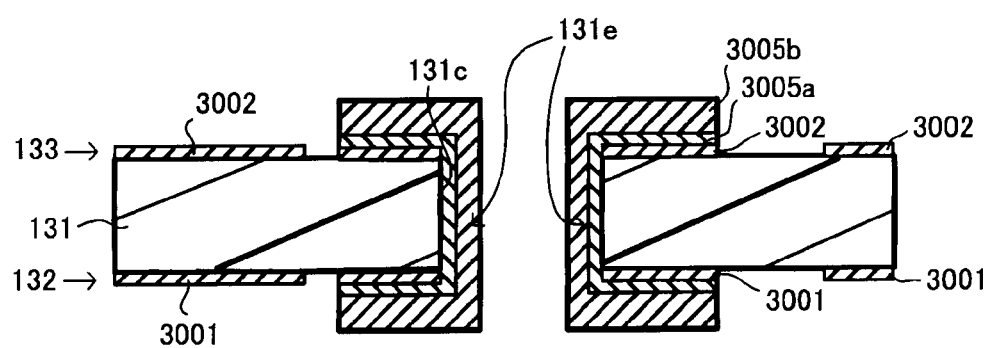
FIG. 65 is a view showing an example where wiring layers are partially set to have a triple-layer structure.

To enhance adhesiveness of wiring layer 132 or 133, entire wiring layer 132 or 133 is preferred to have the above-described triple-layer structure with copper foil 3001 or 3002, electroless plating 3003 and electrolytic plating 3004, as described previously. However, wiring layer 132 or 133 is not limited to being such; for example, as shown in FIG. 65, only part of wiring layer 132 or 133 has the above triple-layer structure. In an example in FIG. 65, wiring layers (132, 133) are formed to be triple-layer conductive layers with copper foil 3001 or 3002, electroless plating (3005*a*) and electrolytic plating (3005*b*) near through hole (131*c*). In other portions, wiring layers (132, 133) are formed to be single layered with copper foil 3001 or 3002 respectively.

Figure 66A:
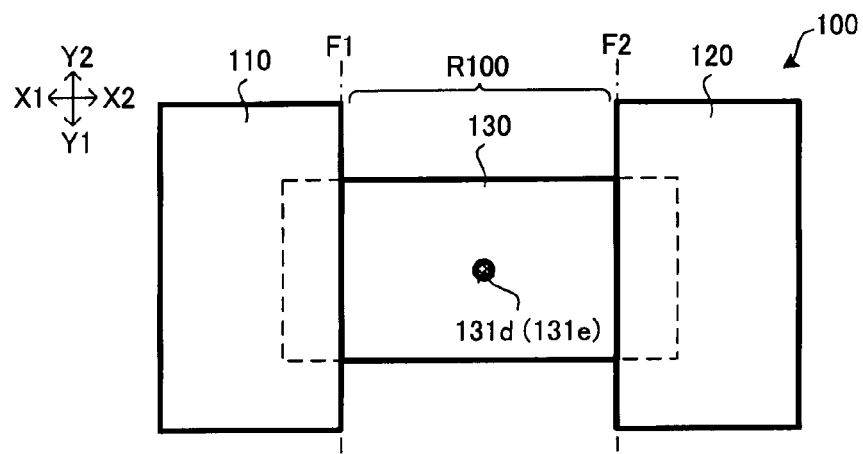
FIG. 66A is a view showing a first example of the position of a through hole formed in a flexible substrate.
Figure 66B:
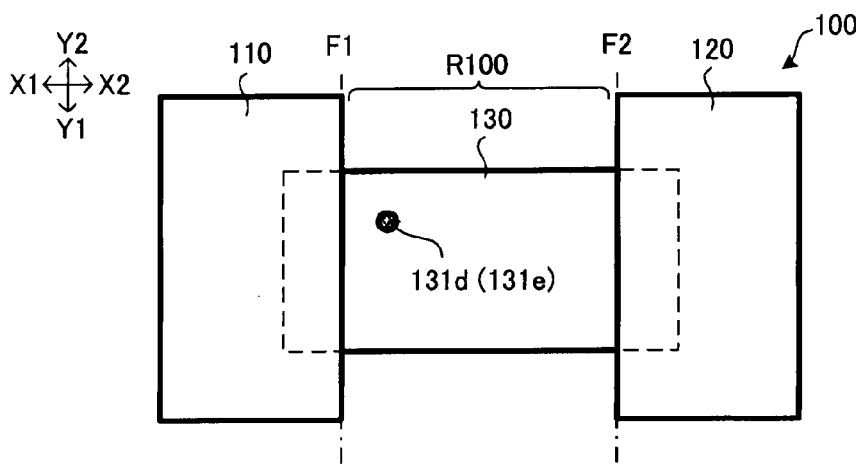
FIG. 66B is a view showing a second example of the position of a through hole formed in a flexible substrate.

Conductor (131*d*) or (131*e*) is preferred to be positioned midway between rigid section 110 and rigid section 120 as shown in FIG. 66A, for example. However, as shown in FIG. 66B, it may be positioned closer to either rigid section 110 or 120. Conductor (131*d*) or (131*e*) is preferred to be positioned in flexible section (R100) as shown in FIGS. 66A and 66B. However, conductor (131*d*) or (131*e*) is not limited to being positioned as such, and may be positioned in rigid section 110 beside F-R boundary surface (F1) or in rigid section 120 beside F-R boundary surface (F2).

Figure 67:
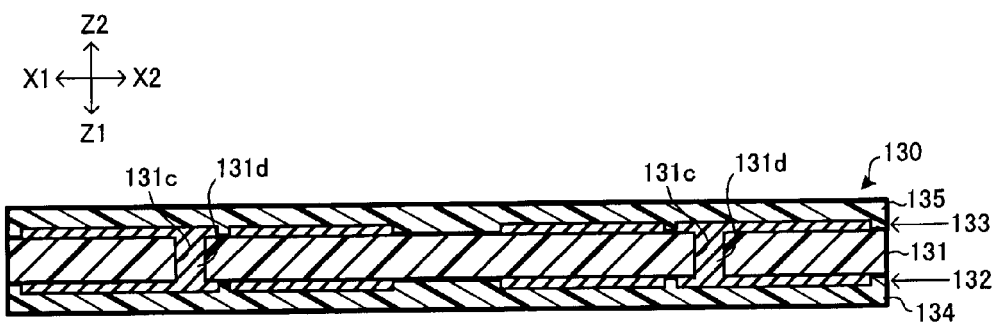
FIG. 67 is a view showing an example where the number of conductors in through holes formed in a flexible substrate is more than one.

The number of conductors (131*d*) or (131*e*) is not limited specifically. For example, as shown in FIG. 67, flexible wiring board 130 may contain multiple (such as two) conductors (131*d*). In addition, flexible wiring board 130 may also contain multiple (such as two) conductors (131*e*).

Figure 68:
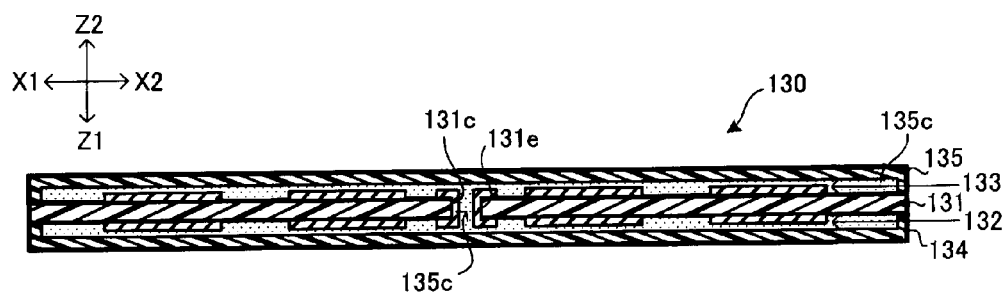
FIG. 68 is a view showing an example where the adhesive forming a coverlay is filled in a through hole formed in a flexible substrate.

As shown in FIG. 68, inner coverlays (134, 135) may be adhered to flexible substrate 131 by using adhesive agent (135*c*). In such a case, it is preferred that adhesive agent (135*c*) be filled in through hole (131*c*) when inner coverlays (134, 135) are adhered. By doing so, it is thought that another step to fill resin in through hole (131*c*) is omitted and that the procedure is simplified.

In the following, a method for manufacturing flexible wiring board 130 shown in FIGS. 62-63B is described.

Figure 69A:
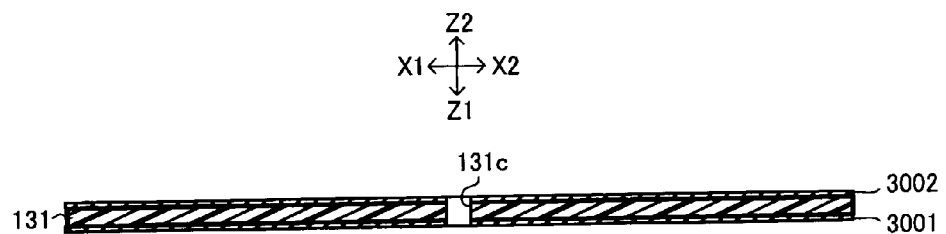
FIG. 69A is a view to illustrate a first step of a method for manufacturing a flexible wiring board shown in FIGS. 62-63B.

First, a double-sided copper-clad laminate (starting material) is prepared by the same step as that previously described in FIG. 10A. Then, through hole (131*c*) is formed in the double-sided copper-clad laminate by a laser, for example, as shown in FIG. 69A.

Figure 69B:
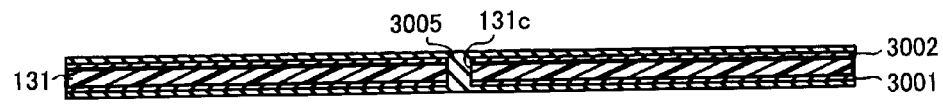
FIG. 69B is a view to illustrate a second step subsequent to the step in FIG. 69A.

Next, as shown in FIG. 69B, plating 3005 is formed by copper panel plating, for example. Specifically, electroless plating and electrolytic plating are performed in that order to form plating 3005 made of electroless plating 3003 and electrolytic plating 3004 (see FIG. 63B). During that time, surface treatment or the like may be conducted if required, to enhance the adhesiveness of plating.

When manufacturing flexible wiring board 130 as shown in FIG. 64A, plating 3005 is formed only on the wall surface of through hole (131*c*) by electroless plating and electrolytic plating. Also, when manufacturing flexible wiring board 130 as shown in FIG. 64B, plating 3005 made of electrolytic plating 3004 is formed by electrolytic plating.

Figure 69C:
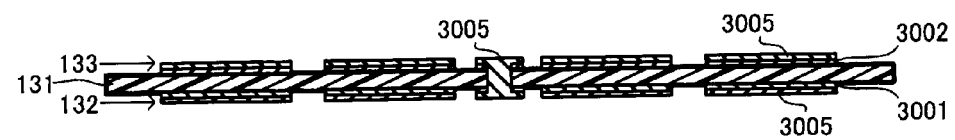
FIG. 69C is a view to illustrate a third step subsequent to the step in FIG. 69B.

Next, as shown in FIG. 69C, the conductive layers on both surfaces of flexible substrate 131 are patterned by a lithographic technique, for example. By doing so, wiring layers (132, 133) are formed.

Then, inner coverlays (134, 135) are formed by the same step as that previously described in FIG. 10C. Accordingly, flexible wiring board 130 is completed.

Basically, flexible wiring board 130 may be formed freely. For example, as shown in FIGS. 70A-70C, the width of flexible wiring board 130 may be partially enlarged.

Figure 70A:
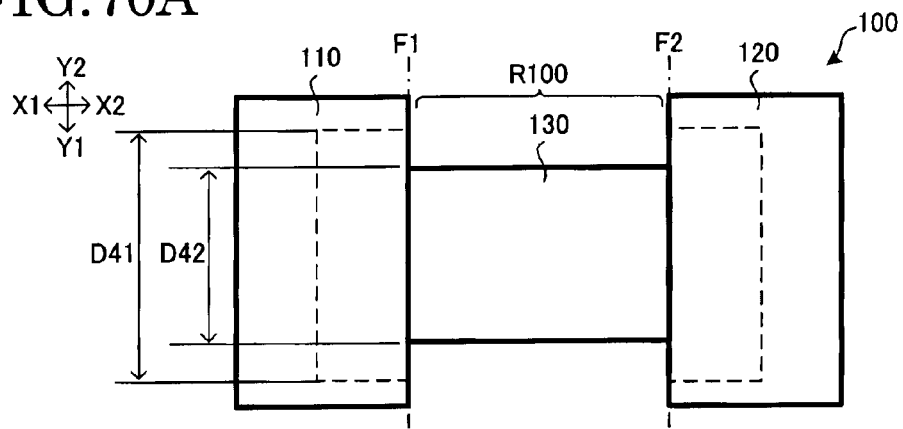
FIG. 70A is a view showing a first example where the width of a flexible wiring board is partially enlarged.

In an example shown in FIG. 70A, when flexible wiring board 130 is divided into two regions at the boundary (F-R boundary surface F1 or F2) between rigid section 110 or 120 and flexible section (R100), width (D41) of the region in rigid section 110 or 120 (the portion where flexible wiring board 130 is inserted into rigid section 110 or 120) is set greater than width (D42) of the region in flexible section (R100) (D41>D42). Accordingly, the connection area increases between flexible wiring board 130 and rigid section 110 or 120. As a result, connection reliability is enhanced in the F-R connection sections. If width (D41) or (D42) is not constant (for example, see FIGS. 70B and 70C), which width is greater may be determined by a comparison of their average values.

Figure 70B:
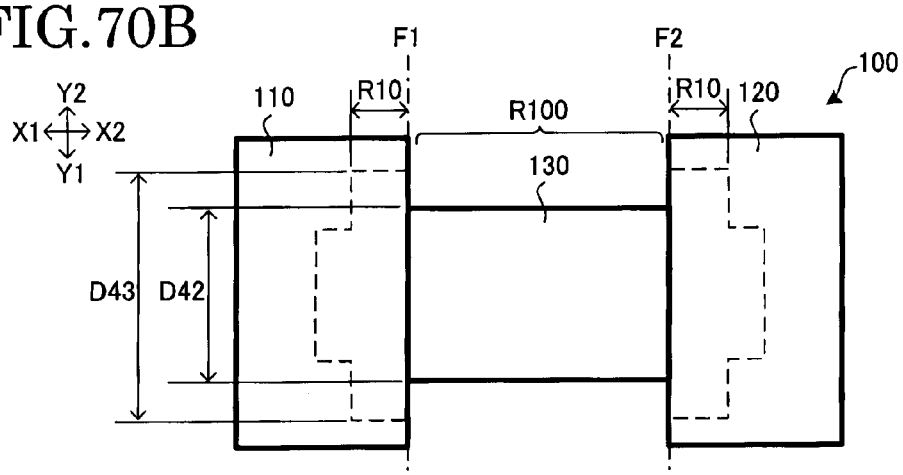
FIG. 70B is a view showing a second example where the width of a flexible wiring board is partially enlarged.

Alternatively, as shown in FIG. 70B, the width of flexible wiring board 130 may be enlarged in region (R10) (see also FIG. 4) where rigid section 110 or 120 and flexible wiring board 130 are laminated and connected. In such an example, width (D43) of region (R10) is set greater than width (D42) of flexible section (R100) (D43>D42). It is thought that such a structure also enhances connection reliability in the F-R connection sections the same as in the example shown in FIG. 70A.

Figure 70C:
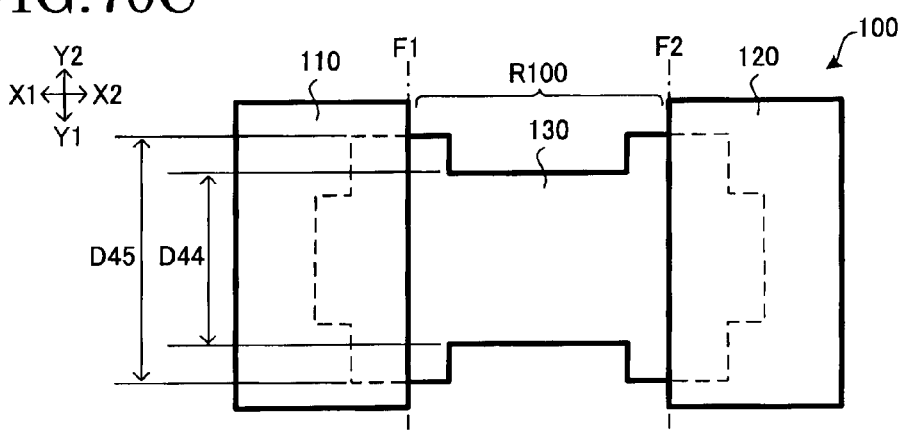
FIG. 70C is a view showing a third example where the width of a flexible wiring board is partially enlarged.

Alternatively, as shown in FIG. 70C, the width of flexible wiring board 130 may also be enlarged near the boundary (F-R boundary surface F1 or F2) between rigid section 110 or 120 and flexible section (R100). In such an example, the width of flexible wiring board 130 is enlarged from (D44) to (D45) near the boundary (D45>D44). It is thought that such a structure also enhances connection reliability at the F-R connection sections the same as in the example shown in FIG. 70A.

Flex-rigid wiring board 100 may contain an electronic component and be set as an electronic device.

Figure 71:
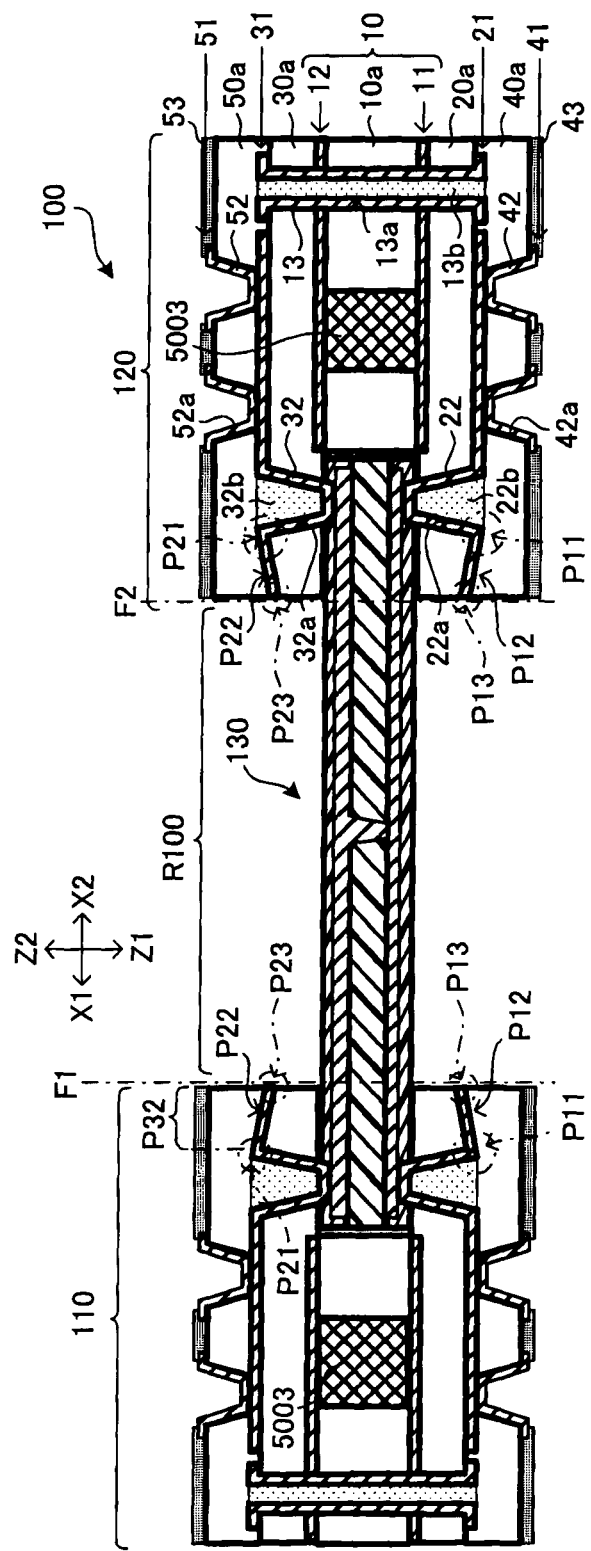
FIG. 71 is a view showing an example of a flex-rigid wiring board with built-in electronic components.

Flex-rigid wiring board 100 may contain a built-in electronic component. For example, as shown in FIG. 71, electronic components 5003 may be built into rigid sections (110, 120). In an example in FIG. 71, two electronic components 5003 are built into the board. However, the number of electronic components is not limited specifically. For example, rigid section 110 or 120 may contain two or more built-in electronic components. Alternatively, an electronic component is built into only either rigid section 110 or 120. Using flex-rigid wiring board 100 with built-in electronic components, the electronic device becomes highly functional.

Figure 72:
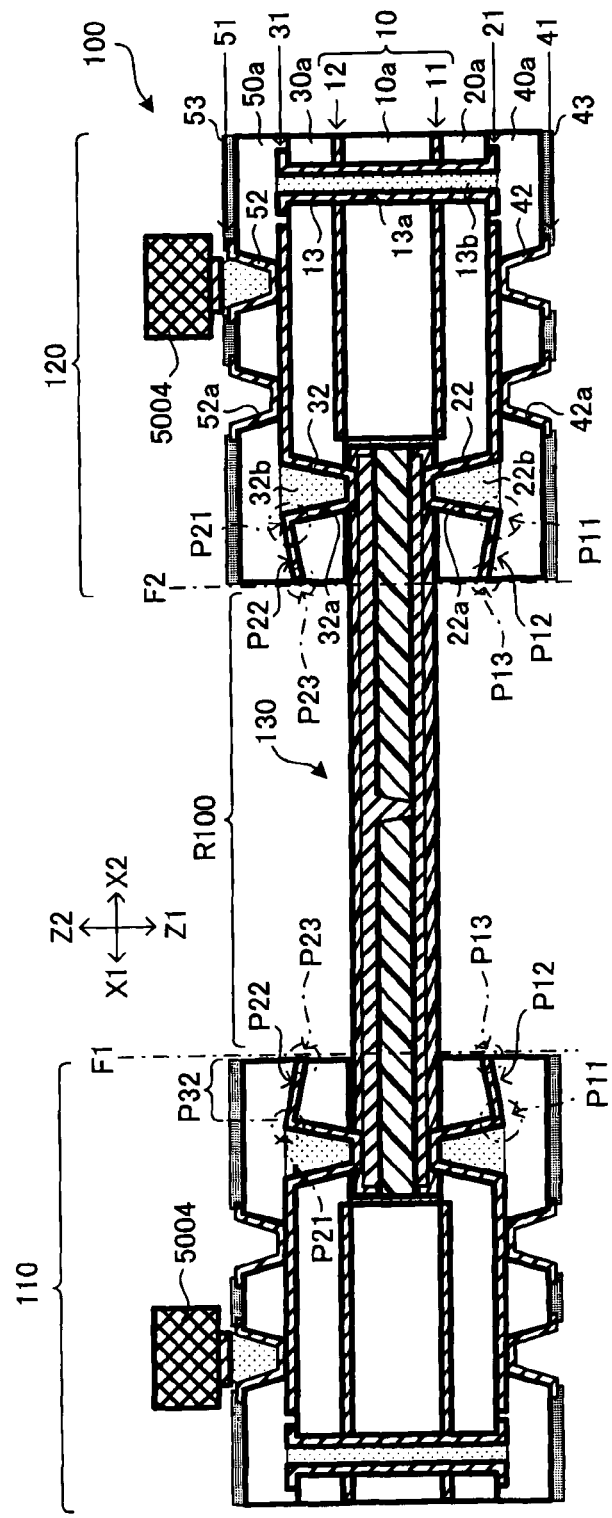
FIG. 72 is a view showing an example of a flex-rigid wiring board with electronic components mounted on its surface.

Alternatively, as shown in FIG. 72, for example, electronic components 5004 may be mounted on a surface of rigid sections (110, 120). In an example shown in FIG. 72, two electronic components 5004 are mounted. However, the number of electronic components is not limited specifically. For example, two or more electronic components may be mounted on rigid section 110 or 120. Alternatively, electronic components may be mounted only on either rigid section 110 or 120.

Figure 73:
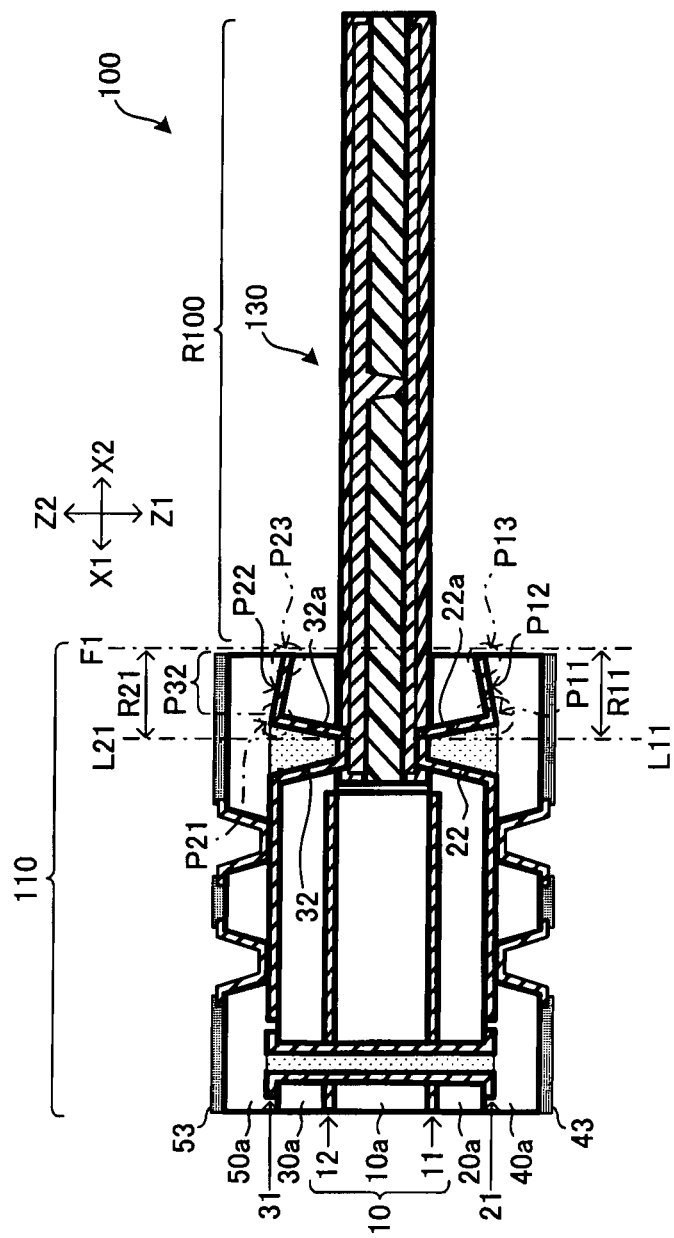
FIG. 73 is a view showing an example of a flying-tail structure.

The number of rigid sections is not limited specifically. For example, as shown in FIG. 73, the present invention may be applied to a structure where only one end portion (only either one) of flexible wiring board 130 is connected to rigid section 110, and the other end is not connected, a so-called flying-tail structure. In such a flying-tail structure, flexible wiring board 130 protrudes like a tail from rigid section 110. Also, three or more rigid sections may be connected by splitting flexible wiring board 130, and so on.

Regarding other factors, structures of rigid sections (110, 120), flexible wiring board 130 or the like, as well as the type, performance, size, quality, shape, number of layers, positioning and so forth of the elements of such structures, may be modified freely within a scope that does not deviate from the gist of the present invention.

The number of layers in rigid sections (110, 120) and flexible wiring board 130 is not limited specifically. For example, to achieve high functionality or the like, they may be formed to be further multilayered wiring boards. Alternatively, they may be formed as a wiring board with fewer layers. Yet alternatively, the number of layers on each surface (first surface, second surface) of the core section may be different. Furthermore, layers (wiring layers and insulation layers) may be formed (laminated) on only one surface of the core section.

The material for each wiring layer is not limited to the above, and may be modified according to usage requirements or the like. For example, metal other than copper may be used as the material for wiring layers. Also, the material for each insulation layer is not limited to a specific type. However, as for resins to form insulation layers, thermosetting resins or thermoplastic resins are preferred. As for thermosetting resins, for example, other than epoxy resin, the following may be used: imide resin (polyimide), BT resin, allyl polyphenylene ether resin (A-PPE resin) or aramid resin. Also, as for thermoplastic resins, for example, liquid-crystal polymer (LCP), PEEK resin or PTFE resin (fluororesin) may be used. Such materials are preferred to be selected according to requirements from the viewpoint of insulation, dielectric properties, tolerance to heat, mechanical features and so forth. In addition, the above resins may contain additives such as a curing agent, a stabilizer, filler or the like. Alternatively, each wiring layer and each insulation layer may be formed with multiple layers having different materials.

The conductor formed inside a hole in a built-up section may be a connection conductor or a conformal conductor. However, to secure the wiring space, a connection conductor is preferred.

The steps in the above embodiment are not limited to the order and contents shown in the flowchart in FIG. 6. The order and contents may be modified freely within a scope that does not deviate from the gist of the present invention. Also, unnecessary steps may be omitted according to usage requirements or the like.

For example, forming various conductive patterns is not limited to any specific method. Conductive patterns may be formed by any one of the following, or any combination of two or more such methods: panel plating method, pattern plating method, full-additive method, semi-additive (SAP) method, subtractive method and tenting method.

The above first through fifth embodiments and modified examples or the like may be combined freely. For example, the structure of insulation layers shown in FIGS. 34A-37, the structure of F-R connection sections shown in FIGS. 38-48B, and other structures shown in FIGS. 33 and 49-73 may be combined freely. Also, such structures may be applied to any of the first through fifth embodiments. Moreover, different structures may be employed for each F-R connection section.

A flex-rigid wiring board according to one aspect of the present invention has an insulative substrate (substrate: base material); a flexible wiring board positioned beside the insulative substrate; and an insulation layer positioned on a boundary portion between the insulative substrate and the flexible wiring board and exposing at least part of the flexible wiring board. In such a flex-rigid wiring board, the insulation layer has a portion which becomes thinner toward an end surface on the flexible wiring board side, and a conductor is formed on the portion which becomes thinner.

A method for manufacturing a flex-rigid wiring board according to another aspect of the present invention includes the following: positioning an insulative substrate, a flexible wiring board and an insulation layer in such a way that the insulation layer is positioned on the boundary portion between the insulative substrate and the flexible wiring board and at least part of the flexible wiring board is exposed by the insulation layer; positioning a spacer on the flexible wiring board; positioning a metal foil at least on the insulation layer and on the spacer; and forming in the insulation layer a portion whose thickness decreases toward an end surface on the flexible wiring board side by pressing the above positioned insulative substrate, the flexible wiring board, the insulation layer, the spacer and the metal foil.

Obviously, numerous modifications and variations of the present invention are possible in light of the above teachings. It is therefore to be understood that within the scope of the appended claims, the invention may be practiced otherwise than as specifically described herein.

What is claimed is:

1. A flex-rigid wiring board, comprising:
an insulative substrate;
a flexible wiring board positioned beside the insulative substrate;
an insulation layer positioned over the insulative substrate and the flexible wiring board and exposing at least a portion of the flexible wiring board; and
a wiring layer comprising a conductor and formed on the insulation layer,
wherein the insulation layer has a tapered portion which becomes thinner toward an end surface of the insulation layer in a direction of the portion of the flexible wiring board exposed by the insulation layer, and the wiring layer has a sloping portion formed on the tapered portion of the insulation layer.

2. The flex-rigid wiring board according to claim 1, wherein the insulative substrate includes at least one material forming the insulation layer.

3. The flex-rigid wiring board according to claim 1, wherein the insulation layer and the insulative substrate include materials which are a substantially same.

4. The flex-rigid wiring board according to claim 1, wherein the tapered portion of the insulation layer has a thickness which decreases as the tapered portion of the insulation layer approaches closer to the end surface of the insulation layer in the direction of the portion of the flexible wiring board exposed by the insulation layer.

5. The flex-rigid wiring board according to claim 1, further comprising a second insulation layer which is positioned on the insulation layer, wherein the second insulation layer has a tapered portion which become thinner toward the portion of the flexible wiring board exposed by the insulation layer.

6. The flex-rigid wiring board according to claim 5, wherein the tapered portion of the insulation layer and the tapered portion of the second insulation layer have thicknesses which decrease in steps.

7. The flex-rigid wiring board according to claim 5, wherein the tapered portion of the insulation layer and the tapered portion of the second insulation layer have thicknesses which decrease continuously.

8. The flex-rigid wiring board according to claim 1, wherein the flexible wiring board has a wiring layer comprising a conductor, the insulation layer has a hole and a connection conductor formed by plating in the hole, the wiring layer on the insulation layer is connected to the wiring layer in the flexible wiring board by the connection conductor formed in the insulation layer.

9. The flex-rigid wiring board according to claim 1, wherein the flexible wiring board has a wiring layer comprising a conductor, the insulation layer has a hole penetrating only through the insulation layer and a connection conductor formed in the hole, and the wiring layer on the insulation layer is connected to the wiring layer in the flexible wiring board by the connection conductor formed in the insulation layer.

10. The flex-rigid wiring board according to claim 1, wherein the flexible wiring board has a wiring layer comprising a conductor, the insulation layer has a hole penetrating only through the insulation layer and a connection conductor formed by plating in the hole, and the wiring layer on the insulation layer is connected to the wiring layer in the flexible wiring board by the connection conductor formed in the insulation layer.

11. The flex-rigid wiring board according to claim 1, further comprising a second flexible wiring board, wherein the flexible wiring board is positioned such that the flexible wiring board is detached from the second flexible wiring board in a thickness direction.

12. The flex-rigid wiring board according to claim 11, wherein the flexible wiring board has a wiring layer comprising a conductor, the insulation layer has a hole and a connection conductor formed in the hole, the wiring layer on the insulation layer is connected to the wiring layer in the flexible wiring board by the connection conductor formed in the insulation layer, and the connection conductor comprises a conductor filled in the hole.

13. The flex-rigid wiring board according to claim 11, further comprising a bonding sheet connecting the flexible wiring board and the second flexible wiring board.

14. The flex-rigid wiring board according to claim 11, further comprising a shield layer formed as an upper layer of a conductive pattern in at least one of the flexible wiring board and the second flexible wiring board.

15. The flex-rigid wiring board according to claim 11, wherein at least one of the flexible wiring board and the second flexible wiring board has a full plane conductive pattern.

16. The flex-rigid wiring board according to claim 11, wherein the flexible wiring board and the second flexible wiring board form a space which is capable of being decompressed.

17. The flex-rigid wiring board according to claim 11, further comprising a filler filling in a space formed between the flexible wiring board and the second flexible wiring board.

18. The flex-rigid wiring board according to claim 11, further comprising:

a second insulation layer positioned on an opposite aide of the insulation layer over the insulative substrate and the flexible wiring board and exposing at least a portion of the flexible wiring board; and a wiring layer comprising a conductor and formed on the second insulation layer, wherein the flexible wiring board has a wiring layer comprising a conductor, the insulation layer has a hole and a connection conductor formed in the hole in the insulation layer, the wiring layer on the insulation layer is connected to the wiring layer in the flexible wiring board by the connection conductor formed in the insulation layer, the second flexible wiring board has a wiring layer comprising a conductor, the second insulation layer has a hole and a connection conductor formed in the hole in the second insulation layer, and the wiring layer on the second insulation layer is connected to the wiring layer in the second flexible wiring board by the connection conductor formed in the second insulation layer.

19. The flex-rigid wiring board according to claim 18, further comprising a boding sheet connecting the flexible wiring board and the second flexible wiring board.

20. The flex-rigid wiring board according to claim 1, wherein the flexible wiring board comprises a flexible substrate, a first wiring layer comprising a conductor and formed on a first surface of the flexible substrate, and a second wiring layer comprising a conductor and formed on a second surface of the flexible substrate, wherein the flexible substrate has a through hole and a through-hole conductor formed in the through hole, and the first wiring layer is connected to the second wiring layer by the through-hole conductor formed in the flexible substrate.

21. The flex-rigid wiring board according to claim 20, wherein at least one of the conductors of the first and second wiring layers has a portion which is a triple-layer conductive layer comprising a metal foil, an electroless plating and an electrolytic plating.

22. The flex-rigid wiring board according to claim 21, wherein the conductor of the first wiring layer is a triple-layer conductive layer comprising a metal foil, an electroless plating and an electrolytic plating, and the conductor of the second wiring layer is a triple-layer conductive layer comprising a metal foil, an electroless plating and an electrolytic plating.

23. The flex-rigid wiring board according to claim 20, further comprising:

a coverlay provided to the flexible substrate; and an adhesive agent adhering the coverlay to the flexible substrate, wherein the adhesive agent on the coverlay is filled in the through hole in the flexible substrate.

24. The flex-rigid wiring board according to claim 20, wherein the through hole in the flexible substrate has a wall surface treated with a surface treatment.

25. The flex-rigid wiring board according to claim 20, further comprising:

a second insulation layer positioned on an opposite side of the insulation layer over the insulative substrate and the flexible wiring board and exposing at least a portion of the flexible wiring board; and a wiring layer comprising a conductor and formed on the second insulation layer, wherein the insulative substrate, the insulation layer and the second insulation layer have a through hole formed thorough the insulative substrate, the insulation layer and the second insulation layer, and a through-hole conductor formed in the through hole through the insulative substrate, the insulation layer and the second insulation layer, the wiring layer formed on the insulation layer is connected to the wiring layer formed on the second insulation layer by the through-hole conductor formed in the through hole through the insulative substrate, the insulation layer and the second insulation layer.

26. The flex-rigid wiring board according to claim 20, further comprising:
 a second insulation layer positioned on an opposite side of the insulation layer over the insulative substrate and the flexible wiring board and exposing at least a portion of the flexible wiring board; and
 a wiring layer comprising a conductor and formed on the second insulation layer,
 wherein the insulation layer has a hole and a conductor formed in the hole in the insulation layer, the wiring layer on the insulation layer is connected to the first wiring layer in the flexible wiring board by the conductor in the hole formed in the insulation layer, the second insulation layer has a hole and a conductor formed in the hole in the second insulation layer, and the wiring layer on the second insulation layer is connected to the second wiring layer in the flexible wiring board by the conductor in the hole formed in the second insulation layer.

27. The flex-rigid wiring board according to claim 20, wherein the insulation layer has a hole and a conductor filled in the hole formed in the insulation layer, and the wiring layer on the insulation layer is connected to the first wiring layer in the flexible wiring board by the conductor in the hole formed in the insulation layer.

28. The flex-rigid wiring board according to claim 1, wherein the insulative substrate and the insulation layer form a rigid section of the flex-rigid wiring board, and the rigid section has a protruding portion protruding from a boundary surface between the insulation layer and the portion of the flexible wiring board exposed by the insulation layer.

29. The flex-rigid wiring board according to claim 1, wherein the insulation layer and the flexible wiring board have a through hole penetrating through the insulation layer and the flexible wiring board, and a through-hole conductor formed in the through hole, the flexible wiring board has a wiring layer formed in the flexible wiring board, and the wiring layer on the insulation layer is connected to the wiring layer in the flexible wiring board by the through-hole conductor formed in the through hole.

30. The flex-rigid wiring board according to claim 1, wherein the flexible wiring board has a wiring layer formed in the flexible wiring board, the insulation layer has a hole and a conductor formed in the hole, the wiring layer on the insulation layer is connected to the wiring layer in the flexible wiring board by the conductor in the hole formed in the insulation layer, and the conductor in the hole formed in the insulation layer is made of a conductive paste.

31. The flex-rigid wiring board according to claim 1, wherein the insulative substrate and the insulation layer form a plurality of rigid sections of the flex-rigid wiring board, and the rigid sections of the flex-rigid wiring board have a different number of layers from each other.

32. The flex-rigid wiring board according to claim 1, wherein the flex-rigid wiring board has a built-in electronic component in the flex-rigid wiring board.

33. The flex-rigid wiring board according to claim 1, wherein the flex-rigid wiring board has an electronic component mounted on a surface of the flex-rigid wiring board.

34. The flex-rigid wiring board according to claim 1, wherein the insulative substrate and the insulation layer form a rigid section of the flex-rigid wiring board, and only one end of the flexible wiring board is connected to the rigid section of the flex-rigid wiring board.

35. The flex-rigid wiring board according to claim 1, wherein the flexible wiring board has a width which is enlarged toward a boundary between the insulation layer and the portion of the flexible wiring board exposed by the insulation layer.

36. The flex-rigid wiring board according to claim 1, wherein the flexible wiring board has a width which is enlarged in a region where the insulation layer and the flexible wiring board are laminated and connected.

37. The flex-rigid wiring board according to claim 1, wherein the flexible wiring board has a wiring layer having a conductive pattern which fans out.

38. A method for manufacturing a flex-rigid wiring board, comprising:
 forming a laminated body comprising an insulative substrate, a flexible wiring board and an insulation layer such that the insulative substrate and the flexible wiring board are positioned side by side, that the insulation layer is positioned over the insulative substrate and the flexible wiring board and that at least a portion of the flexible wiring board is exposed by the insulation layer;
 positioning a spacer on the flexible wiring board side by side with the insulation layer such that the spacer and the insulation layer have a clearance between the spacer and the insulation layer;
 positioning a metal foil at least on the insulation layer and on the spacer; and
 pressing the insulative substrate, the flexible wiring board, the insulation layer, the spacer and the metal foil such that a portion of the insulation layer is formed into a tapered portion which becomes thinner toward an end surface of the insulation layer in a direction of the portion of the flexible wiring board exposed by the insulation layer.

39. A method for manufacturing a flex-rigid wiring board, comprising:
 providing an insulation layer having a tapered portion which becomes thinner toward an end surface of the insulation layer;
 forming a laminated body comprising an insulative substrate, a flexible wiring board and the insulation layer such that the insulative substrate and the flexible wiring board are positioned side by side, that the insulation layer is positioned over the insulative substrate and the flexible wiring board and that at least a portion of the flexible wiring board is exposed by the insulation layer;
 positioning a spacer on the flexible wiring board side by side with the tapered portion of the insulation layer;
 positioning a metal foil at least on the insulation layer and on the spacer; and
 pressing the insulative substrate, the flexible wiring board, the insulation layer, the spacer and the metal foil.

\* \* \* \* \*